(12) United States Patent
Hanzawa

(10) Patent No.: US 12,219,284 B2
(45) Date of Patent: Feb. 4, 2025

(54) SOLID-STATE IMAGING DEVICE

(71) Applicant: SONY SEMICONDUCTOR SOLUTIONS CORPORATION, Kanagawa (JP)

(72) Inventor: Katsuhiko Hanzawa, Kanagawa (JP)

(73) Assignee: SONY SEMICONDUCTOR SOLTUIONS CORPORATION, Kanagawa (JP)

( * ) Notice: Subject to any disclaimer, the term of this patent is extended or adjusted under 35 U.S.C. 154(b) by 108 days.

(21) Appl. No.: 18/001,465

(22) PCT Filed: Jun. 4, 2021

(86) PCT No.: PCT/JP2021/021308
§ 371 (c)(1),
(2) Date: Dec. 9, 2022

(87) PCT Pub. No.: WO2021/256291
PCT Pub. Date: Dec. 23, 2021

(65) Prior Publication Data
US 2023/0232135 A1 Jul. 20, 2023

(30) Foreign Application Priority Data
Jun. 19, 2020 (JP) ................................. 2020-105812

(51) Int. Cl.
*H04N 25/78* (2023.01)
*H04N 25/75* (2023.01)
(Continued)

(52) U.S. Cl.
CPC ............. *H04N 25/78* (2023.01); *H04N 25/75* (2023.01); *H04N 25/76* (2023.01); *H04N 25/77* (2023.01)

(58) Field of Classification Search
CPC ........ H04N 25/78; H04N 25/47; H04N 25/75; H04N 25/76; H04N 25/77; H01L 27/146
See application file for complete search history.

(56) References Cited

U.S. PATENT DOCUMENTS

| 6,724,426 B1* | 4/2004 | Berezin ............. H01L 27/14609 348/E3.018 |
| 8,520,104 B2* | 8/2013 | Fossum ............. H01L 27/14609 257/222 |

(Continued)

FOREIGN PATENT DOCUMENTS

| JP | 2007-502061 A | 2/2007 |
| JP | 2008-089324 A | 4/2008 |

(Continued)

OTHER PUBLICATIONS

International Search Report and Written Opinion of PCT Application No. PCT/JP2021/021308, issued on Aug. 24, 2021, 11 pages of ISRWO.

*Primary Examiner* — Abdelaaziz Tissire
(74) *Attorney, Agent, or Firm* — CHIP LAW GROUP

(57) ABSTRACT

A solid-state imaging device includes a plurality of pixel regions. Each of the plurality of pixel regions includes a first photoelectric conversion unit and a second photoelectric conversion unit. The second photoelectric conversion unit overlaps the first photoelectric conversion unit when viewed in a light incident direction. At least one of the first photoelectric conversion unit and the second photoelectric conversion unit is an embedded unit. The first photoelectric conversion unit and the second photoelectric conversion unit are electrically connected to mutually different types of readout circuits.

17 Claims, 48 Drawing Sheets

(51) Int. Cl.
    *H04N 25/76*      (2023.01)
    *H04N 25/77*      (2023.01)

(56) References Cited

U.S. PATENT DOCUMENTS

| | | | | |
|---|---|---|---|---|
| 2005/0194653 A1* | 9/2005 | Hynecek | ............ | H01L 27/14647 |
| | | | | 257/443 |
| 2009/0284731 A1* | 11/2009 | Jin | ............ | G01C 3/08 |
| | | | | 356/4.01 |
| 2010/0102366 A1* | 4/2010 | Lee | ............ | H04N 25/705 |
| | | | | 257/E31.073 |
| 2011/0134298 A1* | 6/2011 | Aoyama | ............ | H04N 25/77 |
| | | | | 257/431 |
| 2012/0002089 A1* | 1/2012 | Wang | ............ | H01L 27/14641 |
| | | | | 348/297 |
| 2014/0306276 A1* | 10/2014 | Yamaguchi | ............ | H10K 39/32 |
| | | | | 257/292 |
| 2015/0054997 A1* | 2/2015 | Hynecek | ............ | H04N 25/134 |
| | | | | 257/292 |
| 2015/0304581 A1* | 10/2015 | Lu | ............ | H04N 25/74 |
| | | | | 250/208.1 |
| 2016/0049448 A1* | 2/2016 | Lee | ............ | H10K 30/20 |
| | | | | 257/40 |
| 2016/0344958 A1* | 11/2016 | Kondo | ............ | H04N 25/75 |
| 2020/0203416 A1* | 6/2020 | Jin | ............ | H01L 27/14614 |
| 2020/0304736 A1* | 9/2020 | Shinohara | ............ | H01L 31/107 |
| 2020/0382762 A1* | 12/2020 | Meynants | ............ | H04N 25/78 |
| 2021/0248342 A1* | 8/2021 | Chen | ............ | H04N 25/75 |
| 2023/0070145 A1* | 3/2023 | Chen | ............ | G06V 40/1318 |

FOREIGN PATENT DOCUMENTS

| | | |
|---|---|---|
| JP | 2008-517541 A | 5/2008 |
| JP | 2015-015332 A | 1/2015 |
| JP | 2016-058559 A | 4/2016 |
| JP | 2017-084926 A | 5/2017 |
| JP | 2017-535999 A | 11/2017 |
| WO | 2016/072281 A1 | 5/2016 |

\* cited by examiner

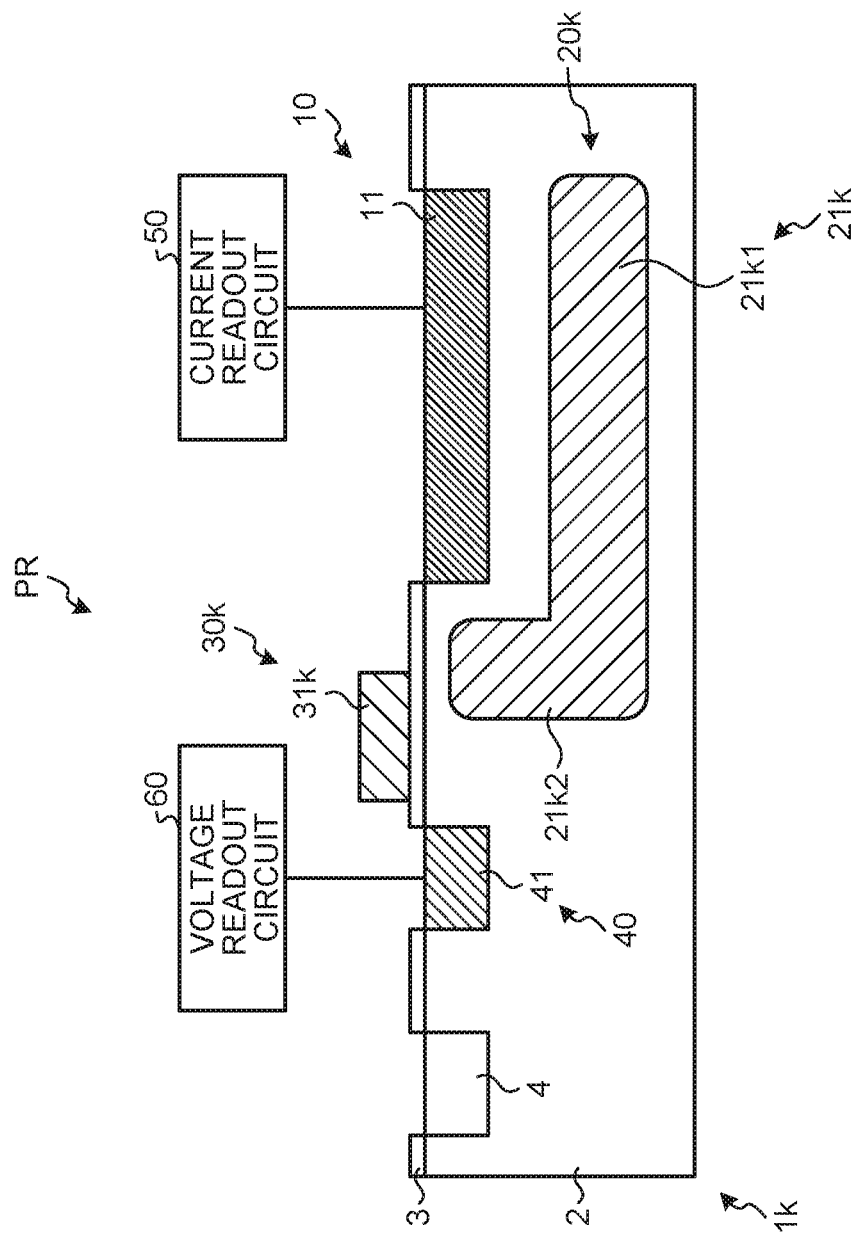

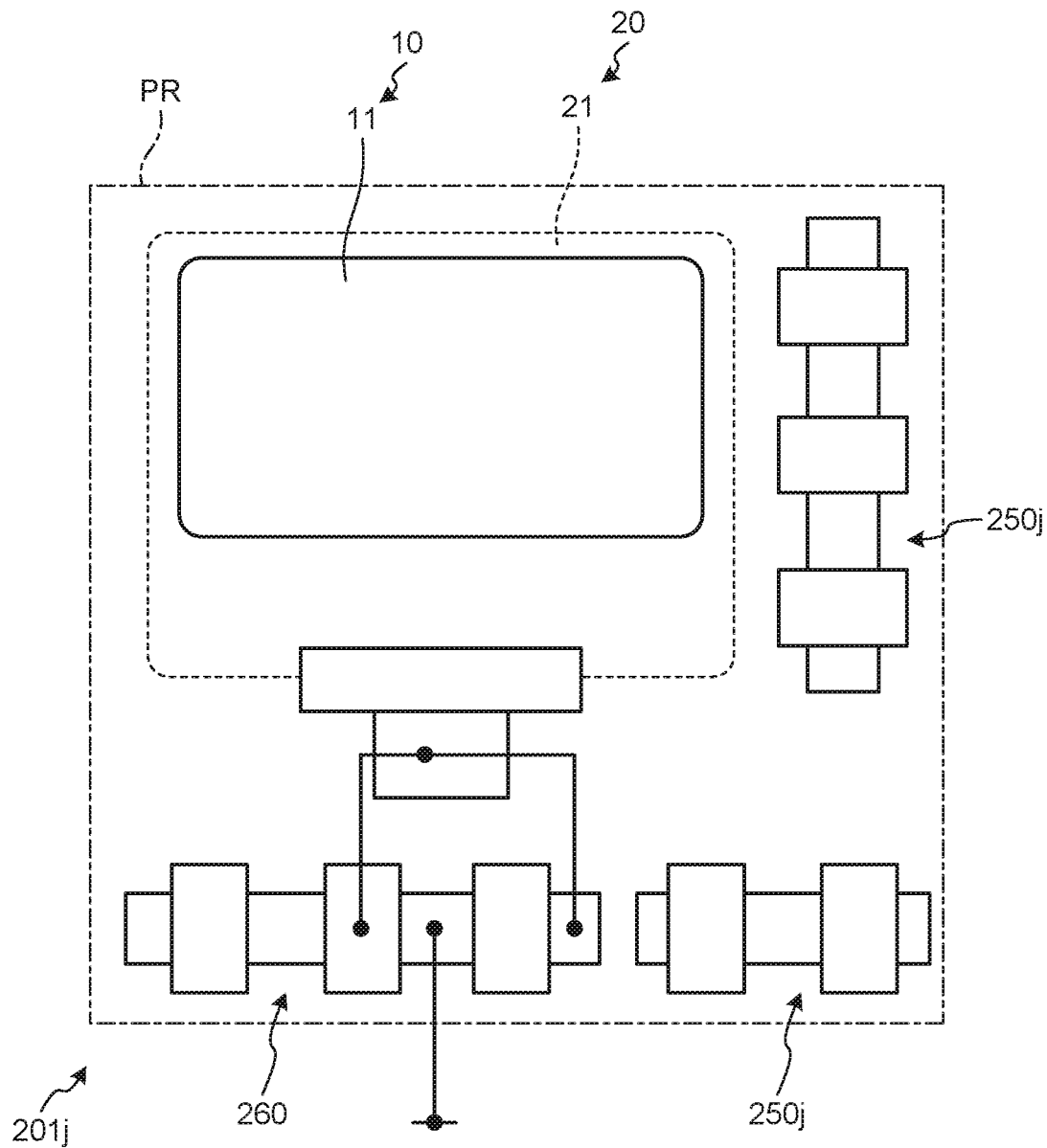

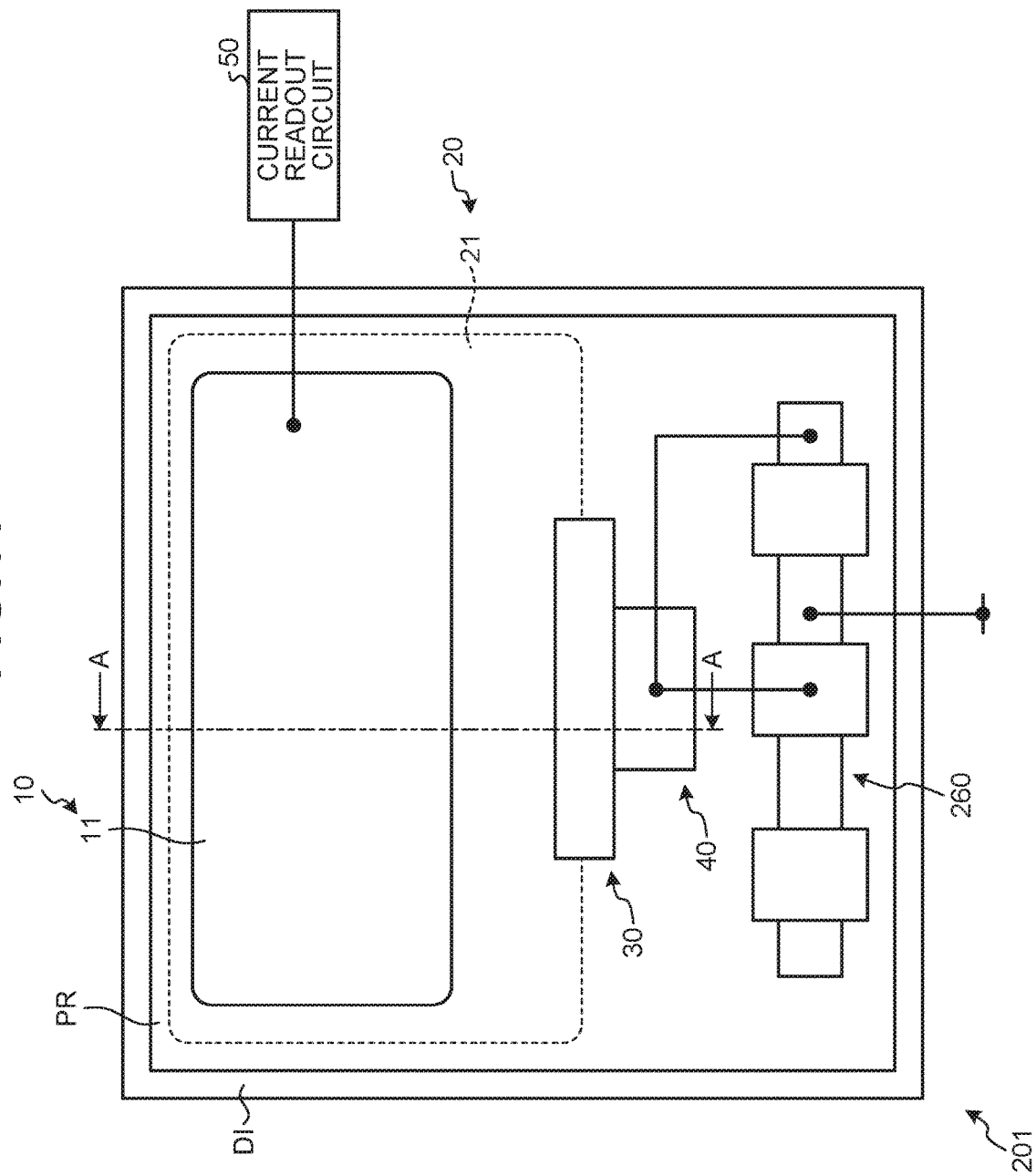

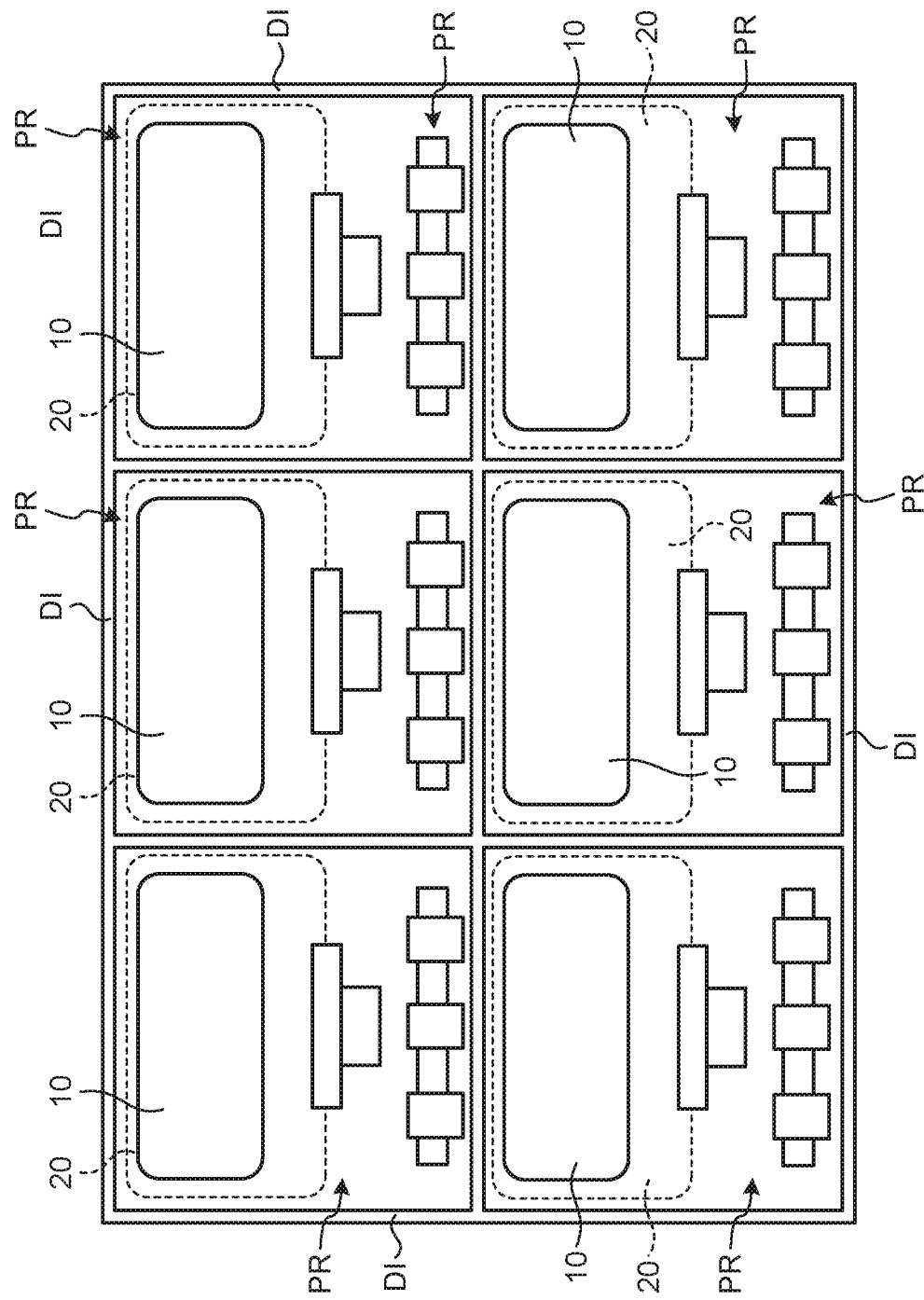

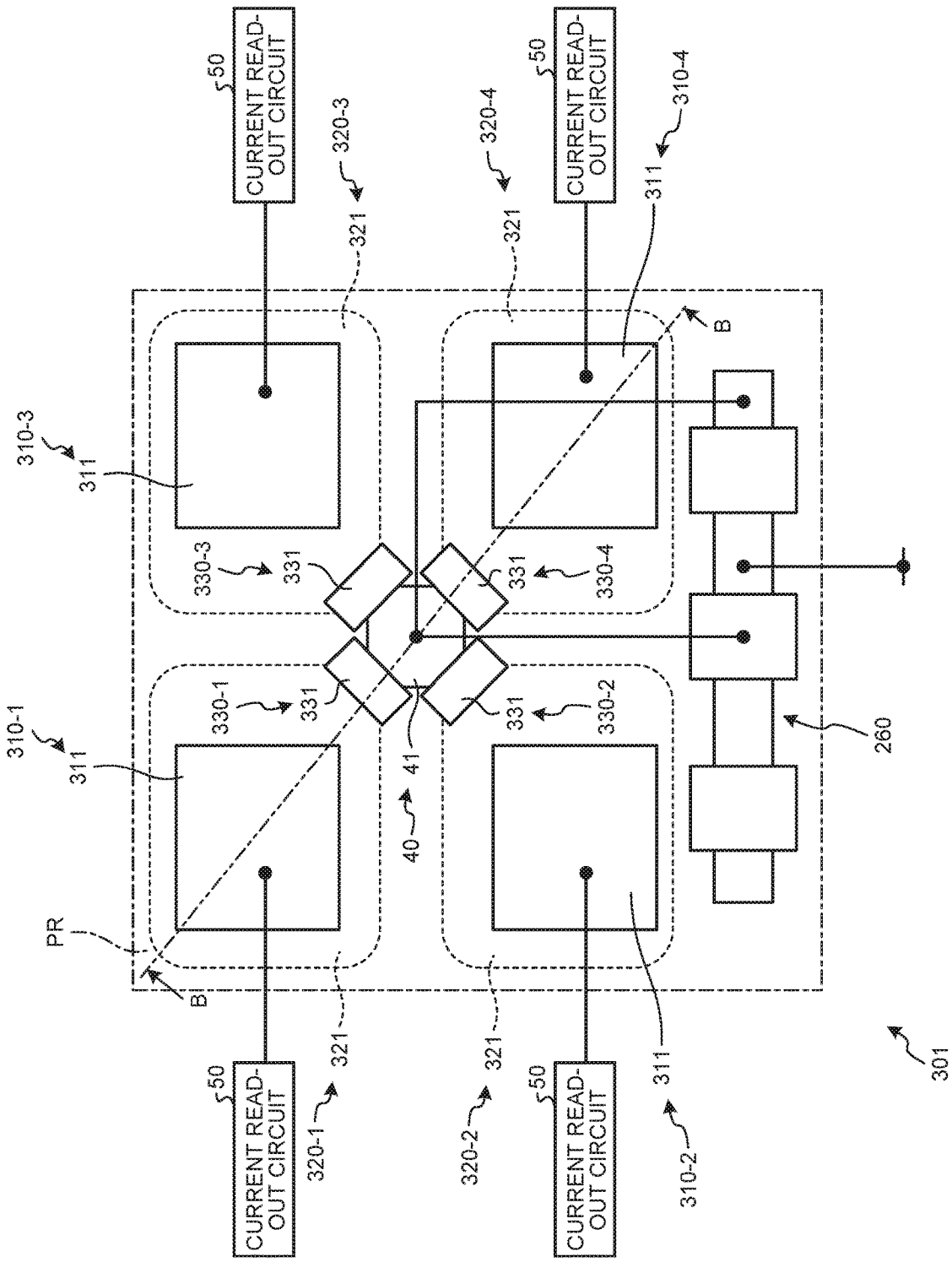

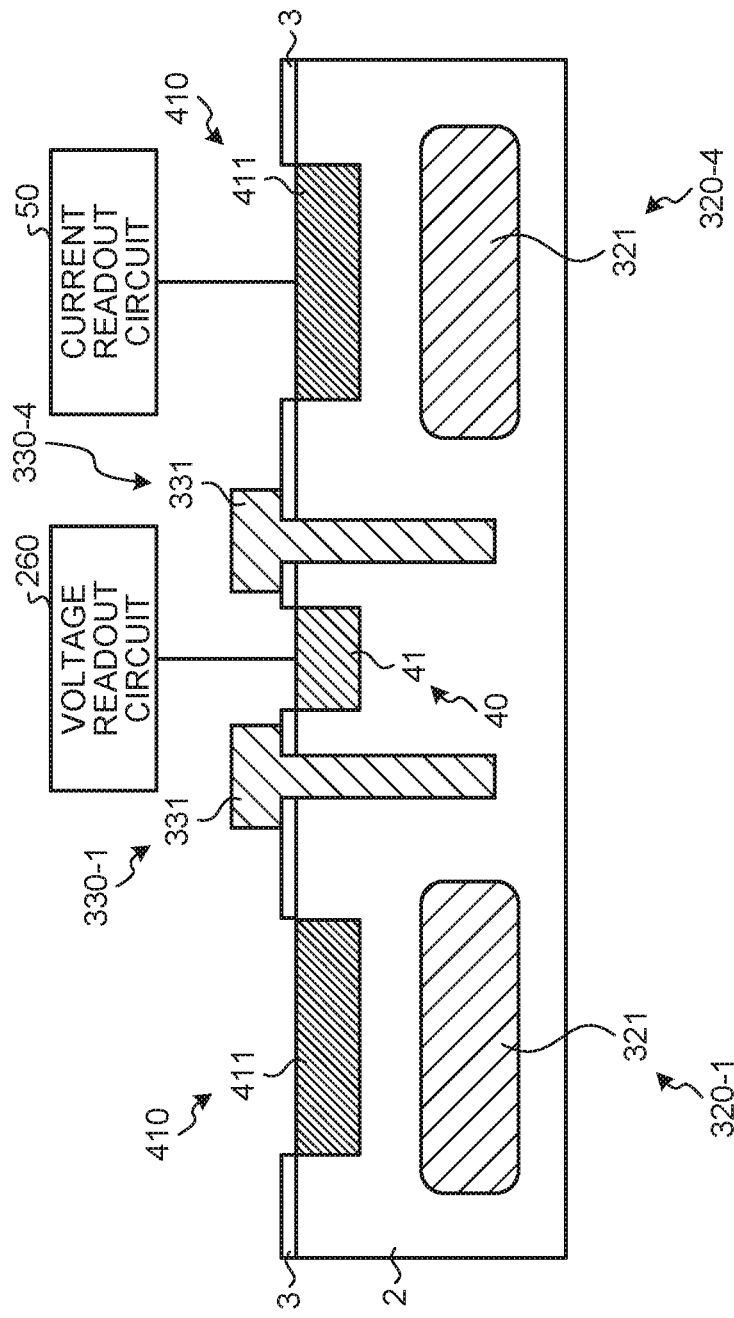

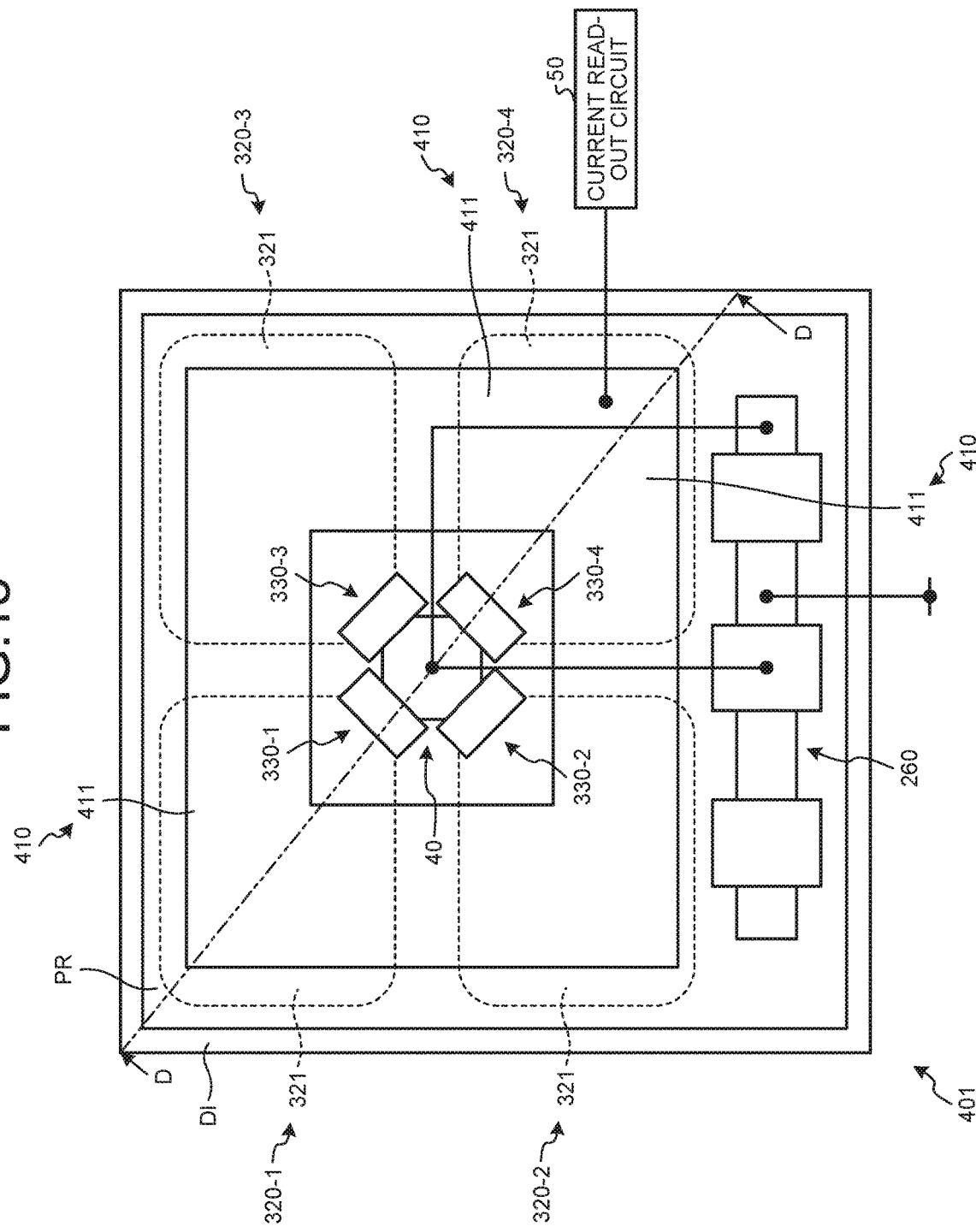

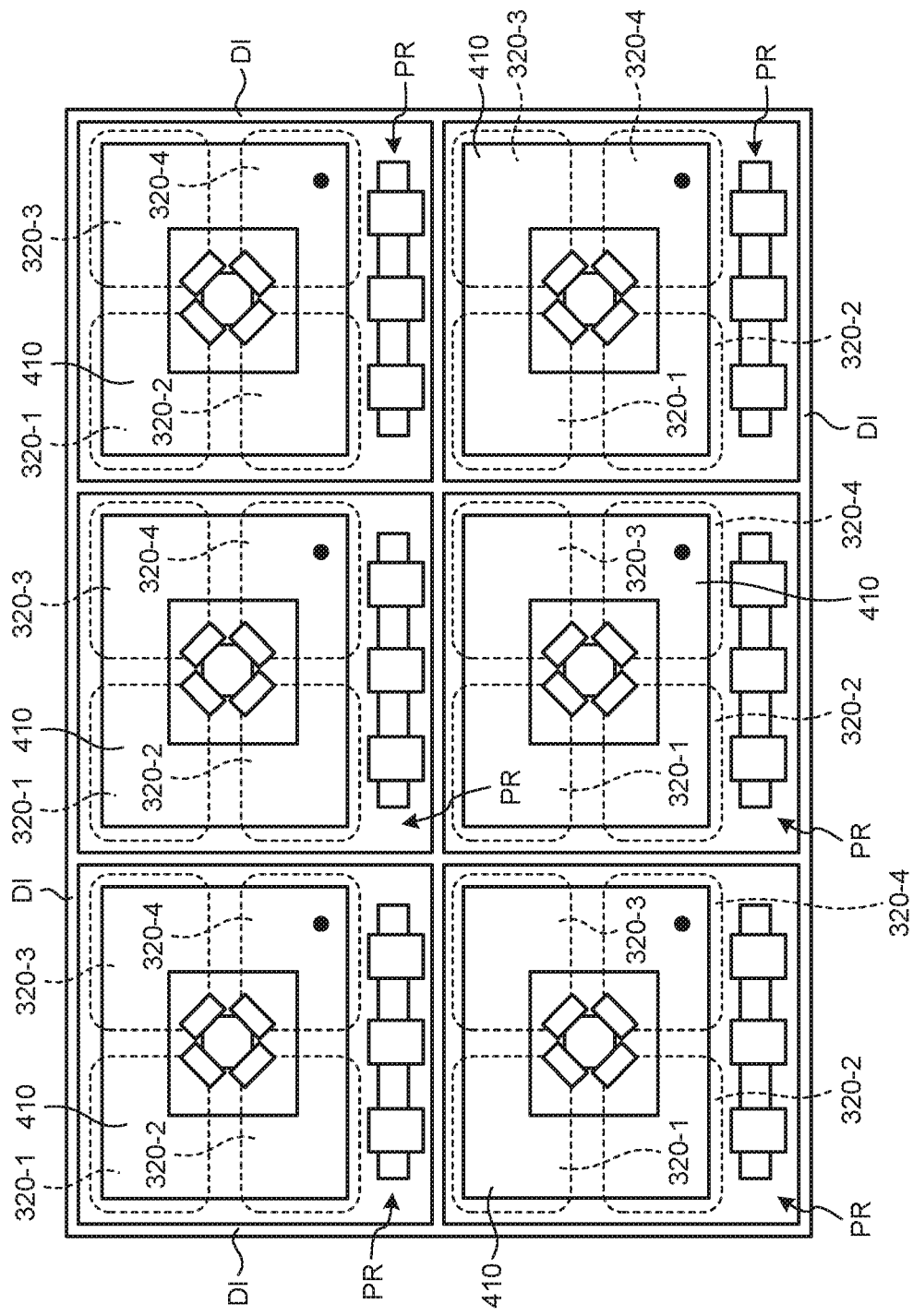

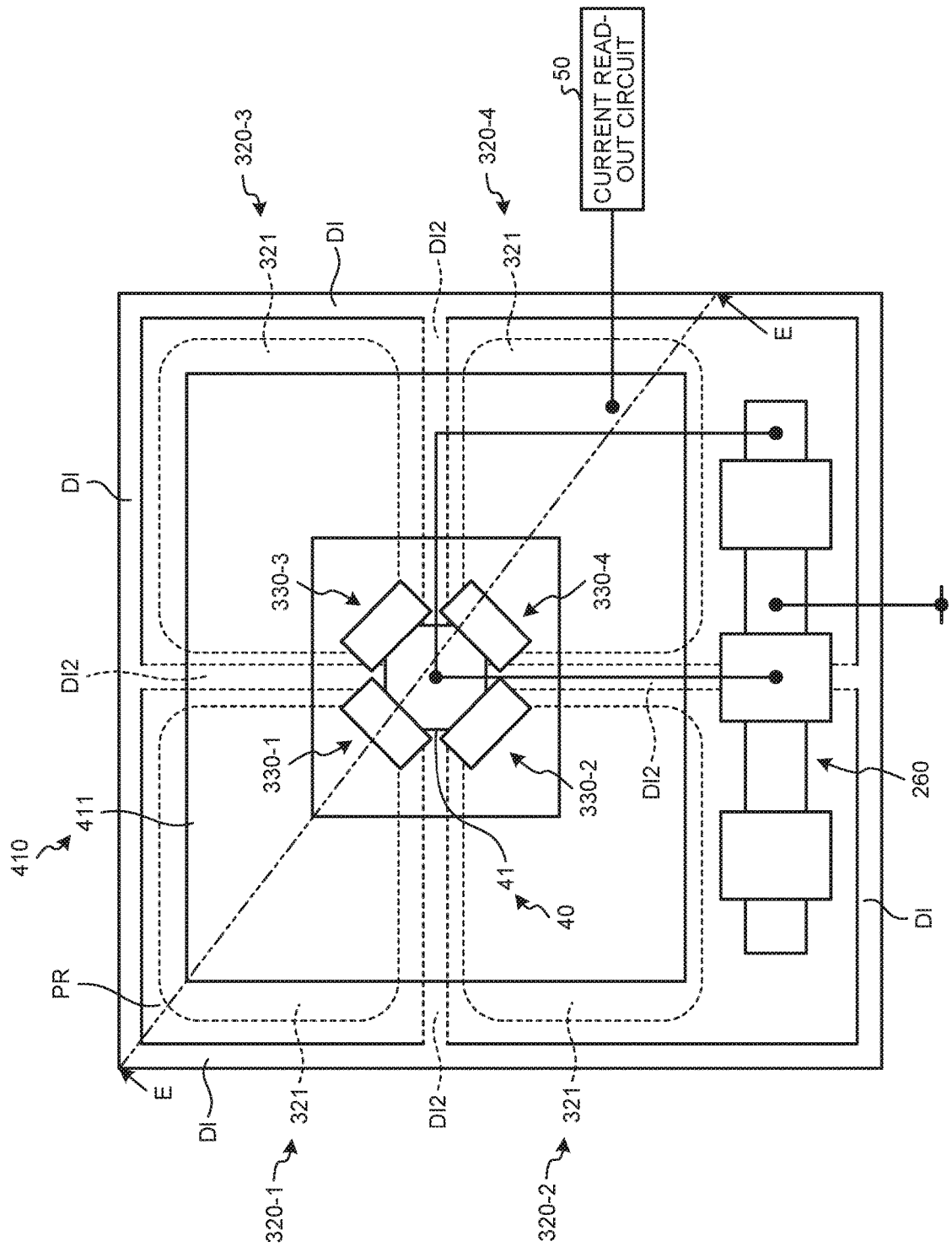

SOLID-STATE IMAGING DEVICE

CROSS REFERENCE TO RELATED APPLICATIONS

This application is a U.S. National Phase of International Patent Application No. PCT/JP2021/021308 filed on Jun. 4, 2021, which claims priority benefit of Japanese Patent Application No. JP 2020-105812 filed in the Japan Patent Office on Jun. 19, 2020. Each of the above-referenced applications is hereby incorporated herein by reference in its entirety.

FIELD

The present disclosure relates to a solid-state imaging device.

BACKGROUND

In a solid-state imaging device having a plurality of pixel regions, a current from a photoelectric conversion unit of each pixel region may be read out in real time, and a change in the current may be detected as an event. This technique is referred to as dynamic vision sensing (DVS) (refer to Patent Literature 1, for example).

CITATION LIST

Patent Literature

Patent Literature 1: JP 2017-535999 A
Patent Literature 2: JP 2015-15332 A

SUMMARY

Technical Problem

A solid-state imaging device is sometimes required to implement mixed installation of a photoelectric conversion unit for DVS and a photoelectric conversion unit for other uses (such as imaging, for example) in each pixel region. When a plurality of photoelectric conversion units is disposed side by side in a planar direction in each pixel region in order to satisfy this requirement, the aperture ratio of each photoelectric conversion unit is likely to decrease, leading to a difficulty in obtaining the sensitivity and the SN ratio of the solid-state imaging device.

In view of this, the present disclosure proposes a solid-state imaging device capable of obtaining the aperture ratio of each of a plurality of photoelectric conversion units for different uses.

Solution to Problem

According to the present disclosure, a solid-state imaging device includes a plurality of pixel regions. Each of the plurality of pixel regions includes a first photoelectric conversion unit and a second photoelectric conversion unit. The second photoelectric conversion unit overlaps the first photoelectric conversion unit when viewed in a light incident direction. At least one of the first photoelectric conversion unit or the second photoelectric conversion unit is an embedded unit. The first photoelectric conversion unit and the second photoelectric conversion unit are electrically connected to mutually different types of readout circuits.

Moreover, according to the present disclosure, a solid-state imaging device includes a plurality of pixel regions. Each of the plurality of pixel regions includes a first photoelectric conversion unit and a plurality of second photoelectric conversion units. The plurality of second photoelectric conversion units each overlap the first photoelectric conversion units when viewed in a light incident direction. The plurality of second photoelectric conversion units are embedded units included in an identical semiconductor layer. The first photoelectric conversion unit and the second photoelectric conversion unit are electrically connected to mutually different types of readout circuits.

BRIEF DESCRIPTION OF DRAWINGS

FIG. 6 is a cross-sectional view illustrating a configuration of a solid-state imaging device according to a fourth modification of the first embodiment of the present disclosure.

FIG. 10 is a plan view illustrating a configuration of a solid-state imaging device according to a second modification of the second embodiment of the present disclosure.

FIG. 11 is a plan view illustrating a configuration of a solid-state imaging device according to a third modification of the second embodiment of the present disclosure.

FIG. 13 is a plan view illustrating a configuration of a solid-state imaging device according to the third modification of the second embodiment of the present disclosure.

FIG. 14 is a plan view illustrating a configuration of a solid-state imaging device according to a third embodiment of the present disclosure.

FIG. 17 is a cross-sectional view illustrating a configuration of the solid-state imaging device according to the fourth embodiment of the present disclosure.

FIG. 18 is a plan view illustrating a configuration of a solid-state imaging device according to a first modification of the fourth embodiment of the present disclosure.

FIG. 20 is a plan view illustrating a configuration of the solid-state imaging device according to the first modification of the fourth embodiment of the present disclosure.

FIG. 22 is a plan view illustrating a configuration of a solid-state imaging device according to a third modification of the fourth embodiment of the present disclosure.

DESCRIPTION OF EMBODIMENTS

Figure 1:
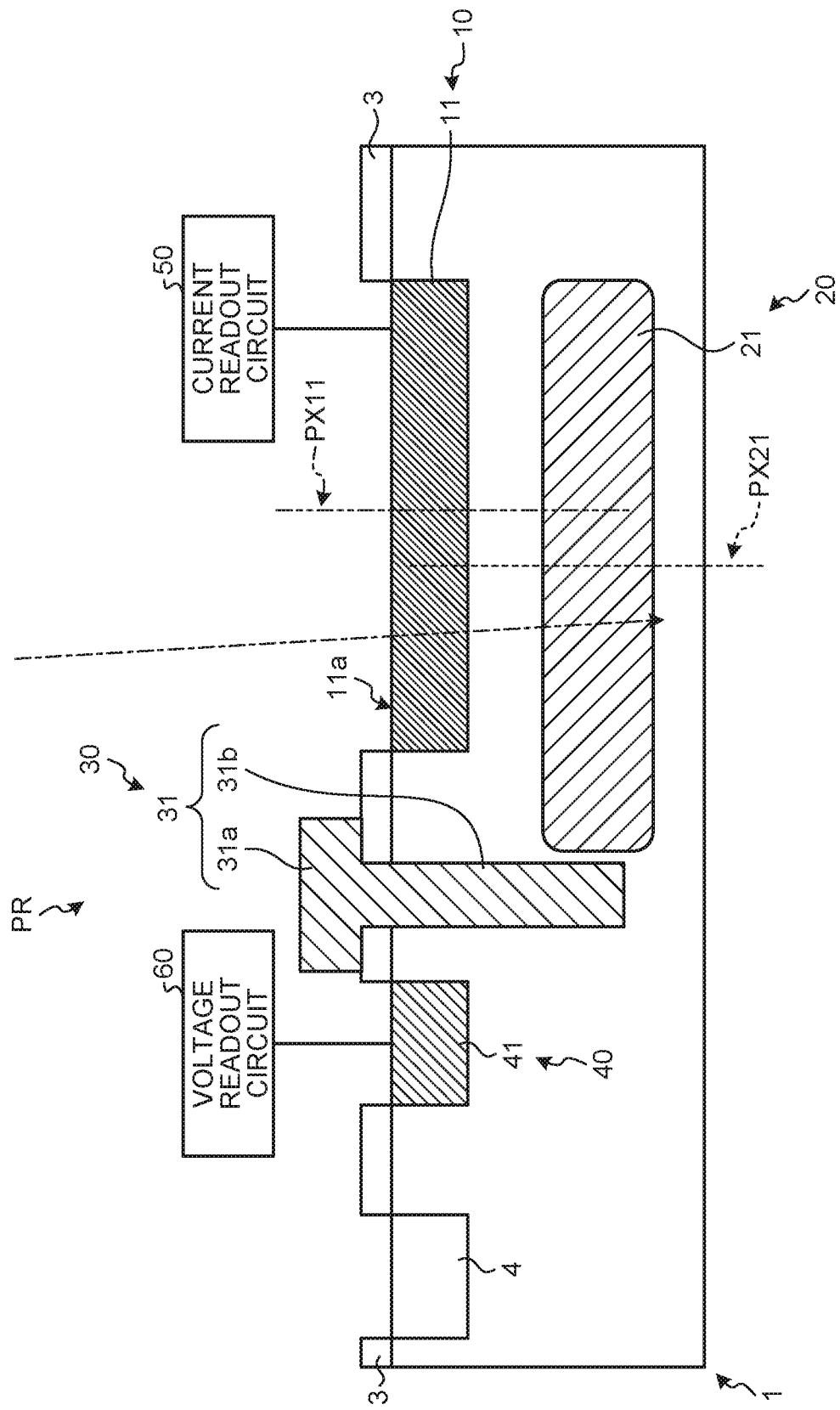
FIG. 1 is a cross-sectional view illustrating a configuration of a solid-state imaging device according to a first embodiment of the present disclosure.

Embodiments of the present disclosure will be described below in detail with reference to the drawings. Note that, in each of the following embodiments, the same parts are denoted by the same reference symbols, and a repetitive description thereof will be omitted.

The present disclosure will be described in the following order.
1. First Embodiment
1.1 First modification of first embodiment
1.2 Second modification of first embodiment
1.3 Third modification of first embodiment
1.4 Fourth modification of first embodiment
1.5 Fifth modification of first embodiment
2. Second Embodiment 2.1 First modification of second embodiment
2.2 Second modification of second embodiment
2.3 Third modification of second embodiment
3. Third Embodiment
4. Fourth Embodiment
4.1 First modification of fourth embodiment
4.2 Second modification of fourth embodiment
4.3 Third modification of fourth embodiment
4.4 Fourth modification of fourth embodiment
5. Fifth Embodiment
5.1 First modification of fifth embodiment
5.2 Second modification of fifth embodiment
5.3 Third modification of fifth embodiment
5.4 Fourth modification of fifth embodiment
6. Sixth Embodiment
6.1 First modification of sixth embodiment
7. Seventh Embodiment
7.1 First modification of seventh embodiment
8. Eighth Embodiment
8.1 First modification of eighth embodiment
9. Ninth Embodiment
10. Tenth Embodiment
11. Eleventh Embodiment
11.1 First modification of eleventh embodiment
11.2 Second modification of eleventh embodiment
11.3 Third modification of eleventh embodiment
11.4 Fourth modification of eleventh embodiment
11.5 Fifth modification of eleventh embodiment
12. Twelfth Embodiment
12.1 First modification of twelfth embodiment 1. First Embodiment A solid-state imaging device according to a first embodiment includes a plurality of pixel regions, and in some cases, accumulates a charge generated corresponding to light in a photoelectric conversion unit of each pixel region during a predetermined accumulation period, converts the accumulated charge into a voltage, and reads out the voltage. This technique is referred to as imaging. In addition, the solid-state imaging device uses a technique of performing realtime readout of a current from the photoelectric conversion unit of each pixel region and detecting a change in the current as an event. This technique is referred to as dynamic vision sensing (DVS).

The solid-state imaging device is sometimes required to implement mixed installation of a plurality of photoelectric conversion units having different uses in each pixel region. For example, it is sometimes required to implement mixed installation of a photoelectric conversion unit for DVS and a photoelectric conversion unit for other uses (such as imaging, for example) in each pixel region. When the photoelectric conversion unit for DVS and the photoelectric conversion unit for other uses are disposed side by side in a planar direction in each pixel region in order to satisfy this requirement, the aperture ratio of each photoelectric conversion unit is likely to decrease. This might decrease the light receiving area of each photoelectric conversion unit and the corresponding light receiving amount, leading to a difficulty in obtaining the sensitivity and the SN ratio of the solid-state imaging device.

On the other hand, in a case where the photoelectric conversion unit for DVS and the photoelectric conversion unit for other uses are shared by one common photoelectric conversion unit in each pixel region, it is difficult to independently control the photoelectric conversion unit in the operation for DVS and the operation for other uses.

In view of these situations, the first embodiment uses a configuration in which a plurality of photoelectric conversion units is disposed to overlap each other in a light incident direction and connected to different types of readout circuits in each pixel region of the solid-state imaging device, thereby obtaining the aperture ratio of individual photoelectric conversion units having different uses.

Specifically, in each pixel region of the solid-state imaging device, the plurality of photoelectric conversion units is disposed within a substrate so as to overlap each other when viewed in a light incident direction. The plurality of photoelectric conversion units includes, for example, a photoelectric conversion unit for DVS and a photoelectric conversion unit for other uses. The photoelectric conversion unit for other purposes is, for example, a photoelectric conversion unit for imaging. The photoelectric conversion unit for DVS is electrically connected to a current readout circuit, and the photoelectric conversion unit for imaging is electrically connected to a voltage readout circuit. The current readout circuit reads out a current corresponding to the charge generated by the photoelectric conversion unit, detects a change in the current as an event, for example, and performs DVS processing. The voltage readout circuit reads out the voltage converted from the charge of the photoelectric conversion unit, for example, amplifies the voltage to generate a pixel signal corresponding to the gradation of the image, and performs imaging processing. That is, the plurality of photoelectric conversion units having different uses is disposed within the substrate so as to overlap each other in the light incident direction and connected to different types of readout circuits, making it possible to easily obtain the aperture ratio of each photoelectric conversion unit while performing independent control of the plurality of photoelectric conversion units having different uses.

More specifically, a solid-state imaging device 1 includes a plurality of pixel regions PR in an imaging region where an image of a subject can be formed. The plurality of pixel regions PR can be arranged in a two-dimensional array, for example. Each pixel region PR is a region obtained by dividing the inside of the imaging region for each unit of configuration. Each pixel region PR can be configured as illustrated in FIG. 1, for example. FIG. 1 is a cross-sectional view illustrating a configuration of one pixel region PR in the solid-state imaging device 1. FIG. 1 omits illustration of an interlayer insulating film for simplification of illustration.

The pixel region PR of the solid-state imaging device 1 includes a photoelectric conversion unit 10, a photoelectric conversion unit 20, a transfer unit 30, and a charge-to-voltage converter 40.

The photoelectric conversion unit 10 has a semiconductor region 11. The semiconductor region 11 is disposed in the vicinity of a front surface of a semiconductor substrate 2, and a front surface 11a of the semiconductor region 11 constitutes a part of the front surface of the semiconductor substrate 2. The front surface of the semiconductor substrate 2 is generally covered with the gate insulating film 3, with an exception of the front surface 11a of the semiconductor region 11, which is not covered with the gate insulating film 3 and is exposed to an interlayer insulating film (not illustrated). The semiconductor substrate 2 contains first conductivity type (for example, P-type) impurities at a first concentration. An example of the P-type impurities is boron. The semiconductor region 11 contains second conductivity type (for example, N-type) impurities at a second concentration higher than the first concentration. An example of the N-type impurities is phosphorus or arsenic. The second conductivity type is the opposite conductivity type of the first conductivity type.

As indicated by a one-dot chain arrow in FIG. 1, the photoelectric conversion unit 10 receives light, performs photoelectric conversion on the received light in an interface region between the semiconductor region 11 and the semiconductor substrate 2, generates a charge corresponding to the received light, and guides the generated light to the semiconductor region 11. The photoelectric conversion unit 10 functions as a photodiode, for example.

The photoelectric conversion unit 10 is a photoelectric conversion unit for DVS, and is electrically connected to the current readout circuit 50. The charge guided to the semiconductor region 11 is read out to the current readout circuit 50 as a current.

Figure 2:
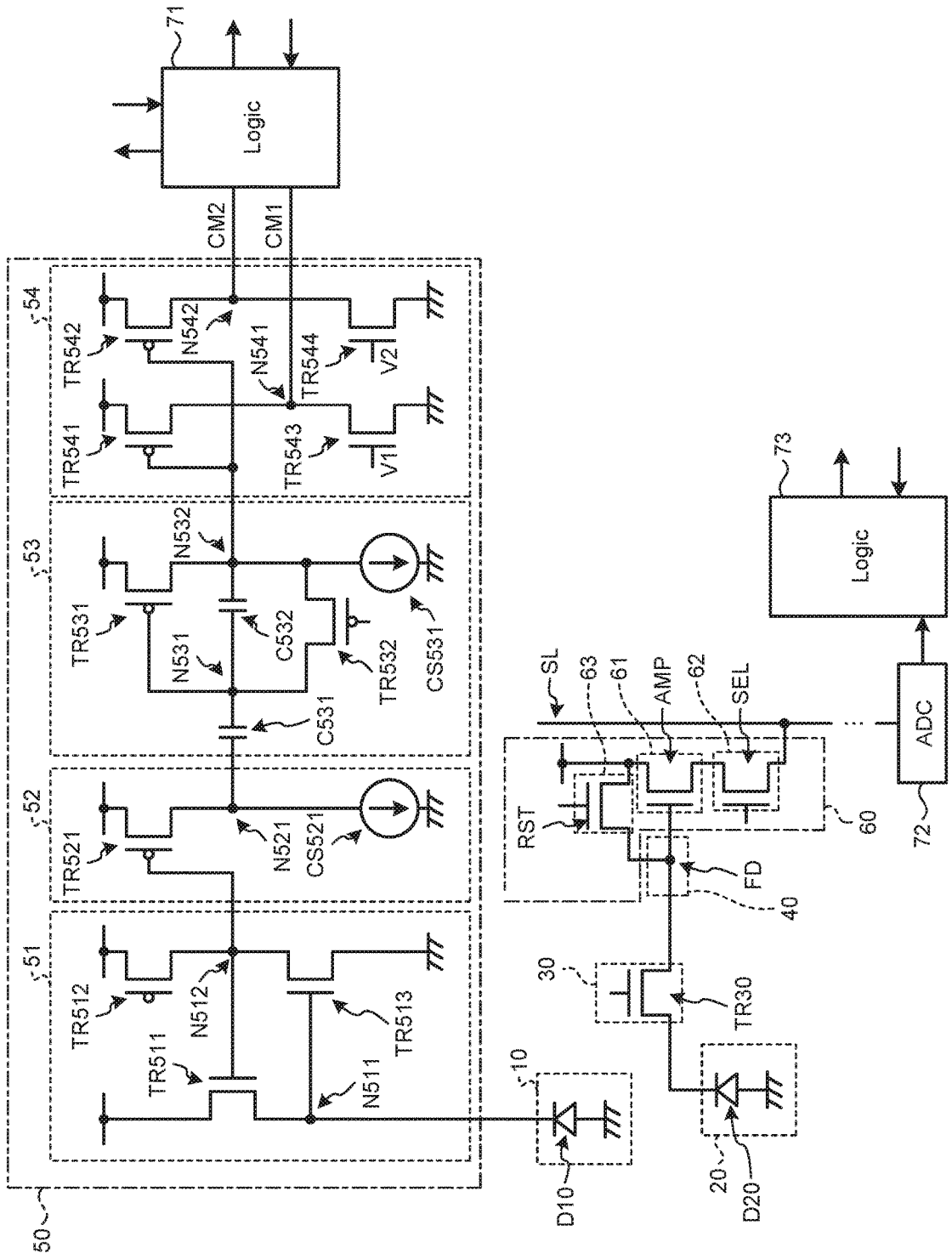
FIG. 2 is a circuit diagram illustrating a configuration of a solid-state imaging device according to the first embodiment of the present disclosure.

The current readout circuit 50 is a logarithmic current-to-voltage conversion circuit and is an event detection circuit that detects a change in current as an event. The current readout circuit is a DVS circuit, for example. The current readout circuit 50 can be configured as illustrated in FIG. 2, for example. FIG. 2 is a diagram illustrating configurations of the current readout circuit 50 and a voltage readout circuit 60 in the solid-state imaging device 1.

The current readout circuit 50 includes a logarithmic current-to-voltage converter 51, a buffer 52, a differentiator circuit 53, and a comparator 54.

The logarithmic current-to-voltage converter 51 performs logarithmic conversion of a current (photocurrent) read out from the photoelectric conversion unit 10 into a voltage. The photoelectric conversion unit 10 includes a photodiode D10. The logarithmic current-to-voltage converter 51 includes N-type transistors TR511 and TR513 and a P-type transistor TR512. The N-type transistor TR511, provided as an NMOS transistor, for example, has a source electrically connected to the cathode of the photodiode D10 via a node N511, a drain electrically connected to a power supply potential, and a gate electrically connected to a node N512. The P-type transistor TR512, provided as a PMOS transistor, for example, has a source electrically connected to the power supply potential, a drain electrically connected to the node N512, and a gate receiving a bias voltage from a control circuit (not illustrated). The N-type transistor TR513, provided as an NMOS transistor, for example, has a source electrically connected to the ground potential, a drain electrically connected to the node N512, and a gate electrically connected to the cathode of the photodiode D10 via the node N511. The node N512 is electrically connected to the buffer 52.

The buffer 52 buffers a signal corresponding to the voltage of the logarithmic current-to-voltage converter 51. The buffer 52 includes an N-type transistor TR521 and a current source CS521. The N-type transistor TR521, provided as an NMOS transistor, for example, has a source electrically connected to one end of the current source CS521 via a node N521, a drain electrically connected to a power supply potential, and a gate electrically connected to a node N512. The current source CS521 has one end electrically connected to the node N521 and the other end electrically connected to the ground potential. The node N521 is electrically connected to the differentiator circuit 53.

The differentiator circuit 53 performs a differentiating operation on the signal buffered by the buffer 52 and generates a differentiated signal corresponding to the amount of change in current. The differentiator circuit 53 includes capacitive elements C531 and C532, P-type transistors TR531 and TR532, and a current source CS531. The capacitive element C531 has one end electrically connected to the node N521 and has the other end electrically connected to a node N531. The capacitive element C532 has one end electrically connected to the node N531 and has the other end electrically connected to a node N532. The P-type transistor TR531, provided as a PMOS transistor, for example, has a source electrically connected to the power supply potential, a drain electrically connected to the node N532, and a gate electrically connected to the node N531. The P-type transistor TR532, provided as a PMOS transistor, for example, has a source electrically connected to the node N531, a drain electrically connected to the node N532 and one end of the current source CS531, and a gate receiving a bias voltage from a control circuit (not illustrated). The current source CS531 has one end electrically connected to the node N532 and the other end electrically connected to the ground potential. The node N532 is electrically connected to the comparator 54.

The comparator 54 compares the differentiated signal generated by the differentiator circuit 53 with a predetermined threshold, and generates a signal indicating the presence or absence of occurrence of an event based on a comparison result. The comparator 54 includes P-type transistors TR541 and TR542 and N-type transistors TR543 and TR544. The P-type transistor TR541, provided as a PMOS transistor, for example, has a source electrically connected to the power supply potential, a drain electrically connected to the node N541, and a gate electrically connected to the node N532. The P-type transistor TR542, provided as a PMOS transistor, for example, has a source electrically connected to the power supply potential, a drain electrically connected to the node N542, and a gate electrically connected to the node N532. The N-type transistor TR543, provided as a NMOS transistor, for example, has a source electrically connected to the ground potential, a drain electrically connected to the node N541, and a gate receiving a bias voltage V1 from a control circuit (not illustrated). The N-type transistor TR544, provided as a NMOS transistor, for example, has a source electrically connected to the ground potential, a drain electrically connected to the node N542, and a gate receiving a bias voltage V2 from a control circuit (not illustrated).

For example, the bias voltage V1 corresponds to an upper limit of the fluctuation range of the differentiated signal, while the bias voltage V2 corresponds to a lower limit of the fluctuation range of the differentiated signal. When the differentiated signal exceeds the upper limit, the comparator 54 supplies a high-level signal CM1 to the logic circuit 71 as a signal indicating occurrence of an event on the upper limit side. When the differentiated signal exceeds the lower limit, the comparator 54 supplies a low-level signal CM2 to the logic circuit 71 as a signal indicating occurrence of an event on the lower limit side.

Returning to FIG. 1, the photoelectric conversion unit 20 is an embedded unit and includes a semiconductor region 21. The semiconductor region 21 is disposed at a position deeper than the front surface of the semiconductor substrate 2, at a position deeper than the semiconductor region 11. The semiconductor region 21 overlaps the semiconductor region 11 when viewed in the light incident direction. When an axis passing through the center of the semiconductor region 11 and extending in a direction perpendicular to the front surface of the semiconductor substrate 2 is defined an optical axis PX11 of the semiconductor region 11, the optical axis PX11 of the semiconductor region 11 intersects the semiconductor region 21. When an axis passing through the center of the semiconductor region 21 and extending in a direction perpendicular to the front surface of the semiconductor substrate 2 is defined as an optical axis PX21 of the semiconductor region 21, the optical axis PX21 of the semiconductor region 21 intersects the semiconductor region 11. The semiconductor region 21 is separated from the semiconductor region 11 in a depth direction. The semiconductor region 21 contains second conductivity type (for example, N-type) impurities at a third concentration higher than the first concentration and lower than the second concentration.

As indicated by a one-dot chain arrow in FIG. 1, the photoelectric conversion unit 20 receives light, performs photoelectric conversion on the received light in an interface region between the semiconductor region 21 and the semiconductor substrate 2, generates a charge corresponding to the received light, and accumulates the generated light in the semiconductor region 21. At this time, since the photoelectric conversion unit 20 is an embedded unit, it is possible to suppress an influence of a trap level on the front surface of the semiconductor substrate 2, leading to suppression of entrance of a noise charge into the charge accumulated in the semiconductor region 21. The photoelectric conversion unit 20 functions as, for example, a photodiode D20 illustrated in FIG. 2.

The transfer unit 30 illustrated in FIG. 1 transfers the charge accumulated in the photoelectric conversion unit 20 to the charge-to-voltage converter 40. The charge-to-voltage converter 40 converts the transferred charge into a voltage. The charge-to-voltage converter 40 functions as floating diffusion FD (refer to FIG. 2), for example, and includes a semiconductor region 41. The semiconductor region 41 is disposed in the vicinity of the front surface of the semiconductor substrate 2, and a front surface of the semiconductor region 41 constitutes a part of the front surface of the semiconductor substrate 2. The semiconductor region 41 contains second conductivity type (for example, N-type) impurities at a second concentration higher than the first concentration.

The transfer unit 30 functions as, for example, a transfer transistor TR30 (refer to FIG. 2), and includes a semiconductor region 21 as a source, a transfer gate 31 as a gate, and a semiconductor region 41 as a drain. The transfer gate 31 has a vertical shape extending in the depth direction into the substrate. The transfer gate 31 includes: a flat portion 31a that covers the front surface of the semiconductor substrate 2 via the gate insulating film 3; and a trench portion 31b that penetrates the gate insulating film 3 from the flat portion 31a and extends deeper than the semiconductor region 11 in the depth direction within the semiconductor substrate 2 to the vicinity of the depth of the semiconductor region 21. The transfer gate 31 may be formed of polysilicon containing impurities or may be formed of metal such as tungsten. When an active level control signal is supplied to the transfer gate 31, the transfer unit 30 transfers the charge accumulated in the semiconductor region 21 to the semiconductor region 41.

That is, the photoelectric conversion unit 20 is a photoelectric conversion unit for imaging, and is electrically connected to the voltage readout circuit 60 via the transfer unit 30 and the charge-to-voltage converter 40. The charge transferred from the semiconductor region 21 to the charge-to-voltage converter 40 via the transfer unit 30 is converted into a voltage by the charge-to-voltage converter 40, and the voltage obtained by the conversion is read out to the voltage readout circuit 60.

The voltage readout circuit 60 is a circuit of high-impedance input, and is a source follower circuit, a source grounded circuit, or a differential circuit, for example. The voltage readout circuit 60 may be, for example, a gradation converting circuit that converts a read voltage into a signal corresponding to gradation, or may be an analog digital conversion (ADC) circuit or a circuit at a preceding stage of the ADC circuit. The voltage readout circuit 60 can be configured as illustrated in FIG. 2, for example.

The voltage readout circuit 60 includes an amplification unit 61, a selection unit 62, and a reset unit 63. The selection unit 62 switches the voltage readout circuit 60 between a selected state and a non-selected state. The selection unit 62 includes a selection transistor SEL. When having received an active level control signal at the gate, the selection transistor SEL sets the voltage readout circuit 60 to the selected state; when having received a non-active level control signal at the gate, the selection transistor SEL sets the voltage readout circuit 60 to the non-selected state. When the voltage readout circuit 60 is in the selected state, the amplification unit 61 amplifies the voltage of the charge-to-voltage converter 40. The amplification unit 61 includes an amplification transistor AMP. The amplification transistor AMP performs a source follower operation together with a current source (not illustrated) connected to a signal line SL according to the voltage of the charge-to-voltage converter 40, and supplies a signal according to the voltage of the charge-to-voltage converter 40 to the signal line SL. The reset unit 63 resets the voltage of the charge-to-voltage converter 40. The reset unit 63 includes a reset transistor RST. The reset transistor RST discharges the charge, which is held in the charge-to-voltage converter 40 when the active level control signal is received at the gate, to the power supply potential so as to reset the voltage of the charge-to-voltage converter 40.

For example, the signal line SL is connected with a plurality of voltage readout circuits 60 corresponding to a plurality of pixel regions PR arranged in a column direction among a plurality of pixel regions PR arranged two-dimensionally. The plurality of voltage readout circuits 60 is sequentially brought into the selected state to perform readout of a pixel signal. Furthermore, the signal line SL may be connected with an ADC circuit 72. The ADC circuit 72 performs AD conversion on the pixel signal (analog signal) to generate a pixel signal (digital signal), and supplies the generated pixel signal (digital signal) to the logic circuit 73 as a signal indicating a gradation value. The logic circuit 73 performs imaging processing by forming image data according to pixel signals of the plurality of pixel regions PR and performing predetermined image processing.

In comparison between the photoelectric conversion unit 10 and the photoelectric conversion unit 20, the photoelectric conversion unit 20, provided as a photoelectric conversion unit for imaging, is required to improve the image quality of an obtained image and improve the S/N ratio, and thus, is an embedded unit. The photoelectric conversion unit 10, provided as a photoelectric conversion unit for DVS, is required to achieve a high sensitivity with higher priority compared with image quality, and thus, need not be an embedded unit, and may be exposed on the front surface of the semiconductor substrate 2.

Furthermore, a connection form between the photoelectric conversion unit 10 and the current readout circuit 50 is different from a connection form between the photoelectric conversion unit 20 and the voltage readout circuit 60. The photoelectric conversion unit 10 is directly connected to the current readout circuit 50, and is electrically connected to the gate of the transistor TR513 (refer to FIG. 2) in the current readout circuit 50. The photoelectric conversion unit 20 is connected to the voltage readout circuit 60 via the transfer unit 30 and the charge-to-voltage converter 40, and is electrically connected to the voltage readout circuit 60 via the source and the drain of the transistor TR30. The transistor TR30 has a vertical shape having the transfer gate 31 extending in the depth direction into the substrate.

Furthermore, as illustrated in FIG. 1, the semiconductor substrate 2 may include a semiconductor region 4 formed in the vicinity of the boundary in order to be electrically separated from another pixel region PR. The semiconductor region 4 contains impurities of the first conductivity type (for example, P-type) at a fourth concentration higher than the first concentration. The semiconductor region 4 can form in the vicinity thereof a potential barrier against charges (for example, an electron).

As described above, in the first embodiment, each pixel region PR of the solid-state imaging device 1 has a configuration in which the plurality of photoelectric conversion units 10 and 20 are disposed to overlap each other in the light incident direction. With this configuration, it is possible, in each pixel region PR, to obtain a large area in the planar direction of each of the photoelectric conversion units 10 and 20 having different uses. Furthermore, each pixel region PR of the solid-state imaging device 1 has a configuration in which the plurality of photoelectric conversion units 10 and 20 are connected to different types of readout circuits 50 and 60, respectively. With this configuration, it is possible to control the plurality of photoelectric conversion units 10 and 20 independently of each other. This makes it possible to easily obtain the aperture ratio of each of the photoelectric conversion units 10 and 20 while controlling the photoelectric conversion units 10 and 20 having different uses independently of each other.

Incidentally, although the color filters are omitted for simplification of illustration and description, the filters may all have the same color, may be color filters arranged in a Bayer array, complementary color filters, or the like, that is, it is allowable to apply color filters of various forms.

1.1 First Modification of First Embodiment

Figure 3:
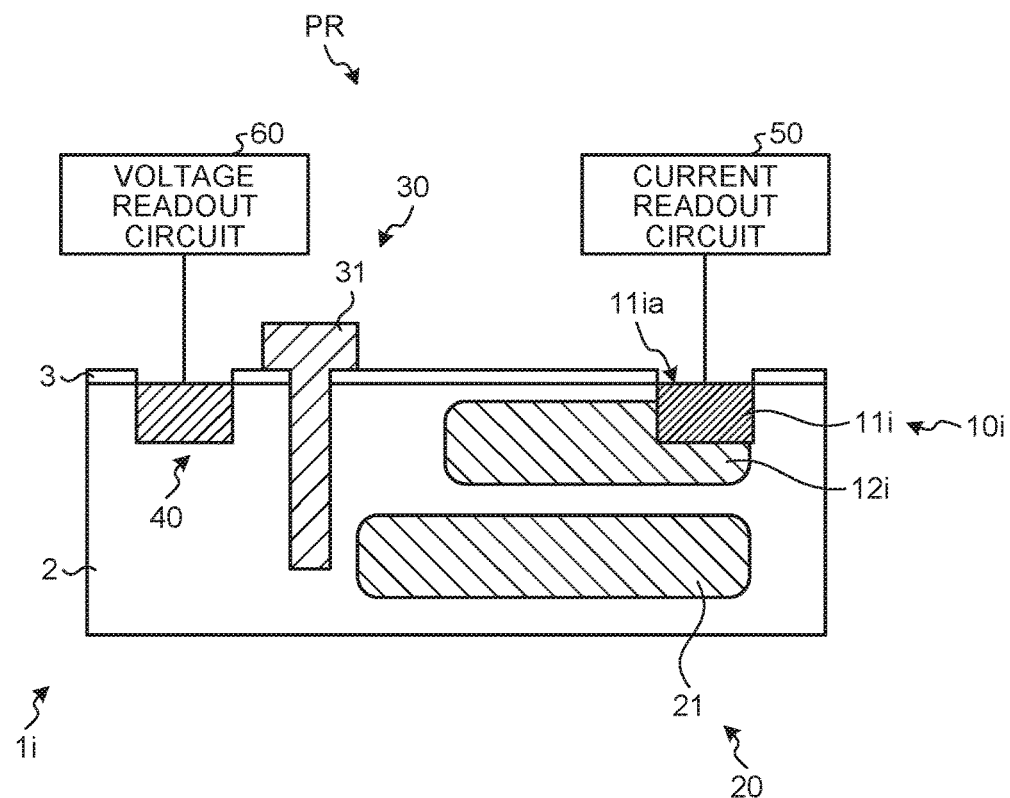
FIG. 3 is a cross-sectional view illustrating a configuration of a solid-state imaging device according to a first modification of the first embodiment of the present disclosure.

As illustrated in FIG. 3, in each pixel region PR of a solid-state imaging device 1$i$, a photoelectric conversion unit 10$i$ for DVS may be partially embedded. FIG. 3 is a cross-sectional view illustrating a configuration of the solid-state imaging device 1$i$ according to a first modification of the first embodiment of the present disclosure.

The pixel region PR of the solid-state imaging device 1$i$ includes the photoelectric conversion unit 10$i$ instead of the photoelectric conversion unit 10 (refer to FIG. 1). The photoelectric conversion unit 10$i$ includes a semiconductor region 11$i$ and a semiconductor region 12$i$ instead of the semiconductor region 11 (refer to FIG. 1). The semiconductor region 11$i$ is disposed in the vicinity of a front surface of a semiconductor substrate 2, and a front surface 11$ia$ of the semiconductor region 11$i$ constitutes a part of the front surface of the semiconductor substrate 2. The front surface of the semiconductor substrate 2 is generally covered with the gate insulating film 3, with an exception of the front surface 11$ia$ of the semiconductor region 11$i$, which is not covered with the gate insulating film 3 and is exposed to an interlayer insulating film (not illustrated). The semiconductor region 11$i$ contains second conductivity type (for example, N-type) impurities at a second concentration higher than the first concentration.

The semiconductor region 12$i$ is disposed at a position deeper than the front surface of the semiconductor substrate 2 and slightly deeper than the semiconductor region 11$i$. The semiconductor region 12$i$ is bonded to the semiconductor region 11$i$. The semiconductor region 12$i$ includes impurities of the second conductivity type at a third concentration higher than the first concentration and lower than the second concentration.

Both the semiconductor region 11$i$ and the semiconductor region 12$i$ are disposed at positions shallower than the semiconductor region 21 and are disposed separated from the semiconductor region 21 in the depth direction. Each of the semiconductor region 11$i$ and the semiconductor region 12$i$ overlaps the semiconductor region 21 when viewed in the light incident direction.

With such a configuration, it is also possible, in each pixel region PR, to easily obtain the aperture ratio of each of the photoelectric conversion units 10$i$ and 20 while independently controlling the photoelectric conversion units 10$i$ and 20 having different uses.

1.2 Second Modification of First Embodiment

Figure 4:
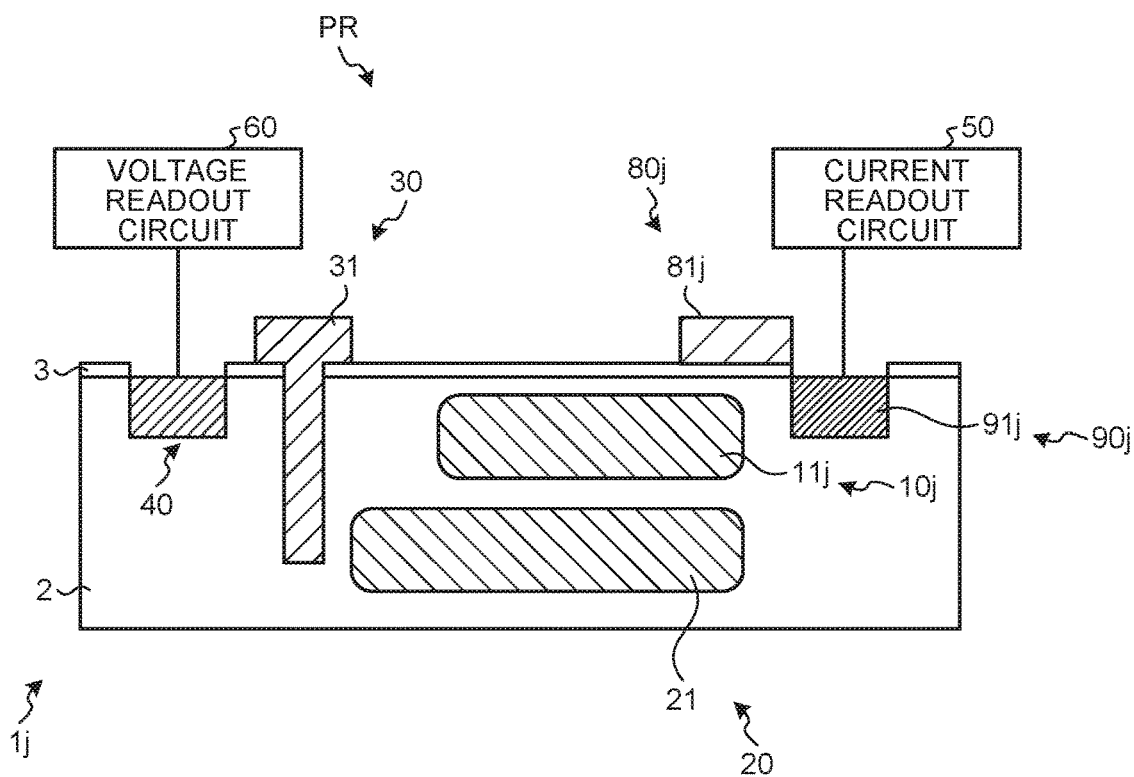
FIG. 4 is a cross-sectional view illustrating a configuration of a solid-state imaging device according to a second modification of the first embodiment of the present disclosure.

Alternatively, as illustrated in FIG. 4, it is also allowable to have each pixel region PR of a solid-state imaging device 1$j$ in which a photoelectric conversion unit 10$j$ for DVS is electrically connected to the current readout circuit 50 via a transfer unit 80$j$ and a buffer unit 90$j$. FIG. 4 is a cross-sectional view illustrating a configuration of the solid-state imaging device 1$j$ according to a second modification of the first embodiment of the present disclosure.

The pixel region PR of the solid-state imaging device 1$j$ includes the photoelectric conversion unit 10$j$ instead of the photoelectric conversion unit 10 (refer to FIG. 1), and further includes the transfer unit 80$j$ and the buffer unit 90$j$.

The photoelectric conversion unit 10$j$ is an embedded unit and has a semiconductor region 11$j$. The semiconductor region 11$j$ is disposed at a position deeper than the front surface of the semiconductor substrate 2 and is disposed at a position shallower than the semiconductor region 21. The semiconductor region 11$j$ overlaps the semiconductor region 21 when viewed in the light incident direction. The semiconductor region 11$j$ is separated from the semiconductor region 21 in the depth direction. The semiconductor region 11$j$ contains second conductivity type (for example, N-type) impurities at a third concentration higher than the first concentration and lower than the second concentration.

The transfer unit 80$j$ transfers the charge accumulated in the photoelectric conversion unit 10$j$ to the buffer unit 90$j$. The buffer unit 90$j$ buffers the transferred charge. The charge buffered in the buffer unit 90$j$ is read out to the current readout circuit 50 as a current (photocurrent). The buffer unit 90$j$ includes a semiconductor region 91$j$. The semiconductor region 91$j$ contains impurities of the second conductivity type (for example, N-type) at a first concentration.

The transfer unit 80$j$ functions as a transfer transistor, for example, and includes the semiconductor region 11$j$ as a source, a transfer gate 81$j$ as a gate, and the semiconductor region 91$j$ as a drain. The transfer gate 81$j$ is a planar gate extending in the planar direction along the front surface of the substrate. When an active level control signal is supplied to the transfer gate 81$j$, the transfer unit 80$j$ transfers the charge accumulated in the semiconductor region 11$j$ to the semiconductor region 91$j$.

Furthermore, the connection form between the photoelectric conversion unit 10$j$ and the current readout circuit 50 is different from the connection form between the photoelectric conversion unit 20 and the voltage readout circuit 60. The photoelectric conversion unit 10$j$ is connected to the current readout circuit 50 via the source and the drain of the transfer transistor including the transfer gate 81$j$ having a planar shape. The photoelectric conversion unit 20 is electrically connected to the voltage readout circuit 60 via the source and the drain of the transfer transistor including the transfer gate 31 having a vertical shape. That is, the transfer transistor of the transfer unit 80j can form a channel region at a shallow position corresponding to the semiconductor region 11j, while the transfer transistor of the transfer unit 30 can form a channel region including a deep position corresponding to the semiconductor region 21, enabling independent readout of charges of the photoelectric conversion units 10j and 20.

With such a configuration, it is also possible, in each pixel region PR, to easily obtain the aperture ratio of each of the photoelectric conversion units 10j and 20 while independently controlling the photoelectric conversion units 10j and 20 having different uses.

1.3 Third Modification of First Embodiment

Figure 5A:
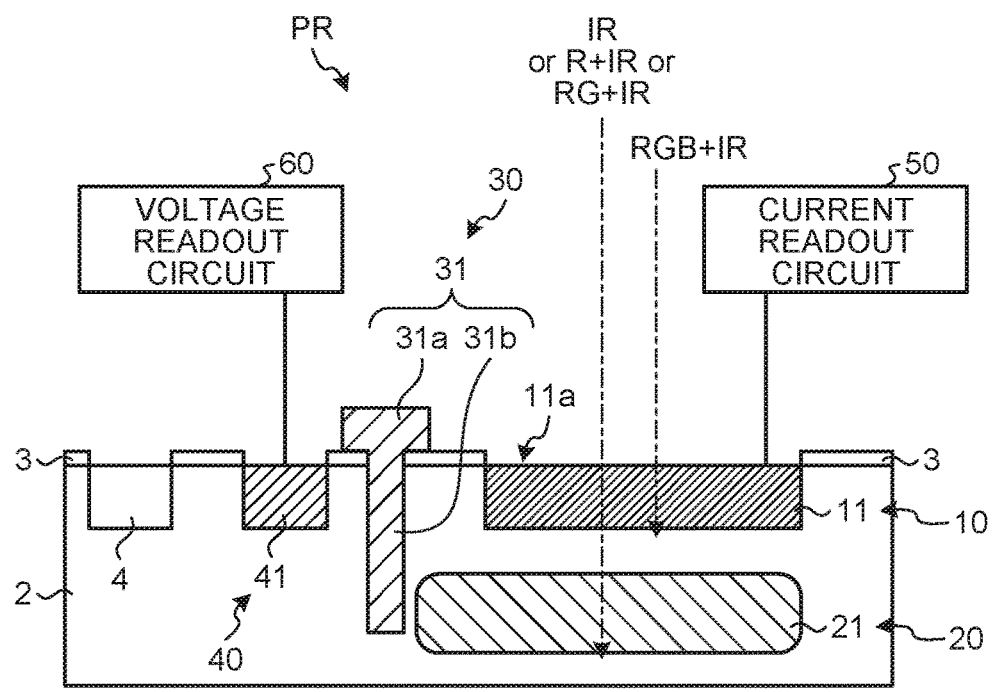
FIGS. 5A and 5B are cross-sectional views illustrating a configuration of a solid-state imaging device according to a third modification of the first embodiment of the present disclosure.
Figure 5B:
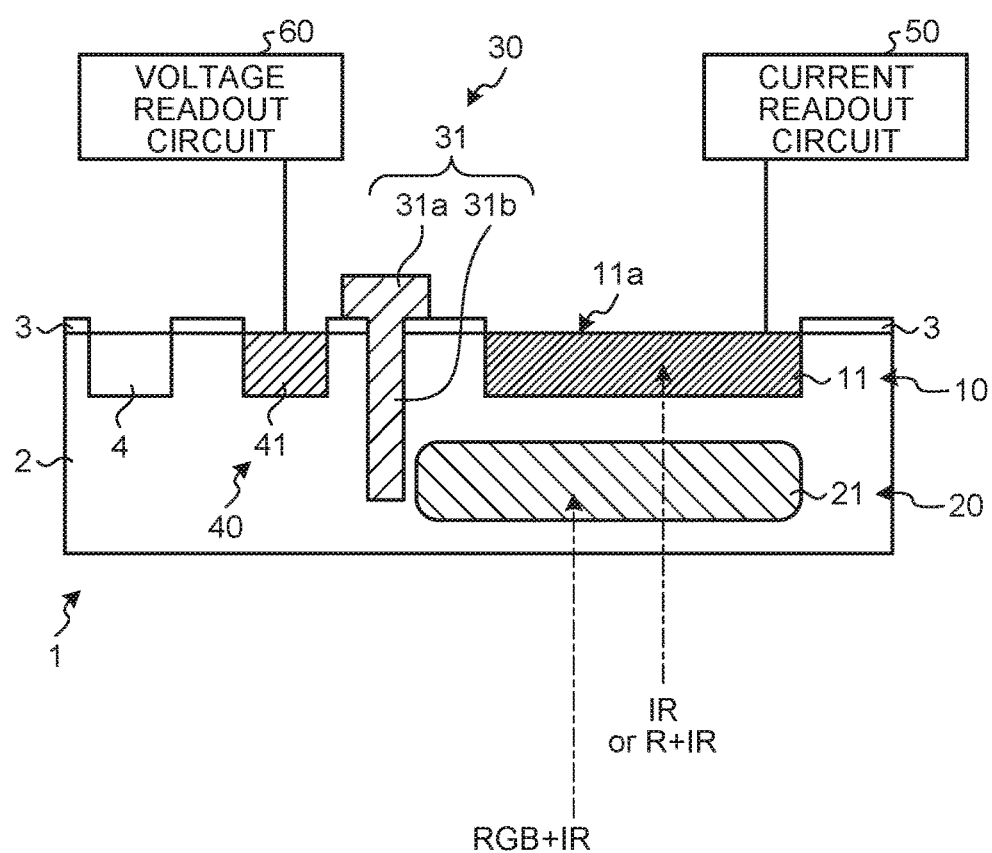

Furthermore, the solid-state imaging device 1 may be a front side illumination device as illustrated in FIG. 5A or a back side illumination device as illustrated in FIG. 5B. FIGS. 5A and 5B are cross-sectional views illustrating a configuration of the solid-state imaging device 1 according to a third modification of the first embodiment of the present disclosure.

In a case where the solid-state imaging device 1 is the front side illumination device illustrated in FIG. 5A, it is allowable to have a configuration of each pixel region PR of the solid-state imaging device 1 in which the photoelectric conversion unit 10 for DVS is capable of receiving any one of red (R) light, green (G) light, and blue (B) light and infrared (IR) light. The imaging photoelectric conversion unit 20 may be capable of receiving IR light, may be capable of receiving R light and IR light, or may be capable of receiving one of R light and G light, together with IR light. The photoelectric conversion unit 10 for DVS and the photoelectric conversion unit 20 for imaging may be capable of receiving light beams having different wavelengths depending on the depth from the front surface of the substrate.

In a case where the solid-state imaging device 1 is the back side illumination device illustrated in FIG. 5B, it is allowable to have a configuration of each pixel region PR of the solid-state imaging device 1 in which the photoelectric conversion unit 10 for DVS is capable of receiving IR light or capable of receiving R light and IR light. The photoelectric conversion unit 20 for imaging may be capable of receiving any one of R light, G light, and B light, together with IR light. The photoelectric conversion unit 10 for DVS and the photoelectric conversion unit 20 for imaging may be capable of receiving light beams having different wavelengths depending on the depth from the back surface of the substrate.

In this manner, in both the case of the front side illumination device and the case of the back side illumination device, it is possible to easily obtain, in each pixel region PR, the aperture ratio of each of the photoelectric conversion units 10 and 20 having different uses.

1.4 Fourth Modification of First Embodiment

Alternatively, as illustrated in FIG. 6, it is also allowable to have each pixel region PR of a solid-state imaging device 1k in which an imaging photoelectric conversion unit 20k can be extended from a deep position to a shallow position in the substrate. FIG. 6 is a cross-sectional view illustrating a configuration of the solid-state imaging device 1k according to a fourth modification of the first embodiment of the present disclosure.

The pixel region PR of the solid-state imaging device 1k includes the photoelectric conversion unit 20k and a transfer unit 30k in place of the photoelectric conversion unit 20 and the transfer unit 30, respectively (refer to FIG. 1).

The photoelectric conversion unit 20k is an embedded unit and has a semiconductor region 21k. The semiconductor region 21k includes a flat portion 21k1 and an extended portion 21k2. The flat portion 21k1 is disposed at a position deeper than the front surface of the semiconductor substrate 2 and is disposed at a position deeper than the semiconductor region 11. The flat portion 21k1 overlaps the semiconductor region 11 when viewed in the light incident direction. The flat portion 21k1 is separated from the semiconductor region 11 in the depth direction. The extended portion 21k2 extends from the end of the flat portion 21k1 on the semiconductor region 41 side to the vicinity of the front surface of the semiconductor substrate 2 in the depth direction. The extended portion 21k2 is separated from the semiconductor region 11 in the planar direction. Each of the flat portion 21k1 and the extended portion 21k2 contains impurities of the second conductivity type (for example, N-type) at a third concentration higher than the first concentration and lower than the second concentration.

The transfer unit 30k functions as a transfer transistor TR30 (refer to FIG. 2), for example, and includes a semiconductor region 21k as a source, a transfer gate 31k as a gate, and a semiconductor region 41 as a drain. The transfer gate 31k is a planar gate extending in the planar direction along the front surface of the substrate. When an active level control signal is supplied to the transfer gate 31k, the transfer unit 30k extracts the charge accumulated in the semiconductor region 21k from the extended portion 21k2 and transfers the charge to the semiconductor region 41.

With such a configuration, it is also possible, in each pixel region PR, to easily obtain the aperture ratio of each of the photoelectric conversion units 10k and 20 while independently controlling the photoelectric conversion units 10k and 20 having different uses.

1.5 Fifth Modification of First Embodiment

Figure 7:
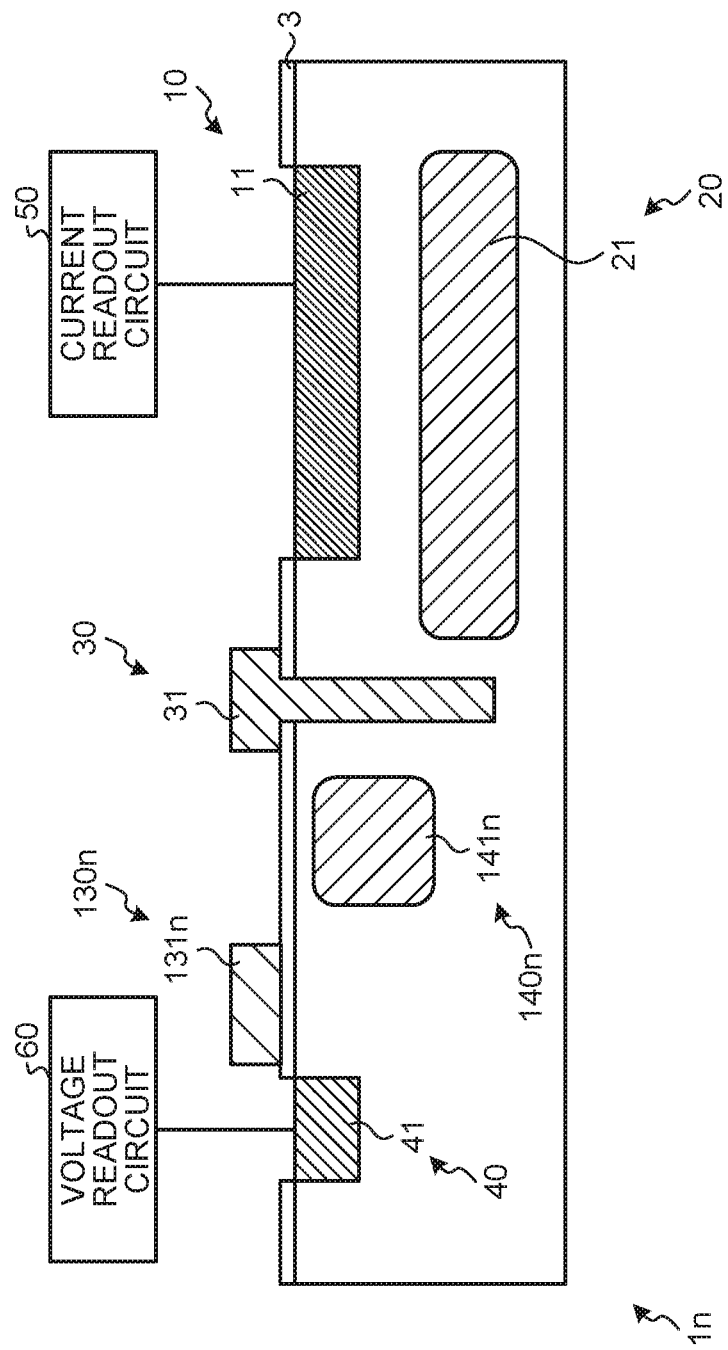
FIG. 7 is a cross-sectional view illustrating a configuration of a solid-state imaging device according to a fifth modification of the first embodiment of the present disclosure.

Alternatively, as illustrated in FIG. 7, it is also allowable to have each pixel region PR of a solid-state imaging device 1n in which the photoelectric conversion unit 20 for imaging is electrically connected to the voltage readout circuit 60 via the transfer unit 30, a charge holding unit 140n, and a transfer unit 130n. FIG. 7 is a cross-sectional view illustrating a configuration of the solid-state imaging device 1n according to a fifth modification of the first embodiment of the present disclosure.

The pixel region PR of the solid-state imaging device 1n further includes the charge holding unit 140n and the transfer unit 130n.

The charge holding unit 140n is an embedded unit and has a semiconductor region 141n. The semiconductor region 141n is disposed at a position deeper than the front surface of the semiconductor substrate 2 and is disposed at a position shallower than the semiconductor region 21. The semiconductor region 11j contains second conductivity type (for example, N-type) impurities at a third concentration higher than the first concentration and lower than the second concentration.

The transfer unit 30 transfers the charge accumulated in the photoelectric conversion unit 20 to the charge holding unit 140n. The charge holding unit 140n holds the transferred charge. The transfer unit 130n transfers the charge held in the charge holding unit 140n to the charge-to-voltage converter 40.

The transfer unit 130n functions as a transfer transistor inserted in series between the transfer transistor TR30 and the floating diffusion FD, for example, and includes a semiconductor region 141n as a source, a transfer gate 131n as a gate, and a semiconductor region 41 as a drain. The transfer gate 131n is a planar gate extending in the planar direction along the front surface of the substrate. When an active level control signal is supplied to the transfer gate 131n, the transfer unit 130n transfers the charge held in the semiconductor region 141n to the semiconductor region 41.

For example, by performing the transfer of the charge from the photoelectric conversion unit 20 to the charge-to-voltage converter 40 in two steps, it is possible to implement a global shutter operation in which the charge accumulation operation of the photoelectric conversion unit 20 is simultaneously performed for the plurality of pixel regions PR and the charge is sequentially transferred from the charge holding unit 140n to the charge-to-voltage converter 40. Alternatively, it is possible to implement an operation of performing variable conversion efficiency in the charge-to-voltage conversion by transferring the charge of the charge holding unit 140n switchably to the charge-to-voltage converter 40 and/or another charge-to-voltage converter (not illustrated).

At this time, the connection form between the photoelectric conversion unit 10 and the current readout circuit 50 is different from the connection form between the photoelectric conversion unit 20 and the voltage readout circuit 60. The photoelectric conversion unit 10 is directly connected to the current readout circuit 50. The photoelectric conversion unit 20 is electrically connected to the voltage readout circuit 60 via the source and the drain of the transfer transistor including the transfer gate 31 having a vertical shape and the source and the drain of the transfer transistor including the transfer gate 131n having a planar shape.

With such a configuration, it is also possible, in each pixel region PR, to easily obtain the aperture ratio of each of the photoelectric conversion units 10 and 20 while independently controlling the photoelectric conversion units 10 and 20 having different uses.

2. Second Embodiment

Next, a solid-state imaging device according to a second embodiment will be described. Hereinafter, the configurations different from those of the first embodiment will be mainly described.

In contrast to the first embodiment focusing on the cross-sectional configuration of each pixel region PR of the solid-state imaging device, the second embodiment will focus on the planar configuration of each pixel region PR of the solid-state imaging device.

Figure 8:
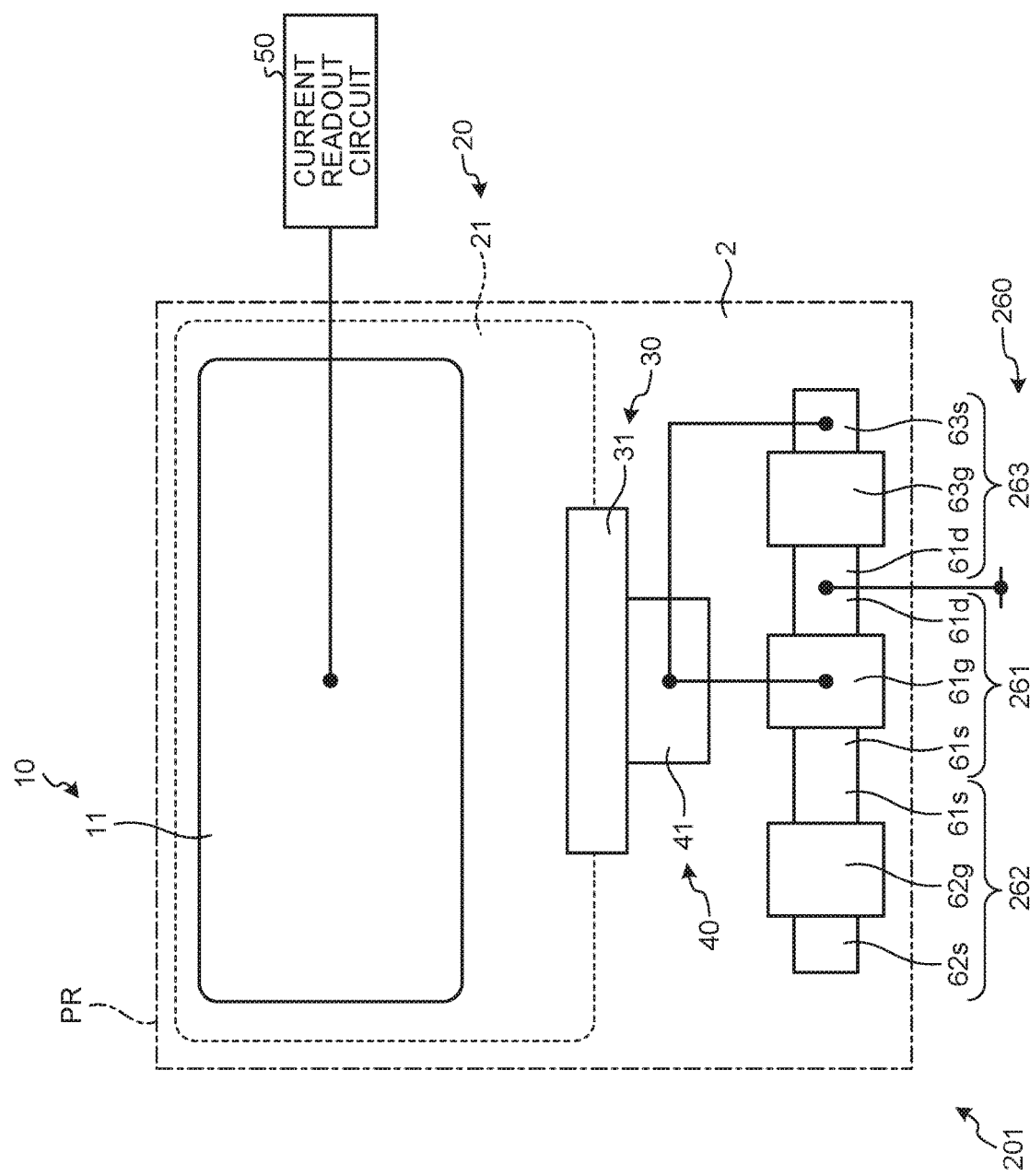
FIG. 8 is a plan view illustrating a configuration of a solid-state imaging device according to a second embodiment of the present disclosure.

Specifically, in the pixel region PR of a solid-state imaging device 201, the photoelectric conversion unit 10 includes a semiconductor region 11. As indicated by a solid line in FIG. 8, the semiconductor region 11 is disposed in the vicinity of the front surface of the semiconductor substrate 2, and the front surface of the semiconductor region 11 constitutes a part of the front surface of the semiconductor substrate 2. The photoelectric conversion unit 20 is an embedded unit and has a semiconductor region 21. As indicated by a dotted line in FIG. 8, the semiconductor region 21 is disposed at a position deeper than the front surface of the semiconductor substrate 2, at a position deeper than the semiconductor region 11. When viewed in the light incident direction, the semiconductor region 11 and the semiconductor region 21 are arranged to have at least their main portions overlapping each other. For example, the semiconductor region 11 may be included inside the semiconductor region 21. With this configuration, when a plurality of photoelectric conversion units 10 and 20 for different uses are disposed in the pixel region PR, it is possible to easily obtain the light receiving area of each of the photoelectric conversion units 10 and 20. In addition, it is possible to have sufficient room regarding the layout area in the pixel region PR.

The photoelectric conversion unit 10 is a photoelectric conversion unit for DVS, and is electrically connected to the current readout circuit 50. The photoelectric conversion unit 20 is a photoelectric conversion unit for imaging, a photoelectric conversion unit for imaging, and is electrically connected to the voltage readout circuit 260 via the transfer unit 30 and the charge-to-voltage converter 40. In plan view, the transfer gate 31 of the transfer unit 30 is disposed at a position adjacent to the semiconductor region 21. The semiconductor region 41 of the charge-to-voltage converter 40 is disposed on the opposite side of the semiconductor region 21 across the transfer gate 31.

At this time, when there is sufficient room regarding the layout area in the pixel region PR, the element group of the voltage readout circuit 260 may be disposed in the pixel region PR. This makes it possible to achieve efficient layout of the voltage readout circuit 260.

The voltage readout circuit 260 includes an amplification unit 261, a selection unit 262, and a reset unit 263. The amplification unit 261 functions as an amplification transistor AMP, for example, (refer to FIG. 2), and includes a semiconductor region 61s as a source, an electrode 61g as a gate, and a semiconductor region 61d as a drain. The selection unit 262 functions as a selection transistor SEL (refer to FIG. 2), for example, and includes a semiconductor region 62s as a source, an electrode 62g as a gate, and a semiconductor region 61s as a drain. The semiconductor region 61s is shared by the amplification unit 261 and the selection unit 262. The reset unit 263 functions as a reset transistor RST (refer to FIG. 2), for example, and includes a semiconductor region 63s as a source, an electrode 63g as a gate, and a semiconductor region 61d as a drain. The semiconductor region 61d is shared by the amplification unit 261 and the reset unit 263.

As described above, in the second embodiment, each pixel region PR of the solid-state imaging device 201 has a configuration in which the plurality of photoelectric conversion units 10 and 20 are disposed to overlap each other in the light incident direction. With this configuration, it is possible to easily obtain the light receiving area of each of the photoelectric conversion units 10 and 20, and possible to easily obtain the aperture ratio of each of the photoelectric conversion units 10 and 20.

2.1 First Modification of Second Embodiment

Figure 9:
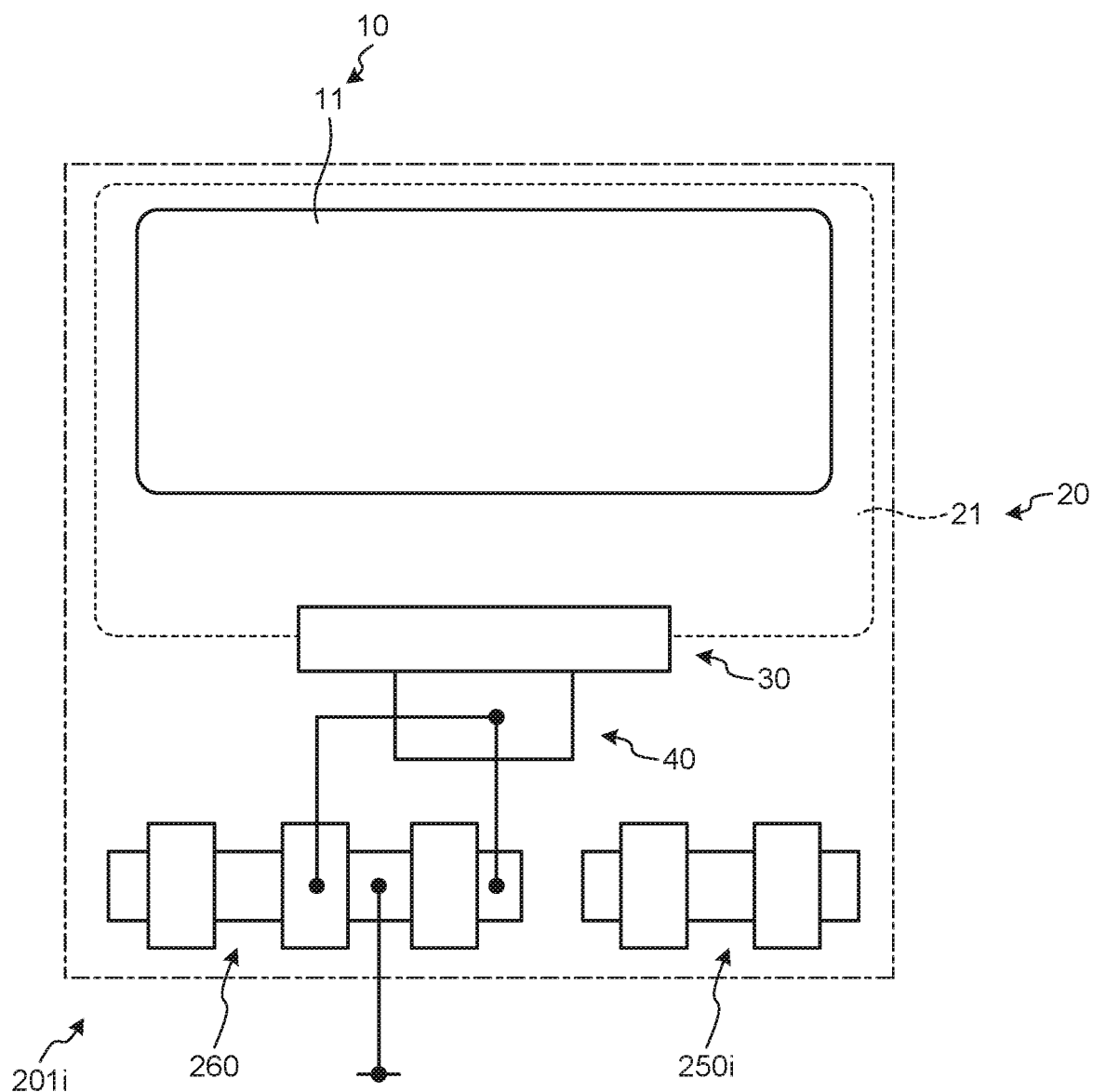
FIG. 9 is a plan view illustrating a configuration of a solid-state imaging device according to first modification of the second embodiment of the present disclosure.

When there is sufficient room regarding the layout area in a pixel region PR of a solid-state imaging device 201i, a part of the configuration of a current readout circuit 250i may be further disposed in the pixel region PR as illustrated in FIG. 9. FIG. 9 is a plan view illustrating a configuration of the solid-state imaging device 201i according to a first modification of the second embodiment of the present disclosure. FIG. 9 is an exemplary case where two electrodes corresponding to two transistors and three semiconductor regions (for example, transistors TR513 and TR512 illustrated in FIG. 2) in the current readout circuit 250*i* are disposed in the pixel region PR.

2.2 Second Modification of Second Embodiment

Alternatively, when there is still sufficient room regarding the layout area in a pixel region PR of a solid-state imaging device 201*j*, a larger amount of part of the configuration of a current readout circuit 250*j* may be disposed in the pixel region PR as illustrated in FIG. 10. FIG. 10 is a plan view illustrating a configuration of a solid-state imaging device 201*j* according to a second modification of the second embodiment of the present disclosure. FIG. 10 illustrates an exemplary case where three electrodes and four semiconductor regions corresponding to three more transistors (for example, transistors TR511, TR521, and TR532 illustrated in FIG. 2, and the like) in the current readout circuit 250*j* are additionally disposed in the pixel region PR of FIG. 9.

2.3 Third Modification of Second Embodiment

Furthermore, as illustrated in FIG. 11, the pixel region PR of the solid-state imaging device 201 may be isolated from another pixel region PR via an insulating isolator DI. The insulating isolator DI may be formed of a material containing an insulator as a main component, such as silicon oxide. FIG. 11 is a plan view illustrating a configuration of a solid-state imaging device 201 according to a third modification of the second embodiment of the present disclosure, illustrating an example of one pixel region PR. The insulating isolator DI illustrated in FIG. 11 extends along the outer edge of the pixel region PR and surrounds the pixel region PR. When the pixel region PR has a rectangular shape in plan view, the insulating isolator DI surrounds the pixel region PR in a rectangular shape.

Figure 12A:
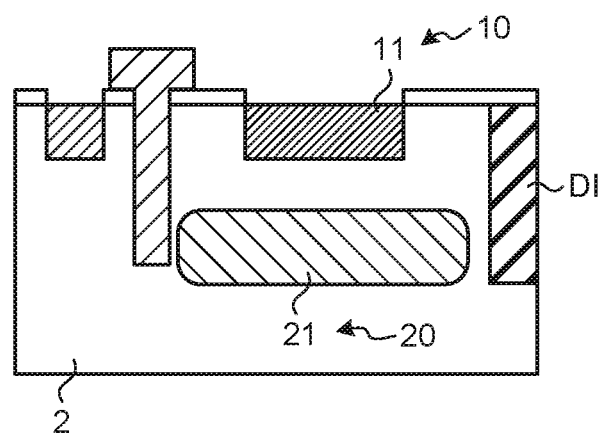
FIGS. 12A, 12B, and 12C are cross-sectional views illustrating a configuration of the solid-state imaging device according to the third modification of the second embodiment of the present disclosure.
Figure 12B:
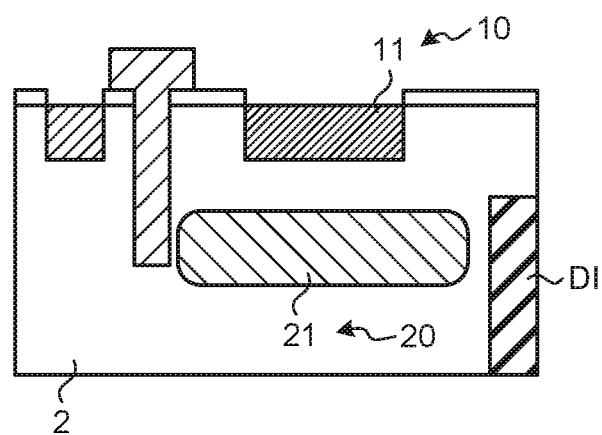
Figure 12C:
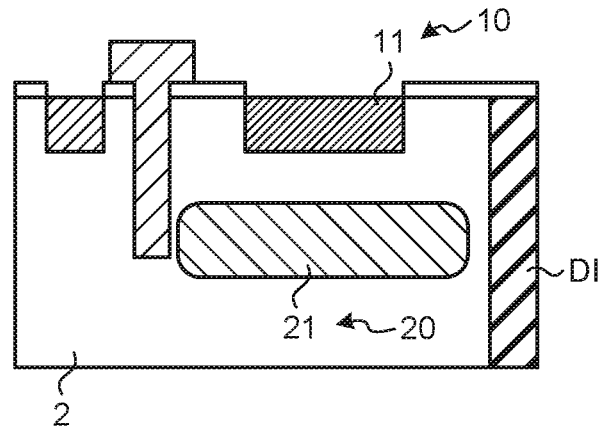

The insulating isolator DI may be implemented as deep trench isolation (DTI) as illustrated in FIG. 12A. FIGS. 12A, 12B, and 12C are cross-sectional views illustrating a configuration of a solid-state imaging device 201 according to the second modification of the second embodiment of the present disclosure, and illustrates a cross section of FIG. 11 taken along line A-A. The insulating isolator DI illustrated in FIG. 12A may extend from the front surface of the semiconductor substrate 2 to a depth corresponding to the depth of the semiconductor region 21 in the depth direction. This makes it possible to suppress the leakage of the charge accumulated in the semiconductor region 21 to the adjacent pixel region PR and suppress color mixing between the adjacent pixel regions PR.

Alternatively, the insulating isolator DI may be implemented as reverse deep trench isolation (RDTI) as illustrated in FIG. 12B. That is, the insulating isolator DI may extend from a depth shallower than the semiconductor region 21 to the back surface of the semiconductor substrate 2 in the depth direction. This also makes it possible to suppress the leakage of the charge accumulated in the semiconductor region 21 to the adjacent pixel region PR and suppress color mixing between the adjacent pixel regions PR.

Alternatively, the insulating isolator DI may be implemented as full deep trench isolation (FDTI) as illustrated in FIG. 12C. That is, the insulating isolator DI may extend from the front surface of the semiconductor substrate 2 to the back surface of the semiconductor substrate 2 in the depth direction. This also makes it possible to suppress the leakage of the charge accumulated in the semiconductor region 21 to the adjacent pixel region PR and suppress color mixing between the adjacent pixel regions PR.

FIG. 13 illustrates planar configurations of the plurality of pixel regions PR illustrated in FIG. 11. FIG. 13 is a plan view illustrating a configuration of a solid-state imaging device 201 according to the second modification of the second embodiment of the present disclosure, illustrating an example of a plurality of pixel regions PR. The insulating isolator DI extends in a lattice shape in plan view and partitions the plurality of pixel regions PR. At this time, the point that the plurality of photoelectric conversion units 10 and 20 are disposed to overlap each other in the light incident direction in each pixel region PR is similar to the second embodiment. This makes it possible to suppress color mixing between the adjacent pixel regions PR.

3. Third Embodiment

Next, a solid-state imaging device according to a third embodiment will be described. Hereinafter, differences from the first embodiment and the second embodiment will be mainly described.

Although the first embodiment and the second embodiment have described an exemplary configuration in which each one of photoelectric conversion units for different uses is arranged in each pixel region PR, the third embodiment describes an exemplary configuration in which the photoelectric conversion units for different uses are disposed in plurality in each pixel region PR.

Specifically, as illustrated in FIG. 14, a pixel region PR of a solid-state imaging device 301 includes a plurality of photoelectric conversion units 310-1 to 310-4, a plurality of photoelectric conversion units 320-1 to 320-4, and a plurality of transfer units 330-1 to 330-4, in place of the photoelectric conversion unit 10, the photoelectric conversion unit 20, and the transfer unit 30, respectively (refer to FIG. 1). FIG. 14 is a plan view illustrating a configuration of the solid-state imaging device 301 according to the third embodiment of the present disclosure.

Each of the plurality of photoelectric conversion units 310-1 to 310-4 has a semiconductor region 311. As indicated by a solid line in FIG. 14, the semiconductor region 311 is disposed in the vicinity of the front surface of the semiconductor substrate 2, and the front surface of the semiconductor region 311 constitutes a part of the front surface of the semiconductor substrate 2. Each of the plurality of photoelectric conversion units 320-1 to 320-4 is an embedded unit and has a semiconductor region 321. As indicated by a dotted line in FIG. 14, the semiconductor region 321 is disposed at a position deeper than the front surface of the semiconductor substrate 2 and is disposed at a position deeper than the semiconductor region 311. When viewed in the light incident direction, the semiconductor region 311 may be included inside the semiconductor region 321.

The plurality of photoelectric conversion units 310-1 to 310-4 respectively correspond to the plurality of photoelectric conversion units 320-1 to 320-4. The optical axis of each photoelectric conversion unit 310 intersects the corresponding photoelectric conversion unit 320. The optical axis of each photoelectric conversion unit 320 intersects the corresponding photoelectric conversion unit 310. With this configuration, when a plurality of photoelectric conversion units 310 and 320 for different uses are disposed in the pixel region PR, it is possible to easily obtain the light receiving area of each of the photoelectric conversion units 310 and 320.

The plurality of transfer units 330-1 to 330-4 correspond to the plurality of photoelectric conversion units 320-1 to 320-4, respectively. In plan view, a transfer gate 331 of each transfer unit 330 is disposed at a position adjacent to the semiconductor region 321. The semiconductor region 41 of the charge-to-voltage converter 40 is disposed on the opposite side of the semiconductor region 321 across the transfer gate 331.

The transfer unit 330 functions as, for example, a transfer transistor TR30 (refer to FIG. 2), and includes a semiconductor region 321 as a source, a transfer gate 331 as a gate, and a semiconductor region 41 as a drain. That is, the semiconductor region 41 of the charge-to-voltage converter 40 is shared by the plurality of transfer units 330-1 to 330-4, and is shared by the plurality of photoelectric conversion units 320-1 to 320-4 via the transfer unit 330. That is, the charge-to-voltage converter 40 is provided to be shared by the plurality of photoelectric conversion units 320-1 to 320-4.

Figure 15:
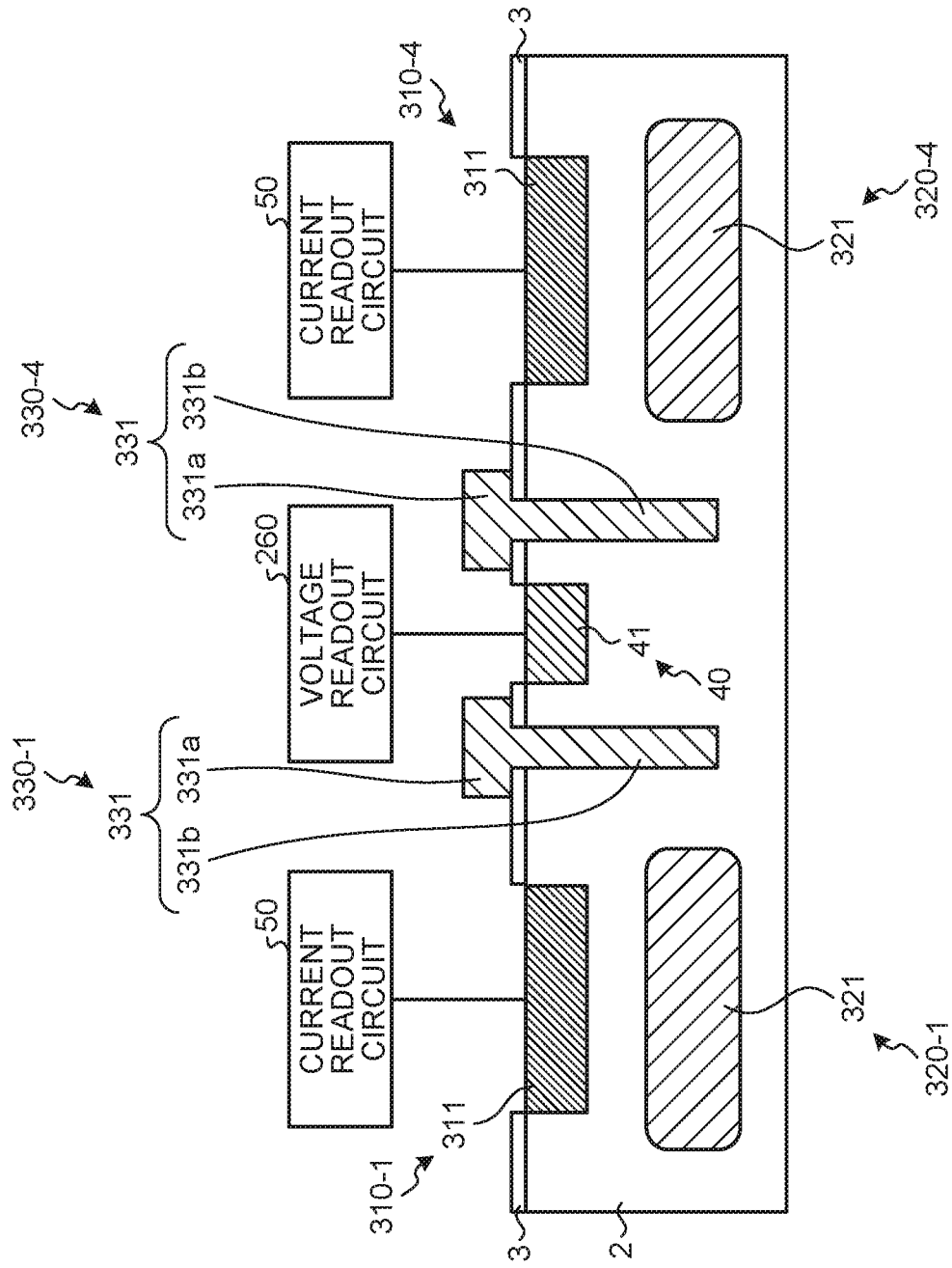
FIG. 15 is a cross-sectional view illustrating a configuration of the solid-state imaging device according to the third embodiment of the present disclosure.

As illustrated in FIG. 15, the transfer gate 331 of each transfer unit 330 may be formed into a vertical shape. FIG. 15 is a cross-sectional view illustrating a configuration of the solid-state imaging device according to the third embodiment of the present disclosure, illustrating a cross section of FIG. 14 taken along line B-B. The transfer gate 331 has a vertical shape extending in the depth direction into the substrate. The transfer gate 331 includes: a flat portion 331a that covers the front surface of the semiconductor substrate 2 via the gate insulating film 3; and a trench portion 331b that penetrates the gate insulating film 3 from the flat portion 331a and extends deeper than the semiconductor region 311 in the depth direction within the semiconductor substrate 2 to the vicinity of the depth of the semiconductor region 321. The transfer gate 331 may be formed of polysilicon containing impurities or may be formed of metal such as tungsten. When an active level control signal is supplied to the transfer gate 331, the transfer unit 330 transfers the charge accumulated in the semiconductor region 321 of the corresponding photoelectric conversion unit 320 to the semiconductor region 41.

At this time, as illustrated in FIG. 14, the connection form between the photoelectric conversion unit 310 and the current readout circuit 50 is different from the connection form between the photoelectric conversion unit 320 and the voltage readout circuit 260. The plurality of photoelectric conversion units 310-1 to 310-4 correspond to the plurality of current readout circuits 50. Each photoelectric conversion unit 310 is directly connected to the corresponding current readout circuit 50. The plurality of photoelectric conversion units 320 is connected to the voltage readout circuit 260 used in common via the corresponding transfer unit 330 and the charge-to-voltage converter 40 used in common.

As described above, in the third embodiment, each pixel region PR of the solid-state imaging device 301 has a configuration in which the plurality of photoelectric conversion units 310-1 to 310-4 are disposed to overlap the plurality of photoelectric conversion units 320-1 to 320-4 in the light incident direction. With this configuration, it is possible to easily obtain the light receiving area of each of the photoelectric conversion units 310 and 320, and possible to easily obtain the aperture ratio of each of the photoelectric conversion units 310 and 320.

4. Fourth Embodiment

Next, a solid-state imaging device according to a fourth embodiment will be described. Hereinafter, differences from the first to third embodiments will be mainly described.

Although the third embodiment has described an exemplary configuration in which a plurality of photoelectric conversion units for DVS is arranged in the pixel region PR, the fourth embodiment describes an exemplary configuration in which a plurality of photoelectric conversion units for DVS is integrated in the pixel region PR, as compared with the configuration of the third embodiment. This can improve the sensitivity of the photoelectric conversion unit for DVS.

Figure 16:
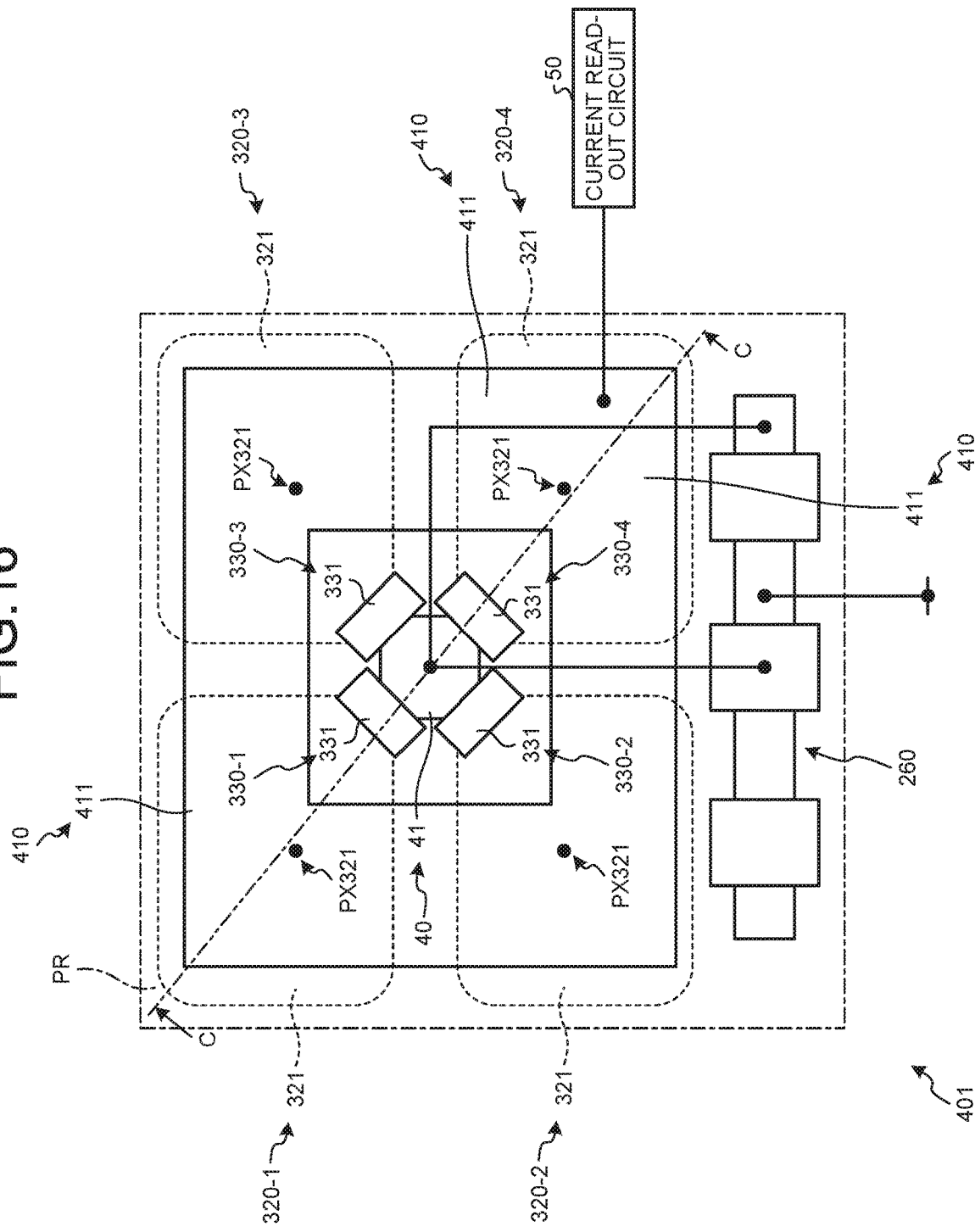
FIG. 16 is a plan view illustrating a configuration of a solid-state imaging device according to a fourth embodiment of the present disclosure.

Specifically, as illustrated in FIG. 16, a pixel region PR of a solid-state imaging device 401 includes a photoelectric conversion unit 410 instead of the plurality of photoelectric conversion units 310-1 to 310-4 (refer to FIG. 14). FIG. 16 is a plan view illustrating a configuration of the solid-state imaging device 401 according to the fourth embodiment of the present disclosure.

The photoelectric conversion unit 410, which corresponds to a photoelectric conversion unit obtained by integrating the plurality of photoelectric conversion units 310-1 to 310-4, has a semiconductor region 411. In plan view, the semiconductor region 411 extends in a donut shape at positions corresponding to the plurality of photoelectric conversion units 320-1 to 320-4. The semiconductor region 411 surrounds the plurality of transfer units 330-1 to 330-4 and the charge-to-voltage converter 40. The configuration of FIG. 16 can be considered to have the plurality of photoelectric conversion units 310 in the configuration of FIG. 14 which have been integrated to surround the plurality of transfer units 330-1 to 330-4 and the charge-to-voltage converter 40.

As indicated by a solid line in FIG. 16, the semiconductor region 411 is disposed in the vicinity of the front surface of the semiconductor substrate 2, and the front surface of the semiconductor region 411 constitutes a part of the front surface of the semiconductor substrate 2. When viewed in the light incident direction, the semiconductor region 411 overlaps main portions of the semiconductor regions 321 of the plurality of photoelectric conversion units 320-1 to 320-4. An optical axis PX321 of each of the photoelectric conversion units 320-1 to 320-4 intersects the photoelectric conversion unit 410. With this configuration, the photoelectric conversion unit 410 can obtain a large light receiving area and improve its sensitivity. The plurality of photoelectric conversion units 320-1 to 320-4, provided in sufficient numbers, is capable of improving the resolution, and the light receiving area of each of the photoelectric conversion units 320 can be obtained by sharing the charge-to-voltage converter 40. That is, when the photoelectric conversion units 410 and the plurality of photoelectric conversion units 320 for different uses are each arranged in the pixel region PR, the light receiving area of each photoelectric conversion unit 410 and 320 can be obtained for each of the uses.

As illustrated in FIG. 17, the transfer gate 331 of each transfer unit 330 may have a vertical shape, similarly to the third embodiment. FIG. 17 is a cross-sectional view illustrating a configuration of the solid-state imaging device according to the fourth embodiment of the present disclosure, illustrating a cross section of FIG. 16 taken along line C-C. The transfer gate 331 has a vertical shape extending in the depth direction into the substrate. When an active level control signal is supplied to the transfer gate 331, the transfer unit 330 transfers the charge accumulated in the semiconductor region 321 of the corresponding photoelectric conversion unit 320 to the semiconductor region 41.

At this time, as illustrated in FIG. 16, the connection form between the photoelectric conversion unit 410 and the current readout circuit 50 is different from the connection form between the photoelectric conversion unit 320 and the voltage readout circuit 260. The photoelectric conversion unit 410 is directly connected to the current readout circuit 50. The plurality of photoelectric conversion units 320 is connected to the voltage readout circuit 260 used in common via the corresponding transfer unit 330 and the charge-to-voltage converter 40 used in common.

As described above, in the fourth embodiment, each pixel region PR of the solid-state imaging device 1 has a configuration in which the photoelectric conversion unit 410 and the plurality of photoelectric conversion units 320-1 to 320-4 are disposed to overlap each other in the light incident direction. With this configuration, it is possible to easily obtain the light receiving area of each of the photoelectric conversion units 410 and 320, and possible to easily obtain the aperture ratio of each of the photoelectric conversion units 410 and 320.

4.1 First Modification of Fourth Embodiment

Furthermore, as illustrated in FIG. 18, the pixel region PR of the solid-state imaging device 401 may be isolated from another pixel region PR via an insulating isolator DI. The insulating isolator DI may be formed of a material containing an insulator as a main component, such as silicon oxide. FIG. 18 is a plan view illustrating a configuration of a solid-state imaging device 401 according to first modification of the fourth embodiment of the present disclosure, illustrating an example of one pixel region PR. The insulating isolator DI illustrated in FIG. 18 extends along the outer edge of the pixel region PR and surrounds the pixel region PR. When the pixel region PR has a rectangular shape in plan view, the insulating isolator DI surrounds the pixel region PR in a rectangular shape.

Figure 19A:
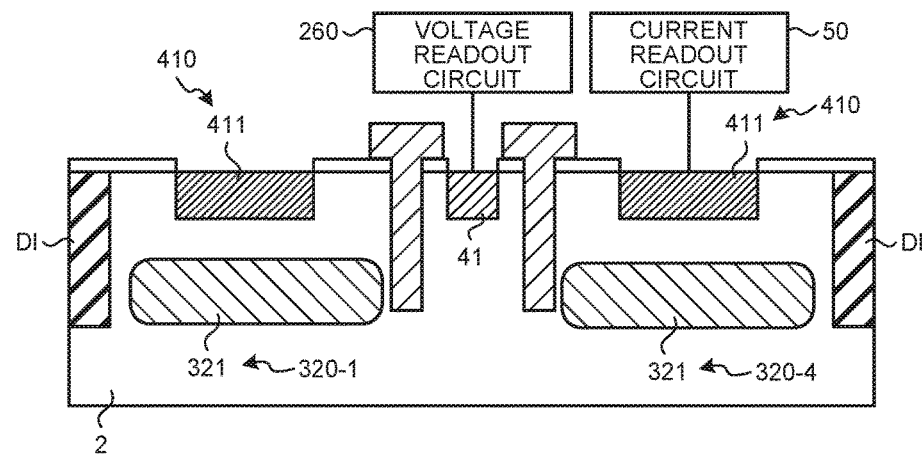
FIGS. 19A, 19B, and 19C are cross-sectional views illustrating a configuration of the solid-state imaging device according to the first modification of the fourth embodiment of the present disclosure.
Figure 19B:
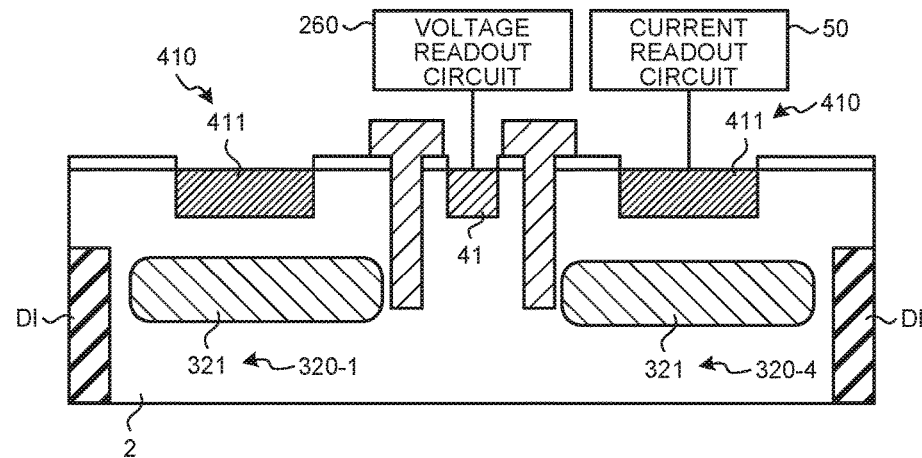
Figure 19C:
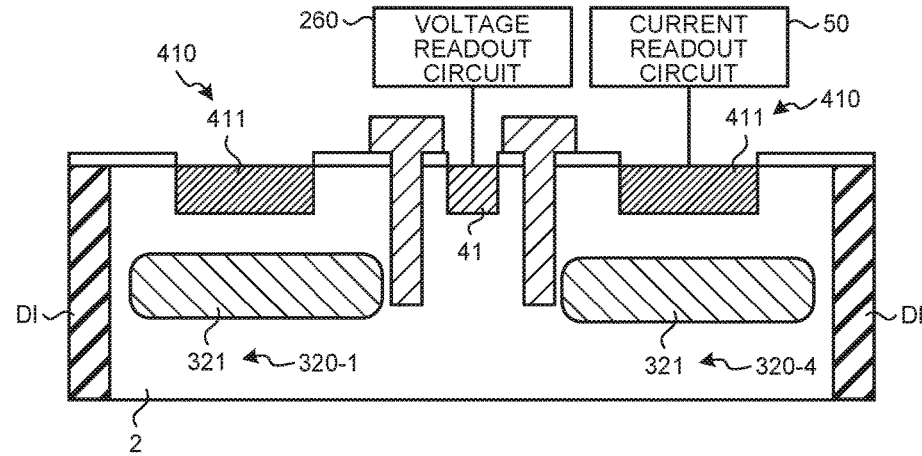

The insulating isolator DI may be implemented as DTI as illustrated in FIG. 19A. FIGS. 19A, 19B, and 19C are cross-sectional views illustrating a configuration of the solid-state imaging device 401 according to the first modification of the fourth embodiment of the present disclosure, and FIG. 19A illustrates a cross section of FIG. 18 taken along line D-D. That is, the insulating isolator DI may extend from the front surface of the semiconductor substrate 2 to a depth corresponding to the depth of the semiconductor region 321 in the depth direction. This makes it possible to suppress the leakage of the charge accumulated in the semiconductor region 21 to the adjacent pixel region PR and suppress color mixing between the adjacent pixel regions PR.

Alternatively, the insulating isolator DI may be implemented as RDTI as illustrated in FIG. 19B. That is, the insulating isolator DI may extend from a depth shallower than the semiconductor region 21 to the back surface of the semiconductor substrate 2 in the depth direction. This also makes it possible to suppress the leakage of the charge accumulated in the semiconductor region 21 to the adjacent pixel region PR and suppress color mixing between the adjacent pixel regions PR.

Alternatively, the insulating isolator DI may be implemented as FDTI as illustrated in FIG. 19C. That is, the insulating isolator DI may extend from the front surface of the semiconductor substrate 2 to the back surface of the semiconductor substrate 2 in the depth direction. This also makes it possible to suppress the leakage of the charge accumulated in the semiconductor region 21 to the adjacent pixel region PR and suppress color mixing between the adjacent pixel regions PR.

FIG. 20 illustrates planar configurations of the plurality of pixel regions PR illustrated in FIG. 18. FIG. 20 is a plan view illustrating a configuration of the solid-state imaging device 401 according to first modification of the fourth embodiment of the present disclosure, illustrating an example of a plurality of pixel regions PR. The insulating isolator DI extends in a lattice shape in plan view and partitions the plurality of pixel regions PR. At this time, the point that the photoelectric conversion unit 410 the plurality of photoelectric conversion units 320 are disposed to overlap each other in the light incident direction in each pixel region PR is similar to the second embodiment. With this configuration, it is possible to easily obtain the light receiving area of each photoelectric conversion unit 410 and 320 and possible to suppress color mixing between the adjacent pixel regions PR.

4.2 Second Modification of Fourth Embodiment

Figure 21A:
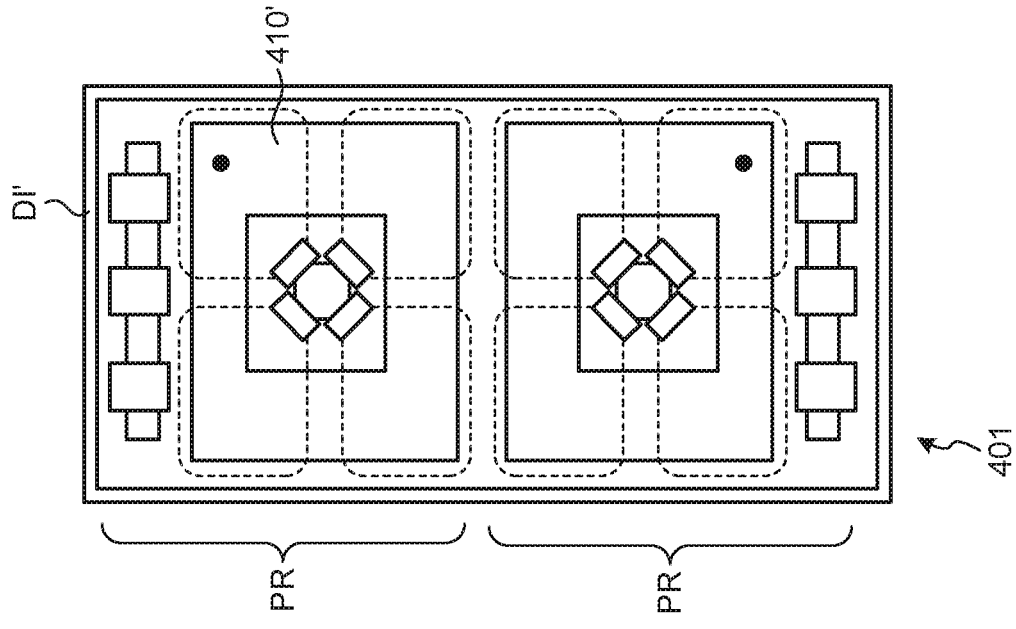
FIGS. 21A and 21B are plan views illustrating a configuration of a solid-state imaging device according to a second modification of the fourth embodiment of the present disclosure.
Figure 21B:
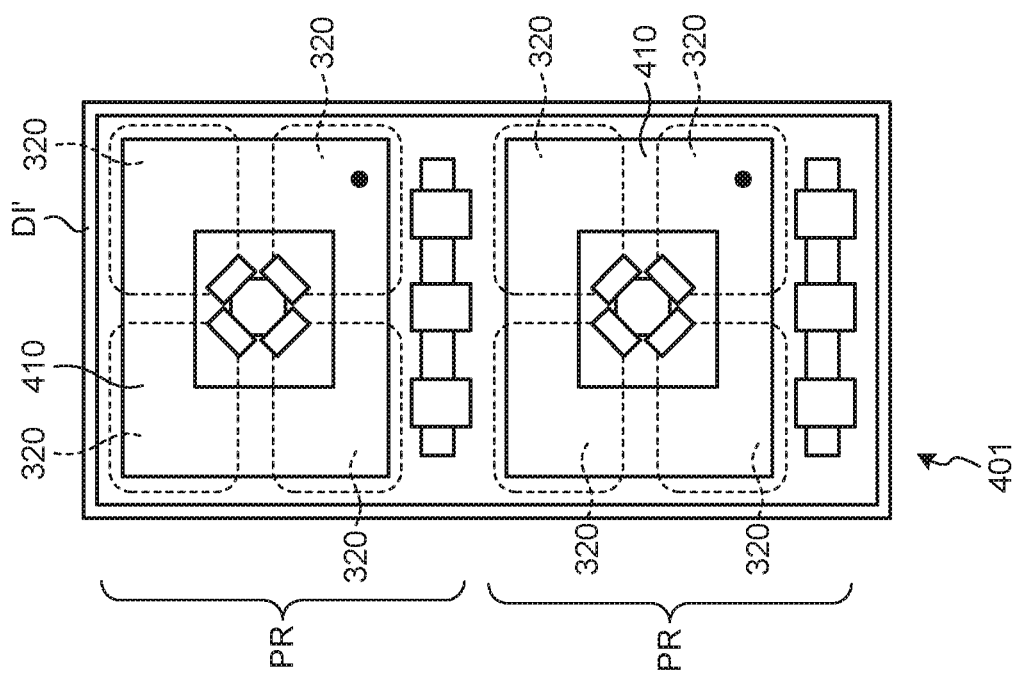

There may be an alternative configuration, as illustrated in FIGS. 21A and 21B, in which an insulating isolator DI' is used for element isolation in units of a plurality of pixel regions PR (for example, in units of two pixel regions). FIGS. 21A and 21B are plan views illustrating configurations of a solid-state imaging device 401 according to a second modification of the fourth embodiment of the present disclosure. In the configuration of FIG. 21A, a portion dividing the two pixel regions PR in the insulating isolator DI is removed from the configuration of FIG. 20. This makes it possible, in each pixel region PR, to easily obtain the light receiving area of each of the photoelectric conversion units 410 and 320. Furthermore, in the configuration of FIG. 21B, the photoelectric conversion unit 410' is an integrated unit for the two pixel regions PR, compared to the configuration of FIG. 20. This makes it possible to further increase the light receiving area of the photoelectric conversion unit 410' to improve the sensitivity in the portion.

4.3 Third Modification of Fourth Embodiment

Furthermore, in the pixel region PR of the solid-state imaging device 401, as illustrated in FIG. 22, the plurality of photoelectric conversion units 320 in the pixel region PR may be further separated via an insulating isolator DI2. The insulating isolator DI2 may be formed of a material containing an insulator as a main component such as silicon oxide. FIG. 22 is a plan view illustrating a configuration of a solid-state imaging device 401 according to a third modification of the fourth embodiment of the present disclosure, illustrating an example of one pixel region PR. As indicated by a dotted line in FIG. 22, the insulating isolator DI2 extends, in the pixel region PR, between the plurality of photoelectric conversion units 320-1 to 320-4 while passing through a position deeper than the charge-to-voltage converter 40. When the plurality of photoelectric conversion units 320-1 to 320-4 are arranged in a matrix in the pixel region PR in plan view, the insulating isolator DI2 extends between the plurality of photoelectric conversion units 320-1 to 320-4 in a substantially cross shape.

Figure 23A:
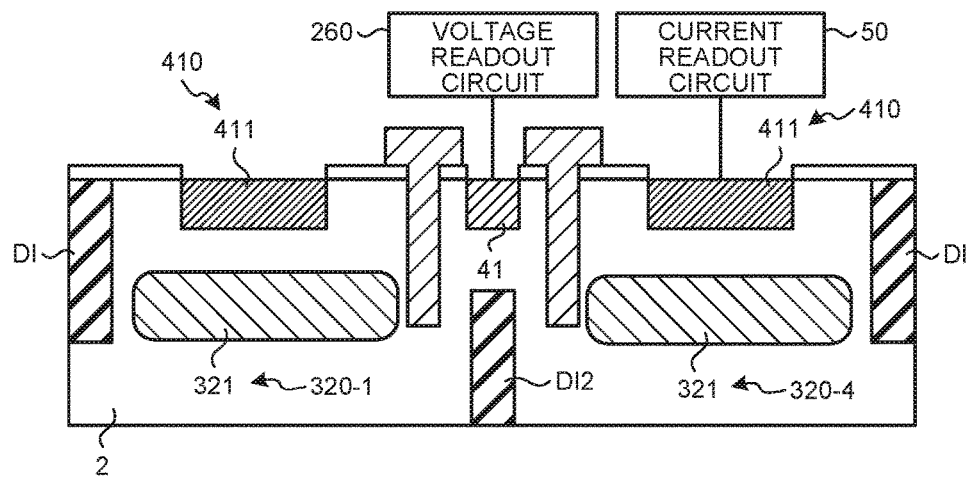
FIGS. 23A, 23B, and 23C are cross-sectional views illustrating a configuration of the solid-state imaging device according to the third modification of the fourth embodiment of the present disclosure.
Figure 23B:
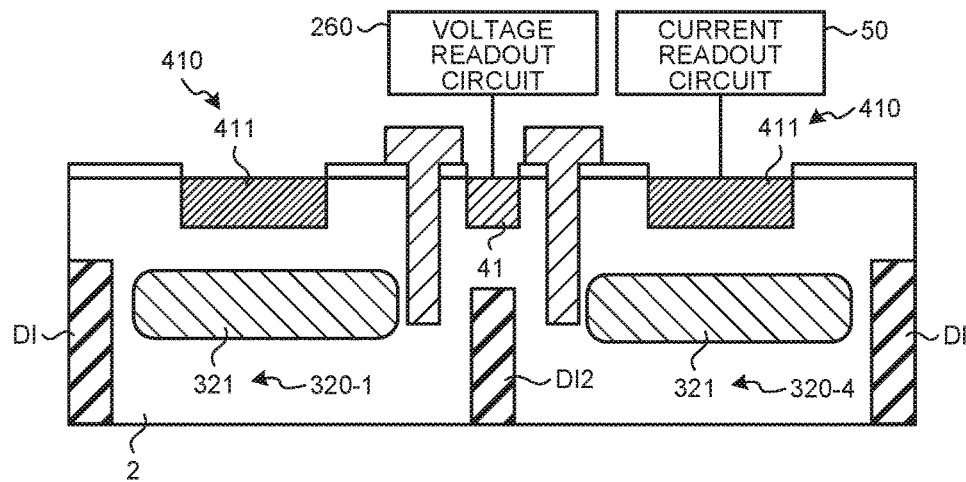
Figure 23C:
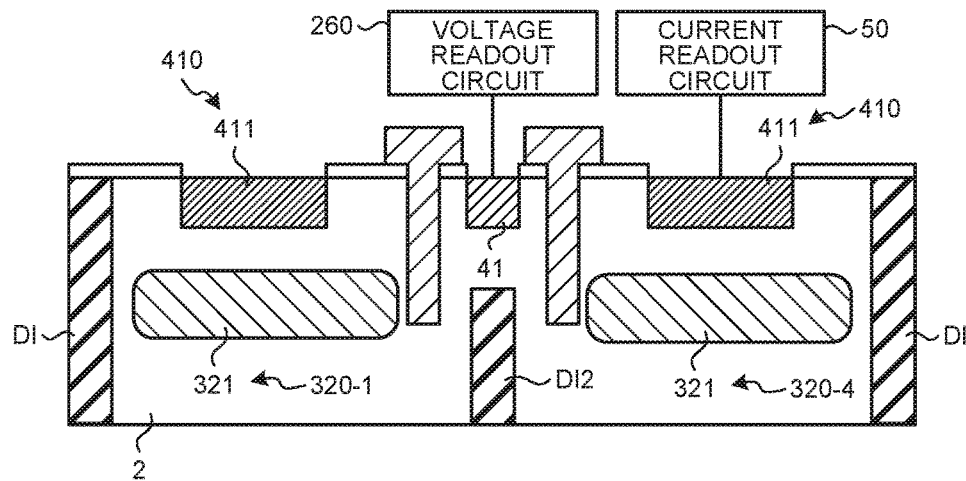

At this time, as illustrated in FIGS. 23A, 23B, and 23C, the insulating isolator DI2 may be implemented as RDTI. In addition, the insulating isolator DI may be implemented as DTI illustrated in FIG. 23A, as RDTI illustrated in FIG. 23B, or as FDTI illustrated in FIG. 23C. FIGS. 23A, 23B, and 23C are cross-sectional views illustrating a configuration of the solid-state imaging device 401 according to the second modification of the fourth embodiment of the present disclosure, illustrating a cross section of FIG. 22 taken along line E-E. The insulating isolator DI2 is disposed between the semiconductor regions 321 of the plurality of photoelectric conversion units 320 in the planar direction while being separated from the semiconductor region 41 of the charge-to-voltage converter 40 in the depth direction. This makes it possible to suppress leakage of the charge accumulated in the semiconductor region 321 to the adjacent semiconductor region 321 in the pixel region PR, leading to suppression of color mixing between the adjacent semiconductor regions 321 in the pixel region PR.

4.4 Fourth Modification of Fourth Embodiment

Figure 24:
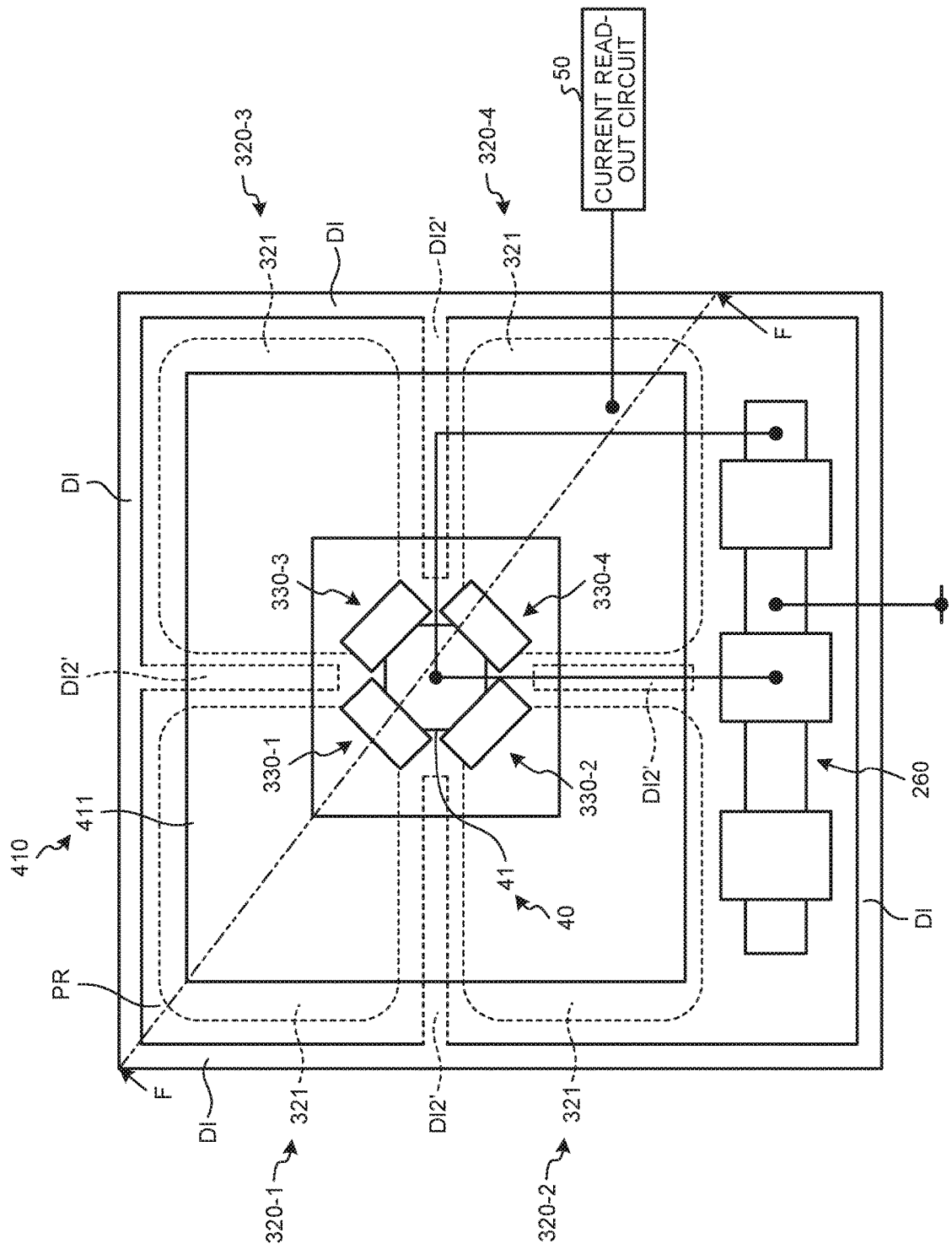
FIG. 24 is a plan view illustrating a configuration of a solid-state imaging device according to a fourth modification of the fourth embodiment of the present disclosure.

Alternatively, as illustrated in FIG. 24, the pixel region PR of the solid-state imaging device 401 may have a configuration in which an insulating isolator DI2' that isolates between the plurality of photoelectric conversion units 320 in the pixel region PR is arranged avoiding the charge-to-voltage converter 40. The insulating isolator DI2' may be formed of a material containing an insulator such as silicon oxide as a main component. FIG. 24 is a plan view illustrating a configuration of a solid-state imaging device 401 according to a fourth modification of the fourth embodiment of the present disclosure, illustrating an example of one pixel region PR. As indicated by a dotted line in FIG. 24, the insulating isolator DI2' extends, in the pixel region PR, between the plurality of photoelectric conversion units 320-1 to 320-4 while avoiding the planar position of the semiconductor region 41 of the charge-to-voltage converter 40. In plan view, the insulating isolator DI2' has a shape obtained by removing a portion in the vicinity of the semiconductor region 41 from the insulating isolator DI2 having a substantially cross shape illustrated in FIG. 22.

Figure 25A:
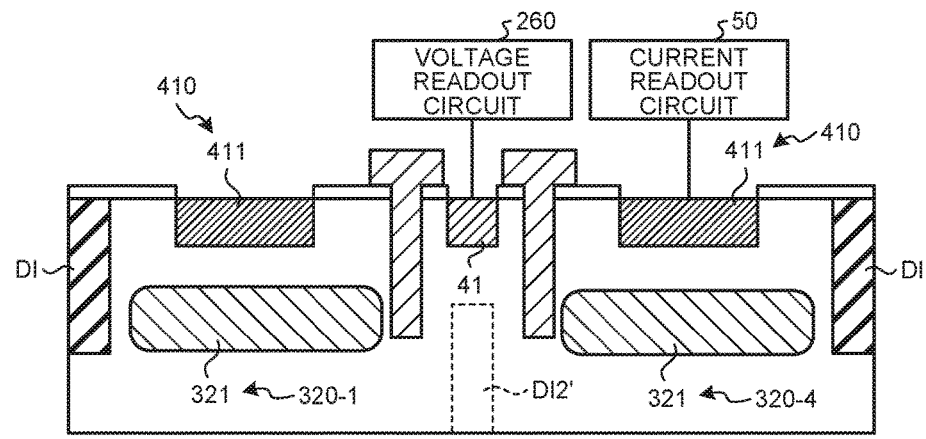
FIGS. 25A, 25B, and 25C are cross-sectional views illustrating a configuration of the solid-state imaging device according to the fourth modification of the fourth embodiment of the present disclosure.
Figure 25B:
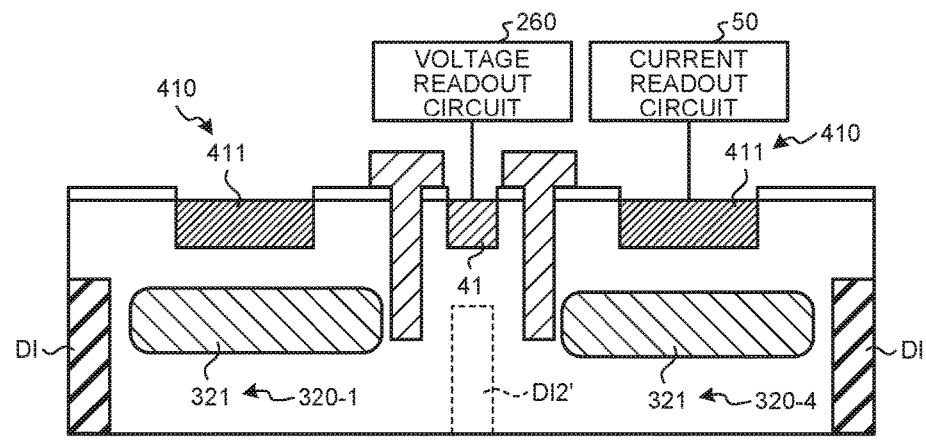
Figure 25C:
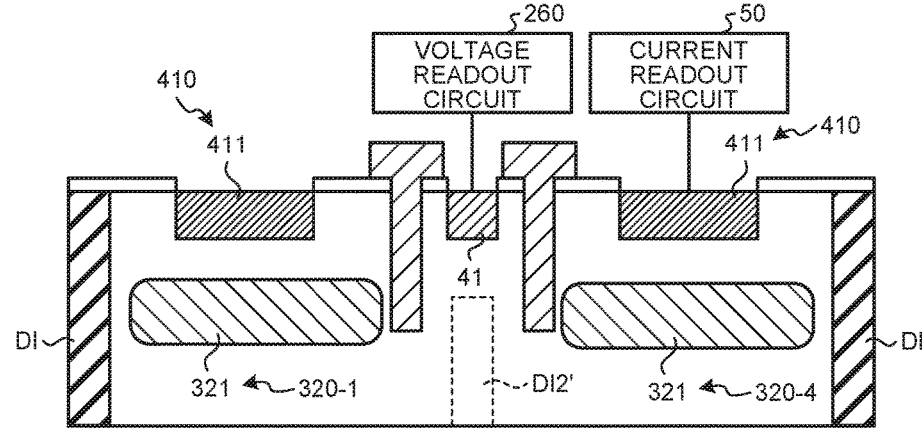

At this time, as indicated by dotted lines in FIGS. 25A, 25B, and 25C, the insulating isolator DI2' may be implemented as RDTI while being separated from the semiconductor region 41 of the charge-to-voltage converter 40 in the depth direction and the planar direction. In addition, the insulating isolator DI may be implemented as DTI illustrated in FIG. 25A, as RDTI illustrated in FIG. 25B, or as FDTI illustrated in FIG. 25C. FIGS. 25A, 25B, and 25C are cross-sectional views illustrating a configuration of the solid-state imaging device 401 according to the fourth modification of the fourth embodiment of the present disclosure, illustrating a cross section of FIG. 24 taken along line F-F. The insulating isolator DI2' is disposed between the semiconductor regions 321 of the plurality of photoelectric conversion units 320 in the planar direction while being separated from the semiconductor region 41 of the charge-to-voltage converter 40 in the depth direction and the planar direction. This also makes it possible to suppress leakage of the charge accumulated in the semiconductor region 321 to the adjacent semiconductor region 321 in the pixel region PR, leading to suppression of color mixing between the adjacent semiconductor regions 321 in the pixel region PR.

5. Fifth Embodiment

Next, a solid-state imaging device according to a fifth embodiment will be described. Hereinafter, differences from the first to fourth embodiments will be mainly described.

Although the third embodiment has described an exemplary configuration in which a plurality of photoelectric conversion units for DVS is arranged in the pixel region PR, the fifth embodiment describes an exemplary configuration in which a plurality of photoelectric conversion units for DVS is integrated across a plurality of pixel regions PR, as compared to the configuration of the third embodiment. This can improve the sensitivity of the photoelectric conversion unit for DVS.

Figure 26:
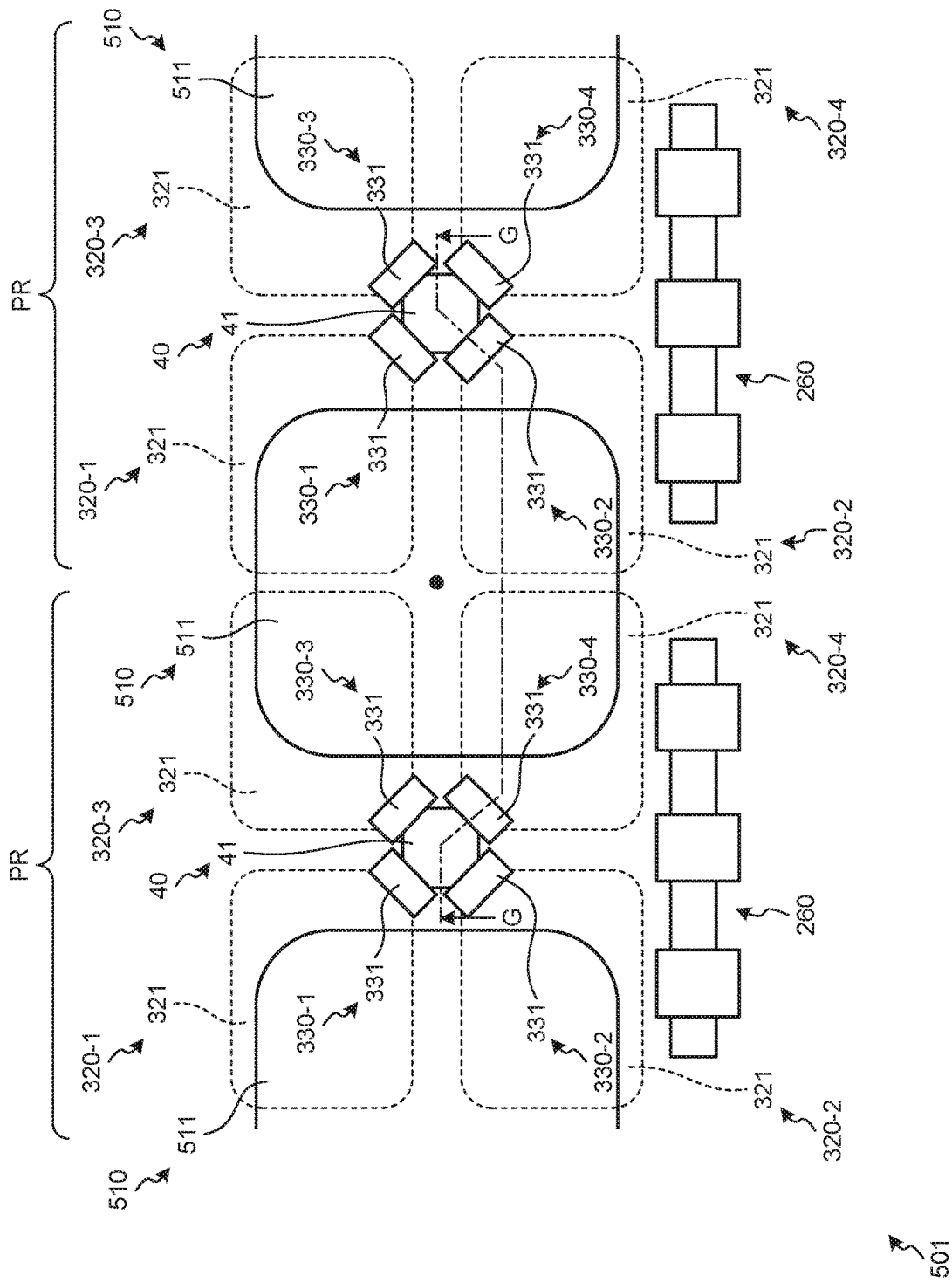
FIG. 26 is a plan view illustrating a configuration of a solid-state imaging device according to a fifth embodiment of the present disclosure.

Specifically, as illustrated in FIG. 26, two pixel regions PR adjacent to each other in a solid-state imaging device 501 include a photoelectric conversion unit 510 instead of the photoelectric conversion units 310-3 and 310-4 of one pixel region PR and the photoelectric conversion units 310-1 and 310-2 (refer to FIG. 14) of the other pixel region PR. FIG. 26 is a plan view illustrating a configuration of the solid-state imaging device 501 according to the fifth embodiment of the present disclosure, illustrating an exemplary configuration of two pixel regions PR.

The photoelectric conversion unit 510 corresponds to a photoelectric conversion unit integrating the photoelectric conversion units 310-3 and 310-4 of one pixel region PR and the photoelectric conversion units 310-1 and 310-2 (refer to FIG. 14) of the other pixel region PR, out of the two adjacent pixel regions PR, and has a semiconductor region 511. In plan view, the semiconductor region 511 extends in a substantially rectangular shape at positions corresponding to the photoelectric conversion units 320-3 and 320-4 of one pixel region PR and the photoelectric conversion units 320-1 and 320-2 of the other pixel region PR, out of the two adjacent pixel regions PR. The semiconductor region 511 is arranged between the plurality of transfer units 330 and the charge-to-voltage converter 40 in one pixel region PR of the two adjacent pixel regions PR and the plurality of transfer units 330 and the charge-to-voltage converter 40 in the other pixel region PR. The configuration of FIG. 26 can be considered to have integrated the plurality of photoelectric conversion units 310, in the configuration of FIG. 14, arranged between the plurality of charge-to-voltage converters 40.

As indicated by a solid line in FIG. 26, the semiconductor region 511 is disposed in the vicinity of the front surface of the semiconductor substrate 2, and the front surface of the semiconductor region 511 constitutes a part of the front surface of the semiconductor substrate 2. When viewed in the light incident direction, the semiconductor region 511 overlaps main portions of the semiconductor regions 321 of the plurality of photoelectric conversion units 320-1 to 320-4. An optical axis of each of the photoelectric conversion units 320-1 to 320-4 intersects the photoelectric conversion unit 510. With this configuration, the photoelectric conversion unit 510 can obtain a large light receiving area and improve its sensitivity. The plurality of photoelectric conversion units 320-1 to 320-4, provided in sufficient numbers, is capable of improving the resolution, and the light receiving area of each of the photoelectric conversion units 320 can be obtained by sharing the charge-to-voltage converter 40. That is, when the photoelectric conversion units 510 and the plurality of photoelectric conversion units 320 for different uses are each arranged in the pixel region PR, the light receiving area of each photoelectric conversion unit 510 and 320 can be obtained for each of the uses.

Figure 27:
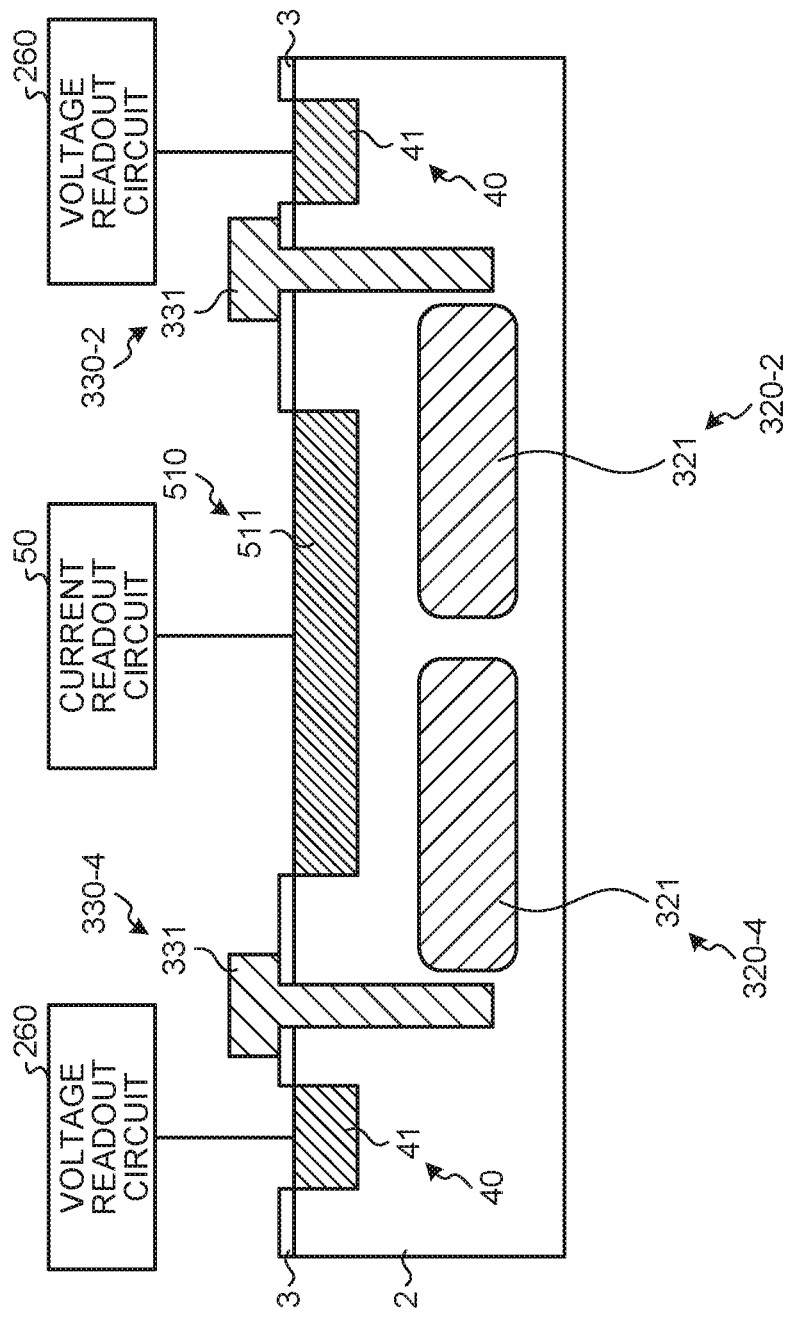
FIG. 27 is a cross-sectional view illustrating a configuration of the solid-state imaging device according to the fifth embodiment of the present disclosure.

As illustrated in FIG. 27, the transfer gate 331 of each transfer unit 330 may have a vertical shape, similarly to the third embodiment. FIG. 27 is a cross-sectional view illustrating a configuration of the solid-state imaging device according to the fifth embodiment of the present disclosure, illustrating a cross section of FIG. 26 taken along line G-G. The transfer gate 331 has a vertical shape extending in the depth direction into the substrate. When an active level control signal is supplied to the transfer gate 331, the transfer unit 330 transfers the charge accumulated in the semiconductor region 321 of the corresponding photoelectric conversion unit 320 to the semiconductor region 41.

At this time, as illustrated in FIGS. 26 and 27, the connection form between the photoelectric conversion unit 410 and the current readout circuit 50 is different from the connection form between the photoelectric conversion unit 320 and the voltage readout circuit 260. The photoelectric conversion unit 510 is directly connected to the current readout circuit 50. The plurality of photoelectric conversion units 320 is connected to the voltage readout circuit 260 used in common via the corresponding transfer unit 330 and the charge-to-voltage converter 40 used in common.

As described above, in the fifth embodiment, each pixel region PR of the solid-state imaging device 501 has a configuration in which the photoelectric conversion unit 510 and the plurality of photoelectric conversion units 320-1 to 320-4 are disposed to overlap each other in the light incident direction. With this configuration, it is possible to easily obtain the light receiving area of each of the photoelectric conversion units 510 and 320, and possible to easily obtain the aperture ratio of each of the photoelectric conversion units 510 and 320.

5.1 First Modification of Fifth Embodiment

Figure 28:
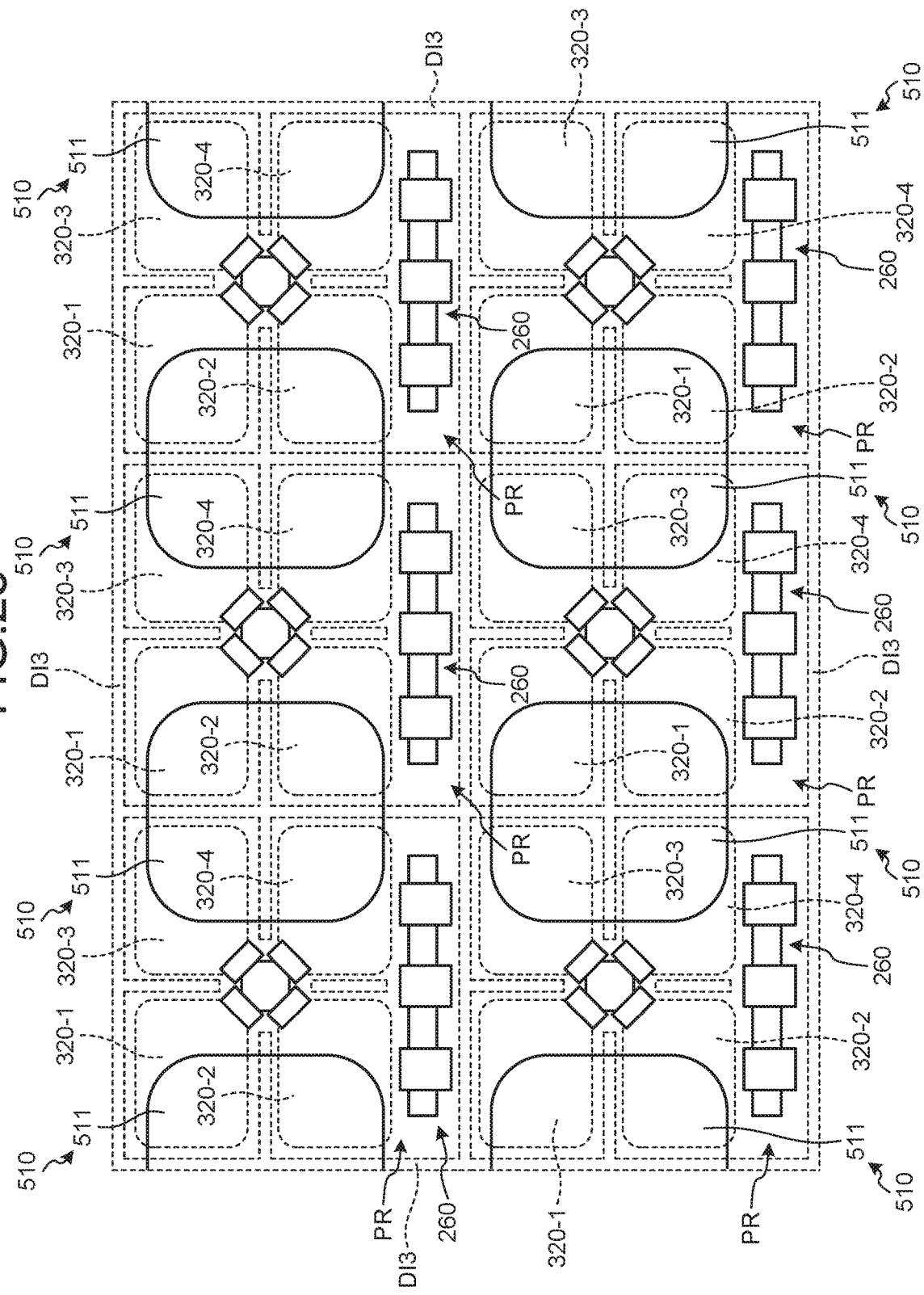
FIG. 28 is a plan view illustrating a configuration of a solid-state imaging device according to a first modification of the fifth embodiment of the present disclosure.

Furthermore, as illustrated in FIG. 28, the pixel region PR of the solid-state imaging device 501 may be isolated from another pixel region PR via an insulating isolator DI3. The insulating isolator DI3 may be formed of a material containing an insulator as a main component such as silicon oxide. FIG. 28 is a plan view illustrating a configuration of the solid-state imaging device 501 according to a first modification of the fifth embodiment of the present disclosure, illustrating an example of a plurality of pixel regions PR. As indicated by a dotted line in FIG. 28, the insulating isolator DI3 can be implemented as RDTI. The insulating isolator DI3, extending in a lattice shape in plan view, defines the plurality of pixel regions PR, and extends in a substantially cross shape between the plurality of photoelectric conversion units 320 in each pixel region PR. This configuration makes it possible to suppress color mixing between the adjacent pixel regions PR, and possible to suppress color mixing between the plurality of photoelectric conversion units 320 in each pixel region PR.

5.2 Second Modification of Fifth Embodiment

Figure 29:
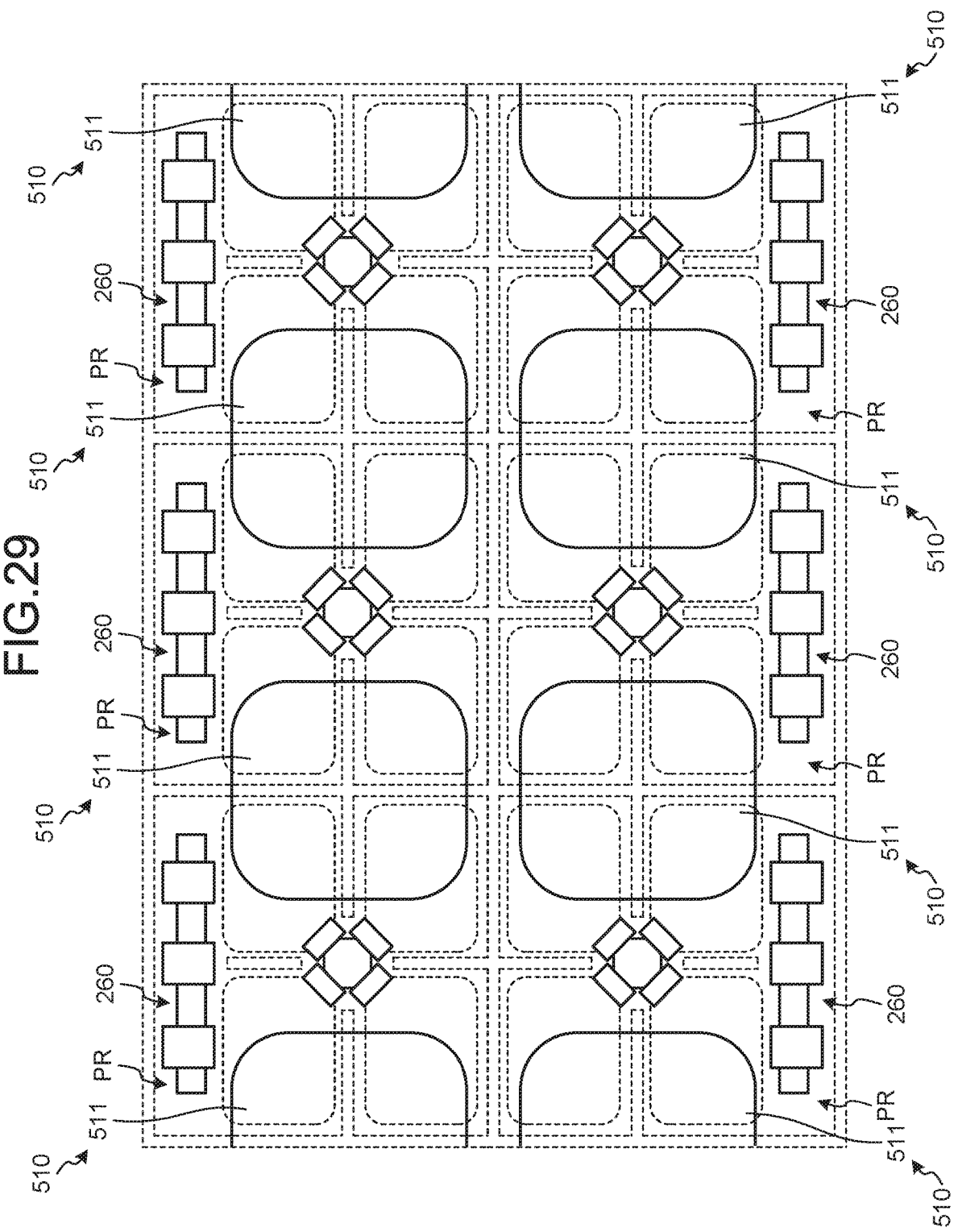
FIG. 29 is a plan view illustrating a configuration of a solid-state imaging device according to a second modification of the fifth embodiment of the present disclosure.

Alternatively, as illustrated in FIG. 29, the layout of the solid-state imaging device 501 may be changed so that the distance between the plurality of photoelectric conversion units 510 becomes shorter as compared to the configuration of FIG. 28. FIG. 29 is a plan view illustrating a configuration of the solid-state imaging device 501 according to a second modification of the fifth embodiment of the present disclosure, illustrating an example of a plurality of pixel regions PR. The element groups of the voltage readout circuit 260 are arranged at positions far from each other between the pixel regions RP adjacent in a direction different from the direction across which the photoelectric conversion unit 510 extends. With this configuration, as compared with the configuration illustrated in FIG. 28, it is possible to reduce the distance between the semiconductor regions 511 of the plurality of photoelectric conversion units 510 in the direction (vertical direction in FIG. 29), which is different from the direction across which the photoelectric conversion units 510 extend.

5.3 Third Modification of Fifth Embodiment

Figure 30:
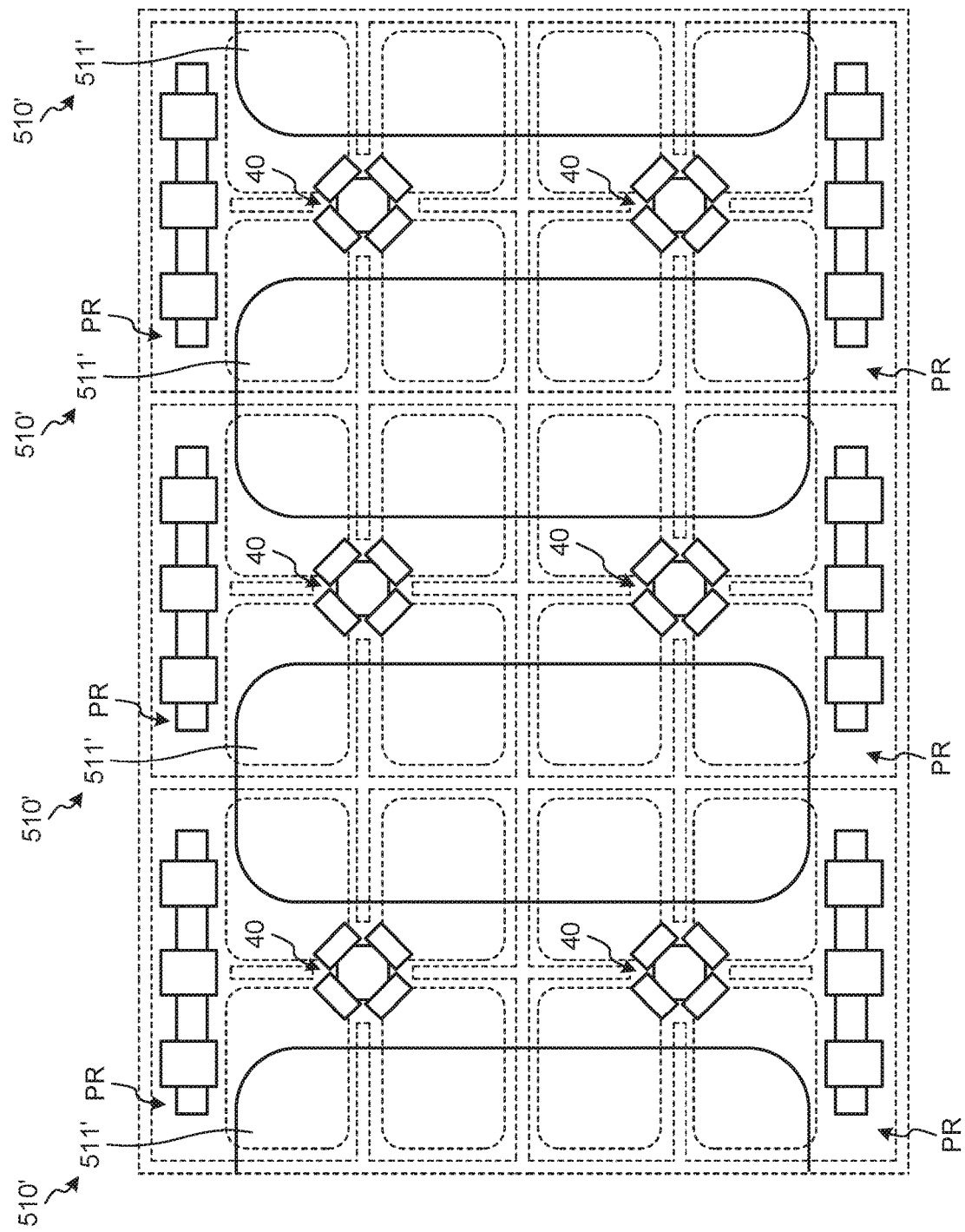
FIG. 30 is a plan view illustrating a configuration of a solid-state imaging device according to a third modification of the fifth embodiment of the present disclosure.

Alternatively, as illustrated in FIG. 30, the solid-state imaging device 501 may have a configuration in which the plurality of photoelectric conversion units 510 having a reduced distance are integrated to each other, as compared to the configuration of FIG. 29. FIG. 30 is a plan view illustrating a configuration of the solid-state imaging device 501 according to a third modification of the fifth embodiment of the present disclosure, illustrating an example of a plurality of pixel regions PR. A photoelectric conversion unit 510' illustrated in FIG. 30 is obtained by integrating the two photoelectric conversion units 510 arranged in the direction in which the distance is reduced in FIG. 29 (vertical direction in FIG. 29). A semiconductor region 511' of each photoelectric conversion unit 510' has a substantially I shape extending in the vertical direction at a position between the plurality of charge-to-voltage converters 40 in plan view. This makes it possible obtain a large light receiving area of the semiconductor region 511' of the photoelectric conversion unit 510', leading to improvement in sensitivity of the photoelectric conversion unit 510'.

5.4 Fourth Modification of Fifth Embodiment

Figure 31:
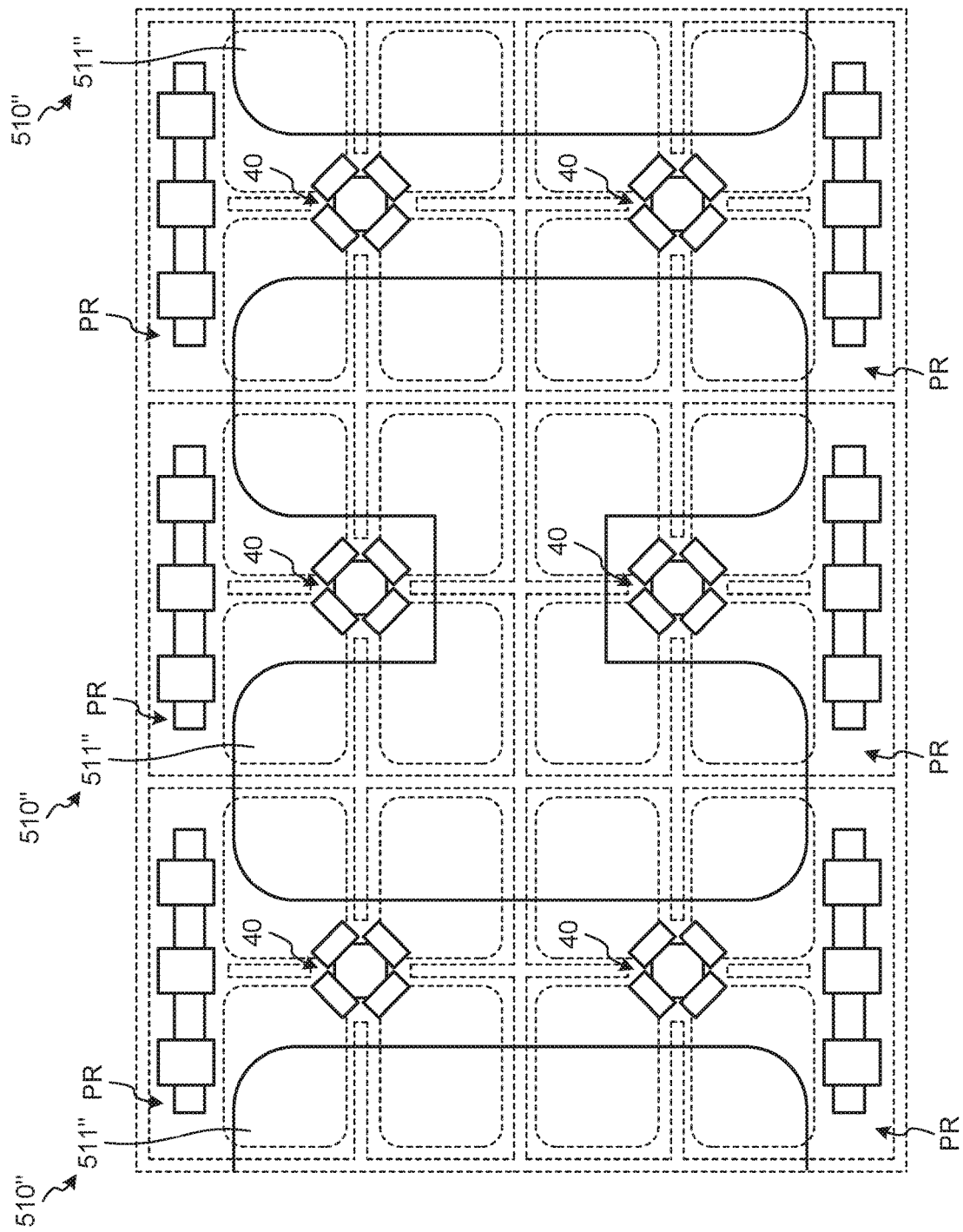
FIG. 31 is a plan view illustrating a configuration of a solid-state imaging device according to a fourth modification of the fifth embodiment of the present disclosure.

Alternatively, as illustrated in FIG. 31, the solid-state imaging device 501 may have a configuration in which the plurality of integrated photoelectric conversion units 510' are further integrated to each other, as compared to the configuration of FIG. 30. FIG. 31 is a plan view illustrating a configuration of the solid-state imaging device 501 according to a fourth modification of the fifth embodiment of the present disclosure, illustrating an example of a plurality of pixel regions PR. A photoelectric conversion unit 510" illustrated in FIG. 31 is obtained by integrating two photoelectric conversion units 510' arranged in a direction (lateral direction in FIG. 31) different from the direction of integration in FIG. 30. A semiconductor region 511" of the photoelectric conversion unit 510" has a substantially H shape extending between the plurality of charge-to-voltage converters 40 in plan view. This makes it possible obtain a larger light receiving area of the semiconductor region 511" of the photoelectric conversion unit 510", leading to further improvement in sensitivity of the photoelectric conversion unit 510".

6. Sixth Embodiment

Next, a solid-state imaging device according to a sixth embodiment will be described. Hereinafter, differences from the first to fifth embodiments will be mainly described.

Although there is no description regarding on-chip lens in the first to fifth embodiments, the sixth embodiment describes an exemplary configuration in which an on-chip lens is provided corresponding to the photoelectric conversion unit 320 for imaging.

Figure 32:
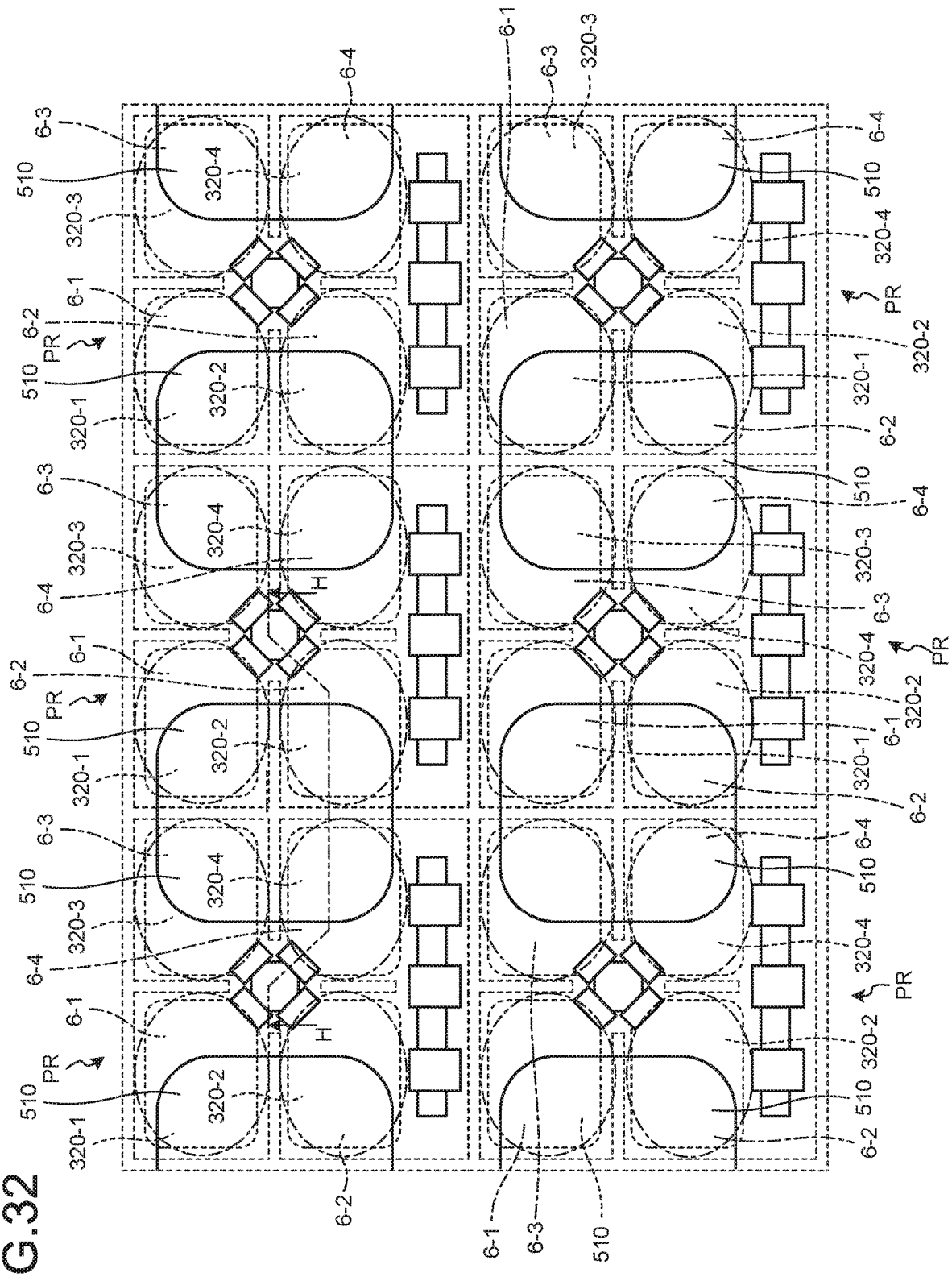
FIG. 32 is a plan view illustrating a configuration of a solid-state imaging device according to a sixth embodiment of the present disclosure.
Figure 33:
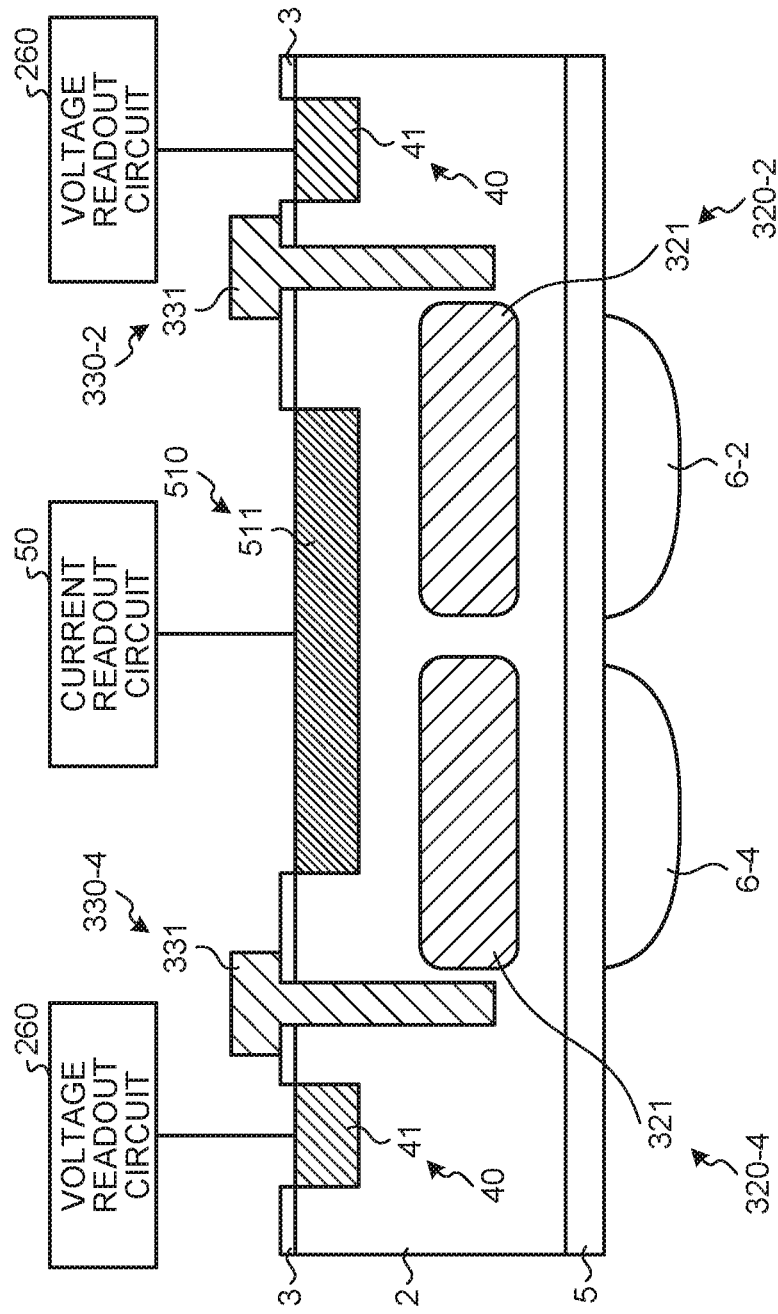
FIG. 33 is a cross-sectional view illustrating a configuration of the solid-state imaging device according to the sixth embodiment of the present disclosure.

Specifically, each pixel region PR of the solid-state imaging device 501 includes a plurality of on-chip lenses 6-1 to 6-4 as indicated by a one-dot chain line in FIG. 32. FIG. 32 is a plan view illustrating a configuration of a solid-state imaging device 501 according to the sixth embodiment of the present disclosure. The plurality of on-chip lenses 6-1 to 6-4 correspond to the plurality of photoelectric conversion units 320-1 to 310-4. As illustrated in FIG. 33, each on-chip lens 6 is disposed in the light incident direction for the corresponding photoelectric conversion unit 320. FIG. 33 is a cross-sectional view illustrating a configuration of the solid-state imaging device 501 according to the sixth embodiment of the present disclosure. For example, the on-chip lens 6-4 is disposed at a position corresponding to the photoelectric conversion unit 320-4 on the back surface of an insulating film 5 covering the back surface of the semiconductor substrate 2. The on-chip lens 6-2 is disposed at a position corresponding to the photoelectric conversion unit 320-2 on the back surface of the insulating film 5.

In FIG. 32, the six pixel regions PR include substantially six photoelectric conversion units 510; 6×4 photoelectric conversion units 320 overlapping the photoelectric conversion units 510 in units of four; and 6×4 on-chip lenses 6 disposed corresponding to the photoelectric conversion units 320 in the light incident direction of the photoelectric conversion units 320.

That is, in the solid-state imaging device 501, the number of on-chip lenses 6 is the same as the number of photoelectric conversion units 320 for imaging. This makes it possible for the plurality of photoelectric conversion units 320 in each pixel region PR to easily capture a high resolution image.

Note that FIG. 33 illustrates an exemplary case where the solid-state imaging device 501 is a back side illumination device, in which the on-chip lens 6 is disposed on the back surface side with respect to the corresponding photoelectric conversion unit 320. In a case where the solid-state imaging device 501 is the front side illumination device, the on-chip lens 6 is disposed on the front surface side with respect to the corresponding photoelectric conversion unit 320, that is, above the semiconductor substrate 2.

6.1 First Modification of Sixth Embodiment

Figure 34:
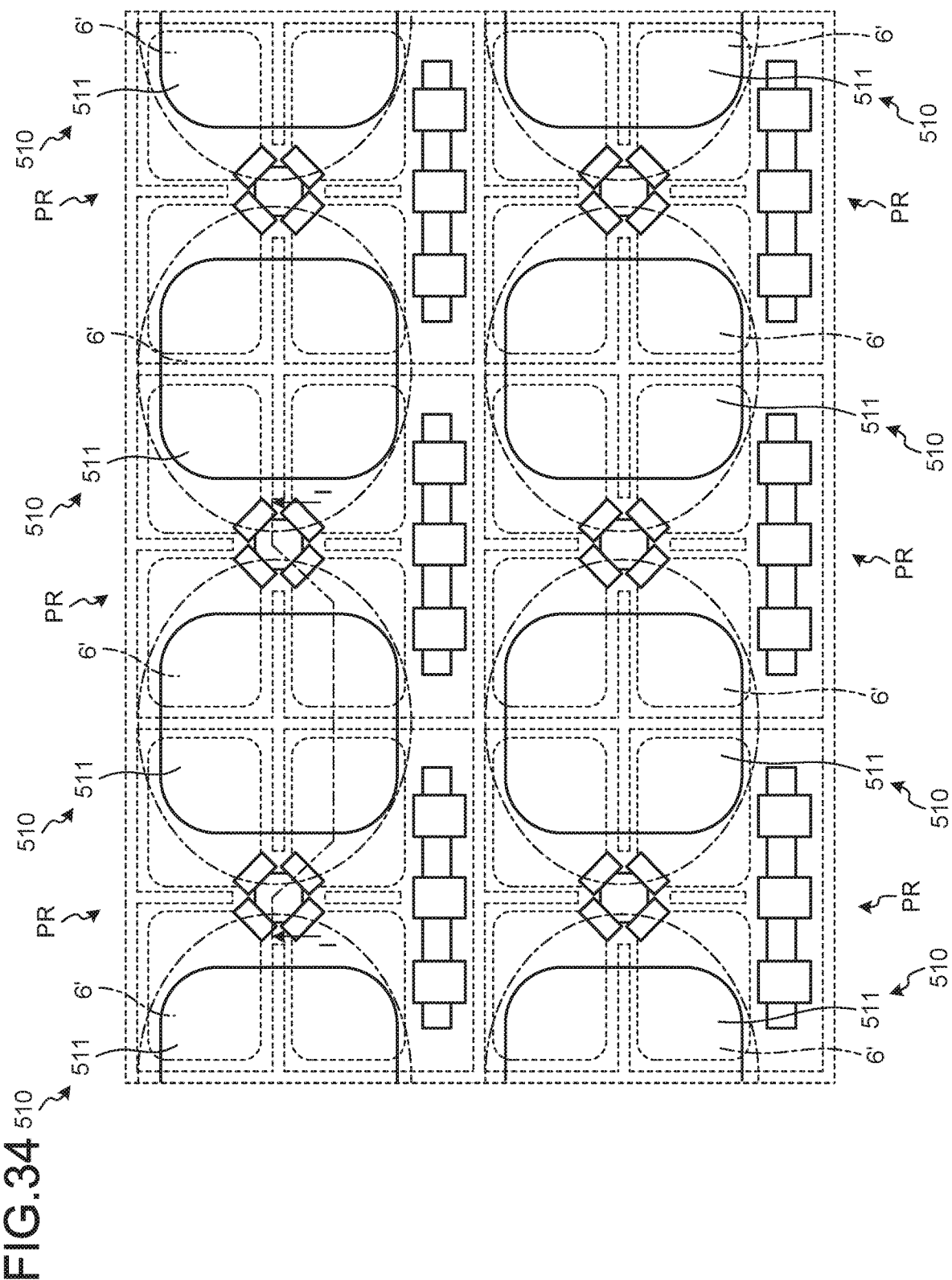
FIG. 34 is a plan view illustrating a configuration of a solid-state imaging device according to a first modification of the sixth embodiment of the present disclosure.
Figure 35:
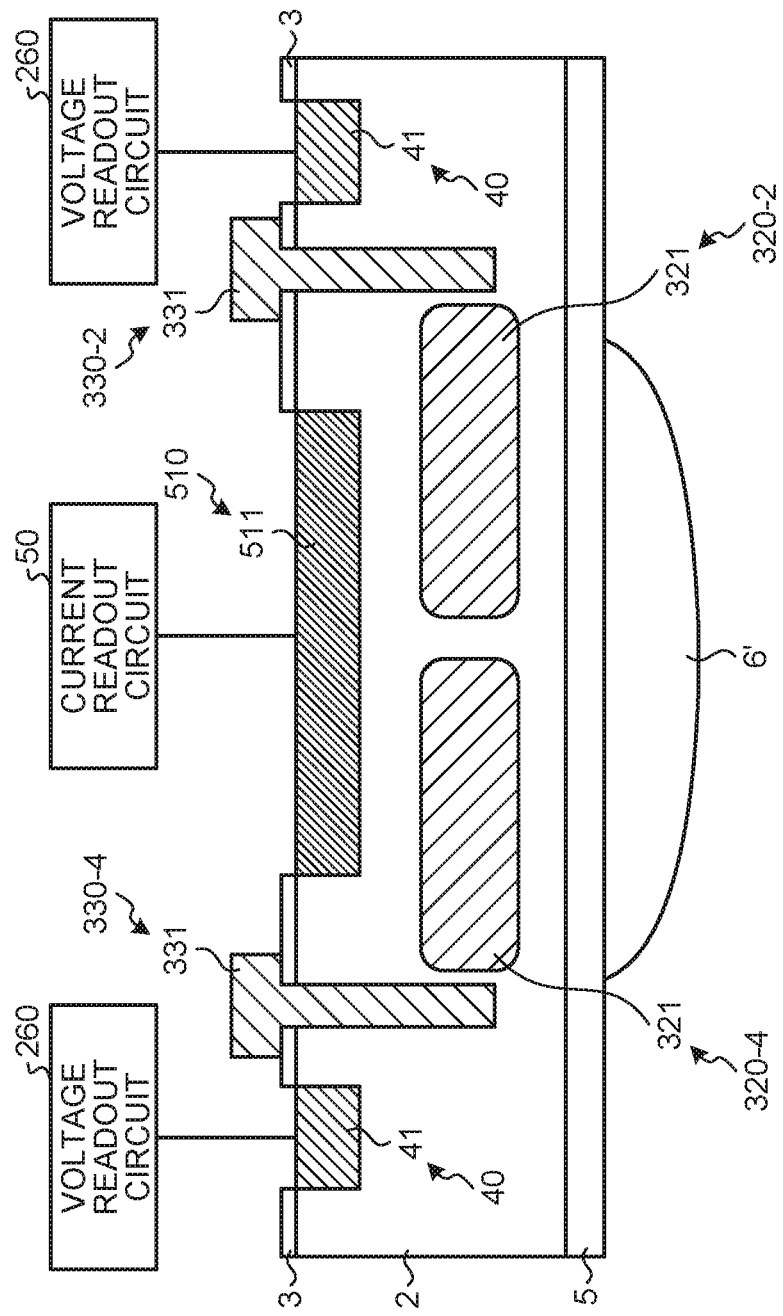
FIG. 35 is a cross-sectional view illustrating a configuration of the solid-state imaging device according to the first modification of the sixth embodiment of the present disclosure.

Furthermore, it is allowable to have an on-chip lens 6' corresponding to the photoelectric conversion unit 510 for DVS as indicated by a one-dot chain line in FIG. 34. FIG. 34 is a plan view illustrating a configuration of a solid-state imaging device 501 according to a first modification of the sixth embodiment of the present disclosure. As illustrated in FIG. 35, each on-chip lens 6' is disposed in the light incident direction for the corresponding photoelectric conversion unit 510. FIG. 35 is a cross-sectional view illustrating a configuration of the solid-state imaging device 501 according to a sixth embodiment of the present disclosure. For example, the on-chip lens 6' is disposed on the back surface of the insulating film 5 covering the back surface of the semiconductor substrate 2, at a position corresponding to the photoelectric conversion unit 510.

In FIG. 34, the six pixel regions PR include substantially six photoelectric conversion units 510; 6×4 photoelectric conversion units 320 overlapping the photoelectric conversion units 510 in units of four; and substantially six on-chip lenses 6' disposed corresponding to the photoelectric conversion units 510 in the light incident direction of the photoelectric conversion units 510.

That is, the solid-state imaging device 501 includes the on-chip lenses 6' of the number same as the number of photoelectric conversion units 510 for DVS. This makes it possible for each photoelectric conversion unit 510 to easily improve the sensitivity.

At this time, as illustrated in FIG. 34, the plurality of photoelectric conversion units 320-1 to 310-4 overlapping the on-chip lens 6' captures pupil-divided images. This makes it possible to detect the parallax of the plurality of images obtained by reading out the pixel signals from the plurality of photoelectric conversion units 320-1 to 310-4 by the voltage readout circuit 260, achieving measurement of the distance to the subject based on the parallax of the plurality of images. At this time, the voltage readout circuit 260 operates as a parallax detection circuit that detects parallax of a plurality of images, and as a distance measurement circuit that measures a distance to a subject. Furthermore, the pixel signals of the plurality of photoelectric conversion units 320-1 to 310-4 overlapping the on-chip lens 6' may be added by the charge-to-voltage converter 40 and read by the voltage readout circuit 260, for example, so as to obtain a signal corresponding to a gradation value. At this time, the voltage readout circuit 260 operates as a gradation converting circuit that converts a pixel signal into a gradation value.

Note that FIG. 35 illustrates an exemplary case where the solid-state imaging device 501 is a back side illumination device, in which the on-chip lens 6' is disposed on the back surface side with respect to the corresponding photoelectric conversion unit 510. In a case where the solid-state imaging device 501 is the front side illumination device, the on-chip lens 6' is disposed on the front surface side with respect to the corresponding photoelectric conversion unit 510, that is, above the semiconductor substrate 2.

7. Seventh Embodiment

Next, a solid-state imaging device according to a seventh embodiment will be described. Hereinafter, differences from the first to sixth embodiments will be mainly described.

Although the first to sixth embodiments have described exemplary configurations in which the photoelectric conversion units and the readout circuits thereof having different uses are mounted on one semiconductor chip, the seventh embodiment describes an exemplary configuration in which these configurations are mounted in a distributed manner on a plurality of chips.

Figure 36:
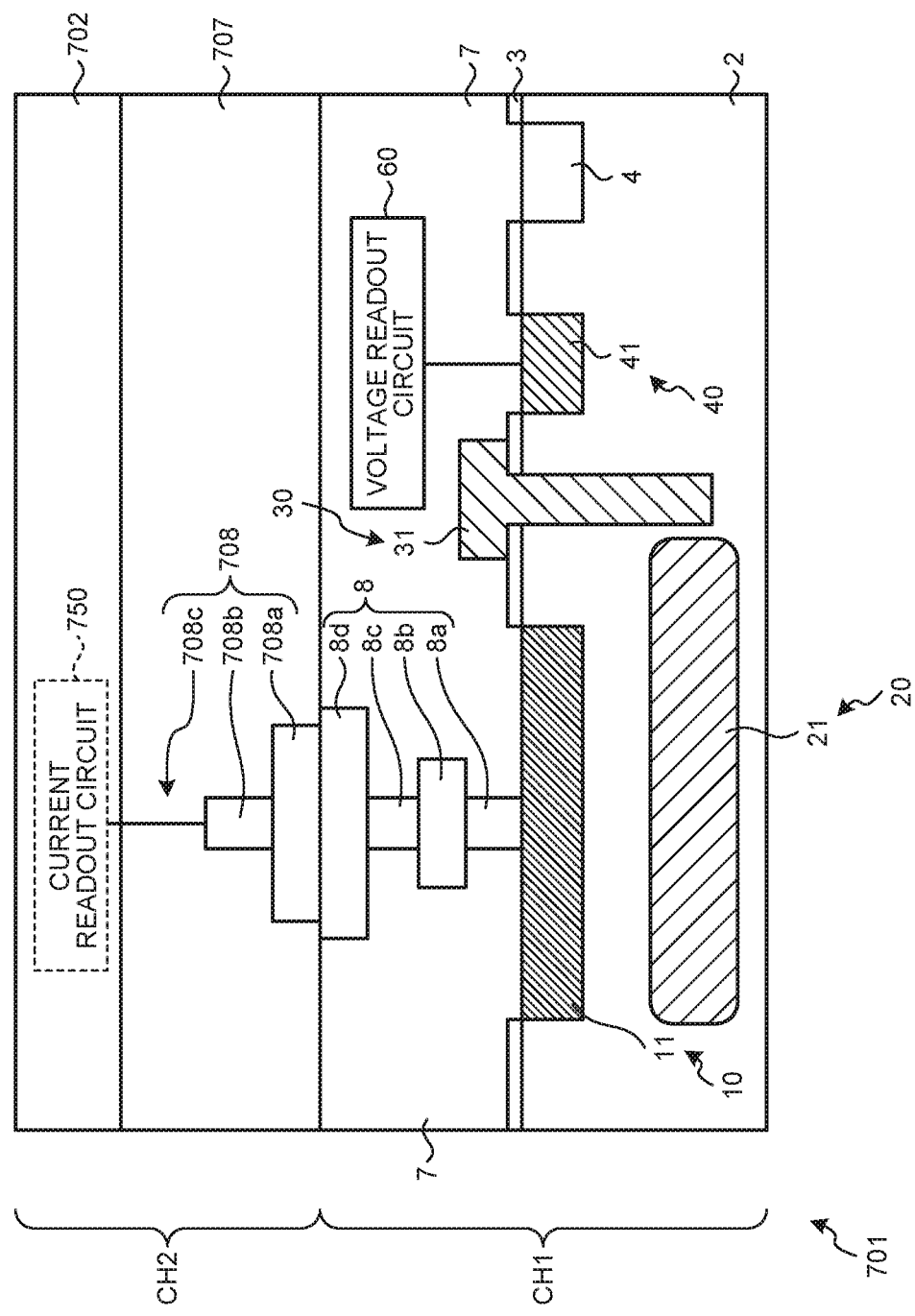
FIG. 36 is a cross-sectional view illustrating a configuration of a solid-state imaging device according to a seventh embodiment of the present disclosure.

Specifically, as illustrated in FIG. 36, there is provided a solid-state imaging device 701 obtained by bonding a chip CH1 and a chip CH2 to each other. FIG. 36 is a cross-sectional view illustrating a configuration of the solid-state imaging device 701 according to the seventh embodiment of the present disclosure. A plurality of photoelectric conversion units 10 and 20 and the voltage readout circuit 60 for different uses are disposed on the chip CH1, while a current readout circuit 750 is disposed on the chip CH2.

A pixel region PR of the chip CH1 includes a photoelectric conversion unit 10, a photoelectric conversion unit 20, a transfer unit 30, and a charge-to-voltage converter 40. The point that the plurality of photoelectric conversion units 10 and 20 are disposed to overlap each other in the light incident direction is similar to the first embodiment.

The photoelectric conversion unit 10 is connected to the current readout circuit 750 via a wiring line 8 and a wiring line 708. The wiring line 8 penetrates an interlayer insulating film 7 of the chip CH1 from the photoelectric conversion unit 10 so as to be electrically connected to the wiring line 708. The wiring line 8 includes a plug 8a, a conductive film 8b, a plug 8c, and a conductive film 8d, which are sequentially stacked on the semiconductor region 11 of the photoelectric conversion unit 10. The wiring line 708 penetrates an interlayer insulating film 707 of the chip CH2 from the wiring line 8 so as to be electrically connected to the current readout circuit 750. The wiring line 708 includes a conductive film 708a, a plug 708b, and a line 708c sequentially stacked on the conductive film 8d. The conductive film 8d and the wiring line 708 are bonded to each other. When the conductive film 8d and the wiring line 708 are each formed of a material containing copper as a main component, the bonding of the conductive film 8d and the wiring line 708 may be referred to as Cu—Cu bonding.

At this time, a connection form between the photoelectric conversion unit 10 and the current readout circuit 750 is different from a connection form between the photoelectric conversion unit 20 and the voltage readout circuit 60. The photoelectric conversion unit 10 is connected to the current readout circuit 50 via the connection wiring lines 8 and 708 between the chips. The photoelectric conversion unit 20 is connected to the voltage readout circuit 60 via the transfer unit 30 and the charge-to-voltage converter 40. This makes it possible to easily obtain the circuit area of the current readout circuit 750 while suppressing an increase in planar dimensions of the chips CH1 and CH2. In addition, the current readout circuit 750 can be disposed above the photoelectric conversion unit 10, making possible to reduce the parasitic capacitance in the connection. Note that the current readout circuit 750 may be disposed to be shifted in the planar direction from above the photoelectric conversion unit 10 depending on capacitance adjustment or a connection pitch.

As described above, in the seventh embodiment, each pixel region PR of the solid-state imaging device 701 has a configuration in which the photoelectric conversion unit 10 and the photoelectric conversion unit 20 are disposed to overlap each other in the light incident direction. With this configuration, it is possible to easily obtain the light receiving area of each of the photoelectric conversion units 10 and 20, and possible to easily obtain the aperture ratio of each of the photoelectric conversion units 10 and 20.

Incidentally, the connection between the wiring line 8 and the wiring line 708 may be implemented not only by the bonding of conductive films such as Cu—Cu bonding, but also by through silicon via (TSV) connection, microbump connection, or the like.

In addition, it is also allowable to further dispose the voltage readout circuit 60 on the chip CH2 so as to connect the charge-to-voltage converter 40 to the voltage readout circuit 60 via a connection wiring line similar to the connection wiring lines 8 and 708 between the chips. Alternatively, the charge-to-voltage converter 40 may be connected to the chip CH2 via a source follower circuit or the like in the chip CH1, or may be connected to the chip CH2 after extension of a vertical (or horizontal) readout line to a pixel peripheral portion in the chip CH1.

7.1 First Modification of Seventh Embodiment

Figure 37:
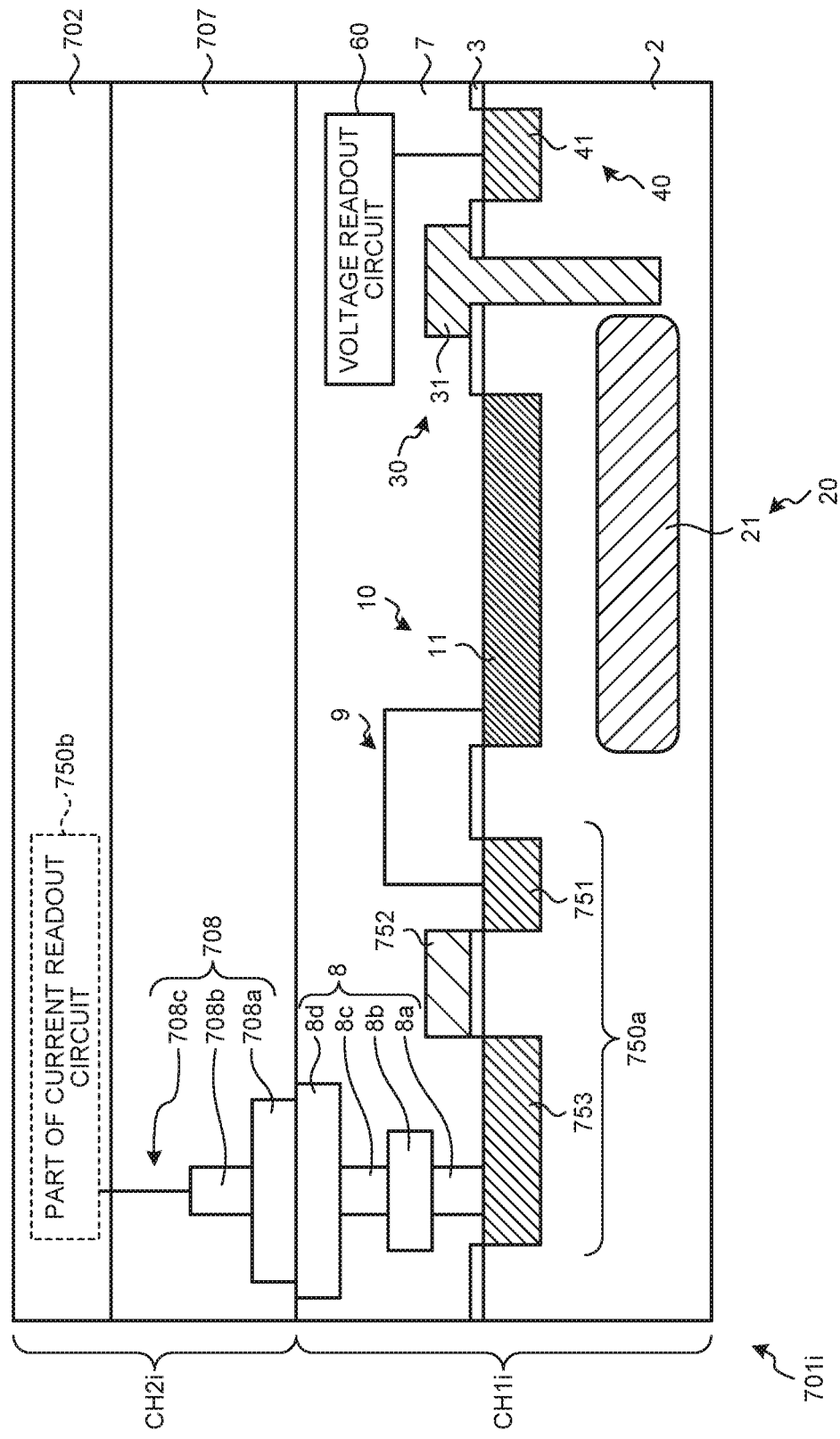
FIG. 37 is a cross-sectional view illustrating a configuration of the solid-state imaging device according to a first modification of the seventh embodiment of the present disclosure.

Alternatively, it is allowable to have a solid-state imaging device 701i, as illustrated in FIG. 37, in which the current readout circuit 750 is divided into one part 750a and the other part 750b, with the one part 750a disposed on the chip CH1 and the other part 750b disposed on the chip CH2, the one part 750a and the other part 750b being connected via the connection wiring line 8 and 708 between the chips. FIG. 37 is a cross-sectional view illustrating a configuration of the solid-state imaging device 701i according to a first modification of the seventh embodiment of the present disclosure.

The one part 750a of the current readout circuit has a semiconductor region 751, a gate electrode 752, and a semiconductor region 753. The semiconductor region 751 is electrically connected to the semiconductor region 11 of the photoelectric conversion unit 10 via a line 9. When an active level signal is supplied to the gate electrode 752, the transistor including the semiconductor region 751 as a source, the gate electrode 752, and the semiconductor region 753 as a drain transmits a signal corresponding to the current from the photoelectric conversion unit 10 to the other part 750b of the current readout circuit via the semiconductor region 751, the semiconductor region 753, and the connection wiring lines 8 and 708. That is, since the current readout circuit 750 is divided into and arranged on the chip CH1 and the chip CH2, it is possible to easily obtain the circuit area of the current readout circuit 750 while further suppressing an increase in planar dimensions of the chips CH1 and CH2.

8. Eighth Embodiment

Next, a solid-state imaging device according to an eighth embodiment will be described. Hereinafter, differences from the first to seventh embodiments will be mainly described.

Although the first to seventh embodiments have described an exemplary configuration in which the photoelectric conversion unit for DVS is disposed on the front surface side of the substrate with respect to the photoelectric conversion unit for imaging, the eighth embodiment describes an exemplary configuration in which the photoelectric conversion unit for imaging is disposed on the front surface side of the substrate with respect to the main portion of the photoelectric conversion unit for DVS.

Figure 38:
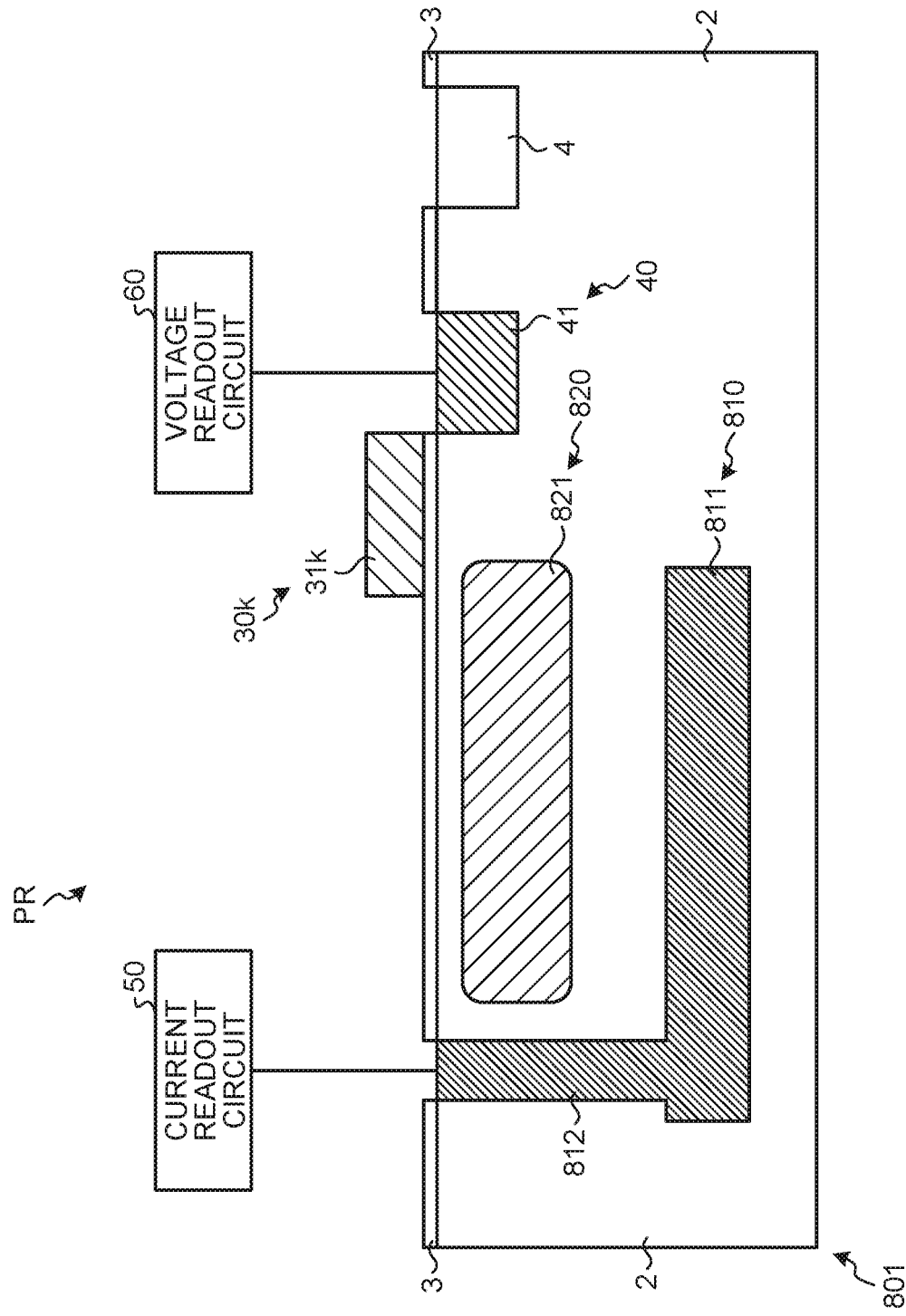
FIG. 38 is a cross-sectional view illustrating a configuration of the solid-state imaging device according to an eighth embodiment of the present disclosure.

Specifically, as illustrated in FIG. 38, a pixel region PR of a solid-state imaging device 801 includes a photoelectric conversion unit 810, a photoelectric conversion unit 820, and a transfer unit 30k in place of the photoelectric conversion unit 10, the photoelectric conversion unit 20, and the transfer unit 30 (refer to FIG. 1), respectively. FIG. 38 is a cross-sectional view illustrating a configuration of the solid-state imaging device 801 according to the eighth embodiment of the present disclosure. The photoelectric conversion unit 810 and the photoelectric conversion unit 820 are both embedded units, and the photoelectric conversion unit 820 is disposed at a shallower position in the semiconductor substrate 2 than the main portion of the photoelectric conversion unit 810. The photoelectric conversion unit 810 is configured to have its main portion disposed at a position deeper than the photoelectric conversion unit 820 so as to be extended from the deep position to a shallow position.

In accordance with the shallow position at which the photoelectric conversion unit 820 is disposed in the semiconductor substrate 2, the transfer unit 30k has a configuration similar to the transfer unit 30k (refer to FIG. 6) of the fourth modification of the first embodiment and has a gate electrode 31k having a planar shape.

The photoelectric conversion unit 810 includes a semiconductor region 811 and an extended portion 812. The photoelectric conversion unit 820 has a semiconductor region 821. The semiconductor region 811, which is a main portion of the photoelectric conversion unit 810, is disposed at a position deeper than the front surface of the semiconductor substrate 2, and is disposed at a position deeper than the semiconductor region 821. The semiconductor region 811 overlaps the semiconductor region 821 when viewed in the light incident direction. The semiconductor region 811 is separated from the semiconductor region 821 in the depth direction. The extended portion 812 extends from an end of the semiconductor region 811 on the opposite side of the semiconductor region 41 to the vicinity of the front surface of the semiconductor substrate 2 in the depth direction. The extended portion 812 is separated from the semiconductor region 821 in the planar direction. Each of the semiconductor region 811 and the extended portion 812 contains impurities of the second conductivity type (for example, N-type) at a second concentration higher than the first concentration.

As described above, in the eighth embodiment, each pixel region PR of the solid-state imaging device 801 has a configuration in which the main portion of the photoelectric conversion unit 810 and the photoelectric conversion unit 820 overlap each other in the light incident direction. With this configuration, it is possible to easily obtain the light receiving area of each of the photoelectric conversion units 810 and 820, and possible to easily obtain the aperture ratio of each of the photoelectric conversion units 810 and 820.

8.1 First Modification of Eighth Embodiment

Figure 39:
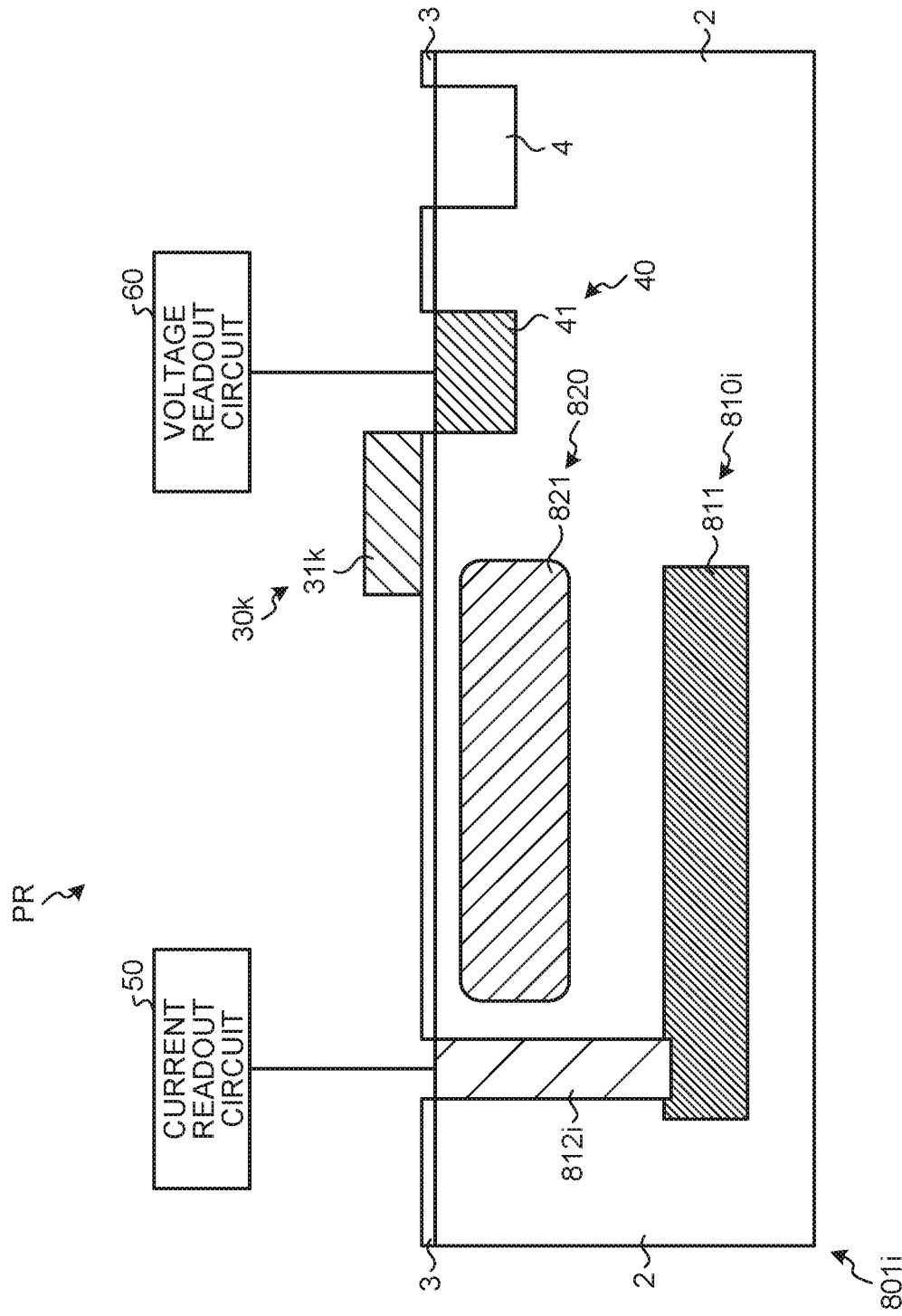
FIG. 39 is a cross-sectional view illustrating a configuration of a solid-state imaging device according to a first modification of the eighth embodiment of the present disclosure.

It is also allowable to have a pixel region PR of a solid-state imaging device 801*i* in which an extended portion 812*i* of the photoelectric conversion unit 810 is formed of a conductive material such as metal as illustrated in FIG. 39. FIG. 39 is a cross-sectional view illustrating a configuration of the solid-state imaging device 801*i* according to a first modification of the eighth embodiment of the present disclosure. By forming the extended portion 812*i* with a conductive material, it is possible to reduce a parasitic resistance component in the connection between the semiconductor region 811 and the current readout circuit 50.

9. Ninth Embodiment

Next, a solid-state imaging device according to a ninth embodiment will be described. Hereinafter, differences from the first to eighth embodiments will be mainly described.

Although the first to eighth embodiments have described an exemplary configuration in which the photoelectric conversion units for imaging in each pixel region PR are disposed in one layer in the depth direction within the substrate, the ninth embodiment describes an exemplary configuration in which the photoelectric conversion units for imaging are disposed in a plurality of layers in the depth direction within the substrate.

Figure 40:
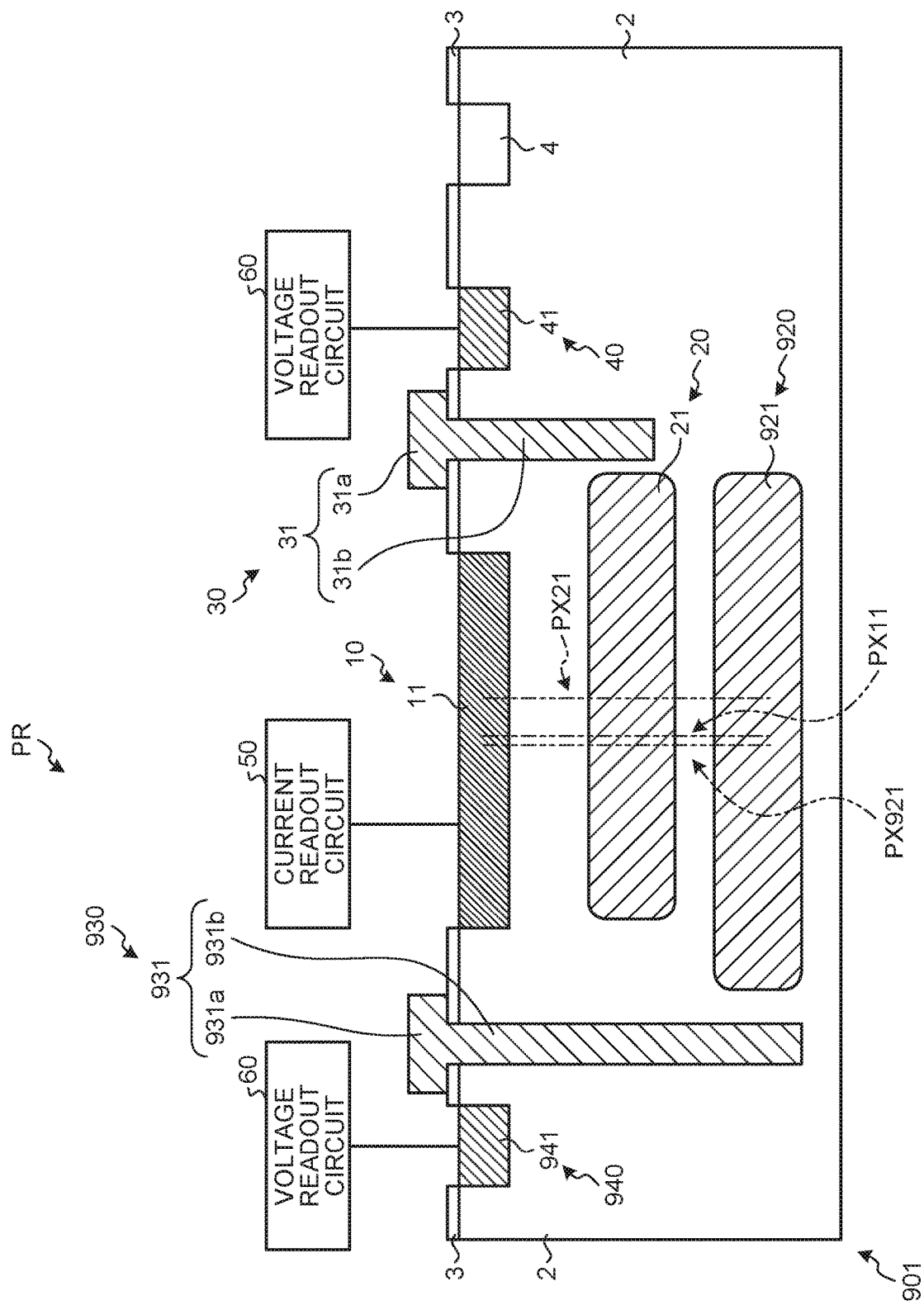
FIG. 40 is a cross-sectional view illustrating a configuration of a solid-state imaging device according to a ninth embodiment of the present disclosure.

Specifically, as illustrated in FIG. 40, a pixel region PR of a solid-state imaging device 901 further includes a photoelectric conversion unit 920, a transfer unit 930, and a charge-to-voltage converter 940. FIG. 40 is a cross-sectional view illustrating a configuration of the solid-state imaging device 901 according to the ninth embodiment of the present disclosure.

The photoelectric conversion unit 920 is an embedded unit and has a semiconductor region 921. The semiconductor region 921 is disposed at a position deeper than the front surface of the semiconductor substrate 2 and is disposed at a position deeper than the semiconductor region 11 and the semiconductor region 21. The semiconductor region 921 overlaps each of the semiconductor region 11 and the semiconductor region 21 when viewed in the light incident direction. An optical axis PX11 of the semiconductor region 11 intersects each of the semiconductor region 21 and the semiconductor region 921. An optical axis PX21 of the semiconductor region 21 intersects each of the semiconductor region 11 and the semiconductor region 921. An optical axis PX921 of the semiconductor region 921 intersects each of the semiconductor region 11 and the semiconductor region 21. The semiconductor region 921 is separated from each of the semiconductor region 11 and the semiconductor region 921 in the depth direction. The semiconductor region 921 contains second conductivity type (for example, N-type) impurities at a third concentration higher than the first concentration and lower than the second concentration.

The transfer unit 930 transfers the charge accumulated in the photoelectric conversion unit 920 to the charge-to-voltage converter 940. The charge-to-voltage converter 940 converts the transferred charge into a voltage. The charge-to-voltage converter 940 functions as floating diffusion FD, for example, and includes a semiconductor region 941. The semiconductor region 941 contains impurities of the second conductivity type (for example, N-type) at a second concentration higher than the first concentration.

The transfer unit 930 functions as a transfer transistor, for example, and includes a semiconductor region 921 as a source, a transfer gate 931 as a gate, and a semiconductor region 941 as a drain. The transfer gate 931 has a vertical shape extending in the depth direction into the substrate. The transfer gate 931 includes: a flat portion 931*a* that covers the front surface of the semiconductor substrate 2 via the gate insulating film 3; and a trench portion 931*b* that penetrates the gate insulating film 3 from the flat portion 931*a* and extends deeper in the depth direction within the semiconductor substrate 2 than the semiconductor region 11 and the semiconductor region 21 to the vicinity of the depth of the semiconductor region 921. The tip of the trench portion 931*b* is located deeper within the substrate than the tip of the trench portion 31*b*. The transfer gate 931 may be formed of polysilicon containing impurities or may be formed of metal such as tungsten. When an active level control signal is supplied to the transfer gate 931, the transfer unit 930 transfers the charge accumulated in the semiconductor region 921 to the semiconductor region 941.

For example, more photoelectric conversion units for different uses can be integrated in each pixel region PR, such as photoelectric conversion for DVS in the photoelectric conversion unit 10, photoelectric conversion for acquiring a gradation value in the photoelectric conversion unit 20, and photoelectric conversion for distance detection in the photoelectric conversion unit 920.

As described above, in the ninth embodiment, each pixel region PR of the solid-state imaging device 901 has a configuration in which the photoelectric conversion unit 10, the photoelectric conversion unit 20, and the photoelectric conversion unit 920 are disposed to overlap each other in the light incident direction. With this configuration, it is possible to easily obtain the light receiving area of each of the photoelectric conversion units 10, 20, and 920, and possible to easily obtain the aperture ratio of each of the photoelectric conversion units 10, 20, and 920 while increasing the degree of integration of the photoelectric conversion units 10, 20, and 920.

FIG. 40 illustrates a configuration in which the voltage readout circuit 60 connected to the charge-to-voltage converter 40 and the voltage readout circuit 60 connected to the charge-to-voltage converter 940 are separate from each other. However, the charge-to-voltage converter 40 and the charge-to-voltage converter 940 may be connected to a voltage readout circuit 60 used in common. In this case, the transfer of the charge by the transfer unit 30 and the transfer of the charge by the transfer unit 930 may be performed in mutually complementary periods. This makes it possible to perform readout of the voltage from the charge-to-voltage converter 40 to the voltage readout circuit 60 and readout of the voltage from the charge-to-voltage converter 940 to the voltage readout circuit 60 in mutually complementary periods, enabling their signals to be processed in mutually complementary periods.

10. Tenth Embodiment

Next, a solid-state imaging device according to a tenth embodiment will be described. Hereinafter, differences from the first to ninth embodiments will be mainly described.

Although the first to ninth embodiments have described an exemplary configuration in which each photoelectric conversion unit for imaging corresponds to one transfer unit and one charge-to-voltage converter, the tenth embodiment describes an exemplary configuration in which each photoelectric conversion unit for imaging corresponds to a plurality of transfer units and a plurality of charge-to-voltage converters.

Figure 41:
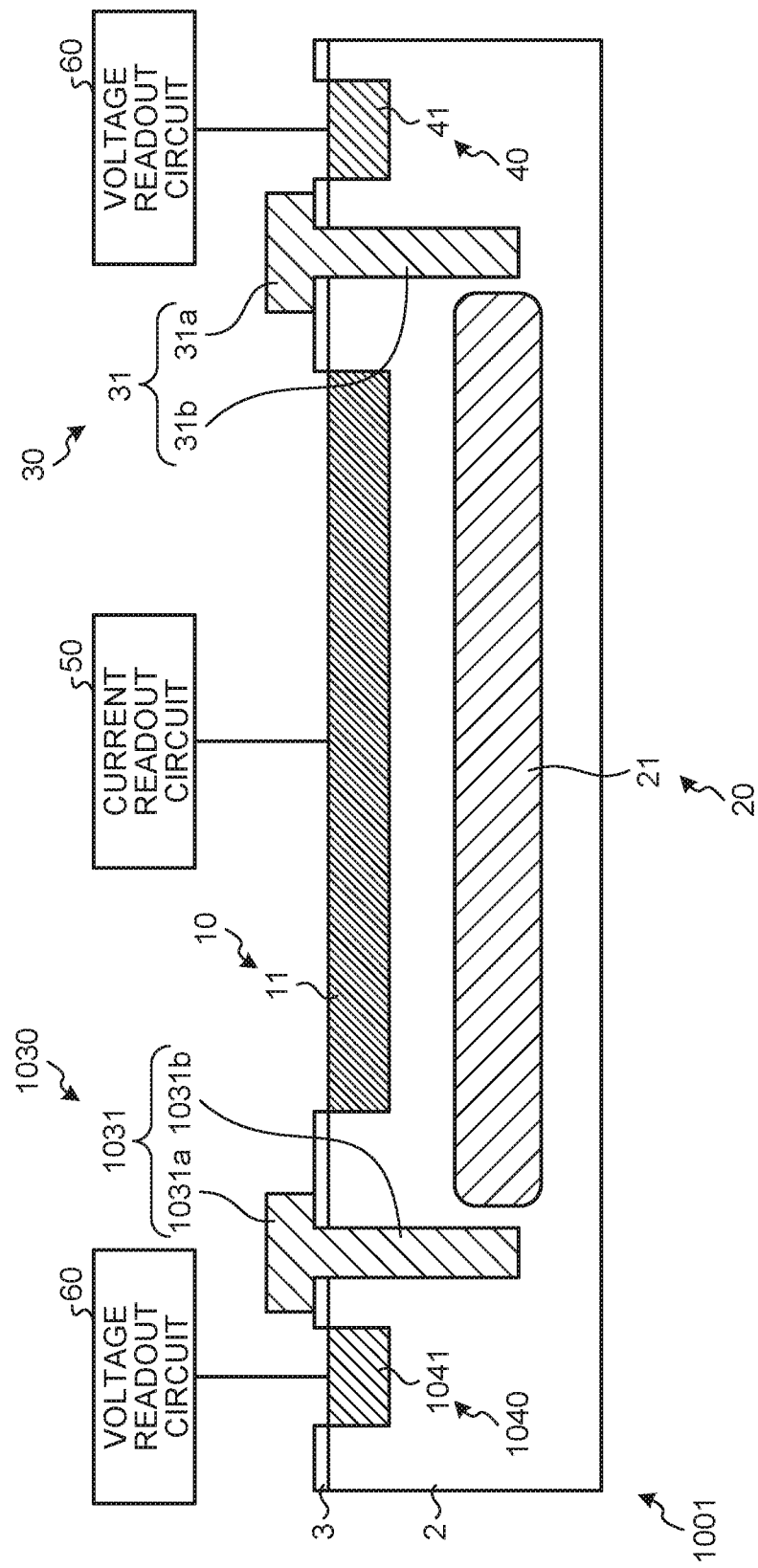
FIG. 41 is a cross-sectional view illustrating a configuration of a solid-state imaging device according to a tenth embodiment of the present disclosure.

Specifically, as illustrated in FIG. 41, a pixel region PR of a solid-state imaging device 1001 further includes a transfer unit 1030 and a charge-to-voltage converter 1040. FIG. 41 is a cross-sectional view illustrating a configuration of the solid-state imaging device 1001 according to the tenth embodiment of the present disclosure.

The transfer unit 1030 transfers the charge accumulated in the photoelectric conversion unit 20 to the charge-to-voltage converter 1040. The charge-to-voltage converter 1040 converts the transferred charge into a voltage. The charge-to-voltage converter 1040 functions as floating diffusion FD, for example, and includes a semiconductor region 1041. The semiconductor region 1041 contains impurities of the second conductivity type (for example, N-type) at a second concentration higher than the first concentration.

The transfer unit 1030 functions as a transfer transistor, for example, and includes a semiconductor region 21 as a source, a transfer gate 1031 as a gate, and the semiconductor region 1041 as a drain. The transfer gate 1031 has a vertical shape extending in the depth direction into the substrate. The transfer gate 1031 includes: a flat portion 1031a that covers the front surface of the semiconductor substrate 2 via the gate insulating film 3; and a trench portion 1031b that penetrates the gate insulating film 3 from the flat portion 1031a and extends deeper than the semiconductor region 11 in the depth direction within the semiconductor substrate 2 to the vicinity of the depth of the semiconductor region 21. The tip of the trench portion 1031b is located at substantially the same depth in the substrate as the tip of the trench portion 31b. The transfer gate 1031 may be formed of polysilicon containing impurities or may be formed of metal such as tungsten. When an active level control signal is supplied to the transfer gate 1031, the transfer unit 1030 transfers the charge accumulated in the semiconductor region 921 to the semiconductor region 941.

With the pixel region PR, a charge accumulation operation for distance measurement by a time of flight (ToF) method can be performed. For example, when an object is irradiated with modulated irradiation light from a light source (not illustrated) with a first periodic pulse that periodically repeats on and off with a duty ratio of 50% and reflected light from the object is for imaging in the pixel region PR, the transfer gate 31 of the transfer unit 30 is turned on and off with the first periodic pulse, and the transfer gate 131 of the transfer unit 130 is turned on and off with a second periodic pulse having a phase inverted from the first periodic pulse. With this operation, the voltage readout circuit 60 can obtain the phase difference between the irradiation light and the reflected light based on a difference between the signal read out via the charge-to-voltage converter 40 and the signal read out via the charge-to-voltage converter 1040, and can obtain the distance to the object according to the phase difference and the speed of light. At this time, the voltage readout circuit 60 operates as a ToF circuit that processes a pixel signal of the ToF method, and operates as a distance measurement circuit that measures a distance to the object (subject).

As described above, in the tenth embodiment, each pixel region PR of the solid-state imaging device 1001 has a configuration in which the photoelectric conversion unit 10 for DVS and the photoelectric conversion unit 20 for distance measurement are disposed to overlap each other in the light incident direction. With this configuration, it is possible to easily obtain the light receiving area of each of the photoelectric conversion units 10 and 20, and possible to easily obtain the aperture ratio of each of the photoelectric conversion units 10 and 20.

11. Eleventh Embodiment

Next, a solid-state imaging device according to an eleventh embodiment will be described. Hereinafter, differences from the first to tenth embodiments will be mainly described.

Although the first to tenth embodiments have described an exemplary configuration in which each photoelectric conversion unit for DVS is implemented in a semiconductor region within the substrate, the eleventh embodiment describes an exemplary configuration in which each photoelectric conversion unit for DVS is implemented by a photoelectric conversion film disposed above the substrate.

Figure 42:
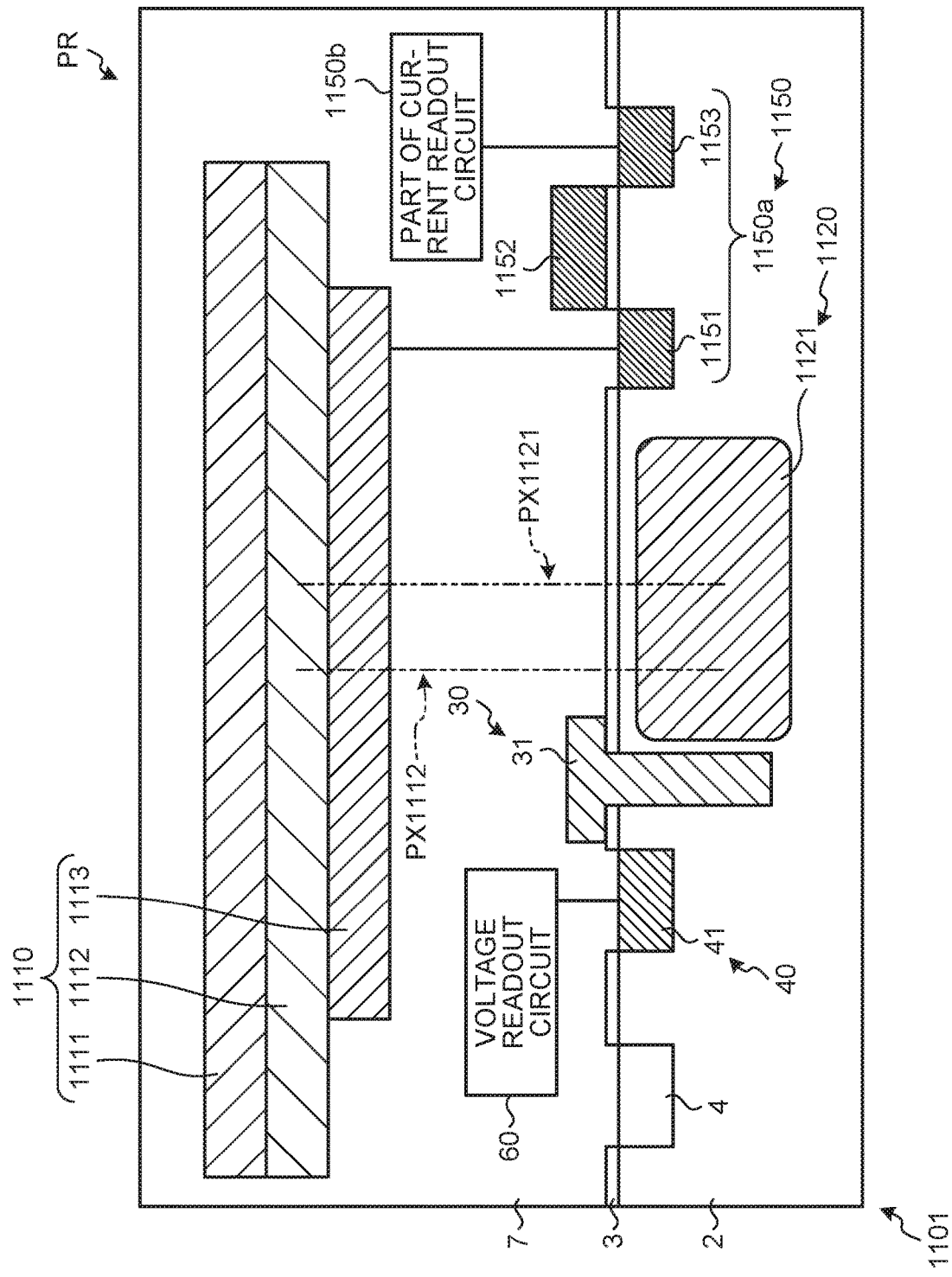
FIG. 42 is a cross-sectional view illustrating a configuration of a solid-state imaging device according to an eleventh embodiment of the present disclosure.

Specifically, as illustrated in FIG. 42, a pixel region PR of a solid-state imaging device 1101 includes a photoelectric conversion unit 1110 and a photoelectric conversion unit 1120 instead of the photoelectric conversion unit 10 and the photoelectric conversion unit 20 (refer to FIG. 1), respectively. FIG. 42 is a cross-sectional view illustrating a configuration of the solid-state imaging device 1101 according to the eleventh embodiment of the present disclosure.

The photoelectric conversion unit 1110 is disposed above the semiconductor substrate 2 as a film, and includes an anode electrode film 1111, a photoelectric conversion film 1112, and a cathode electrode film 1113. In the height direction, the photoelectric conversion film 1112 is sandwiched between the anode electrode film 1111 and the cathode electrode film 1113. The anode electrode film 1111 and the cathode electrode film 1113 may be formed of a material containing a metal such as aluminum as a main component. The photoelectric conversion film 1112 can be formed of an organic substance or an inorganic substance suitable for photoelectric conversion. The anode electrode film 1111 may be provided as an integrated portion for the plurality of pixel regions PR. The photoelectric conversion film 1112 may be partitioned for each pixel region PR. The cathode electrode film 1113 may be partitioned for each pixel region PR. For example, a bias voltage is applied to the anode electrode film 1111. The cathode electrode film 1113 is electrically connected to the current readout circuit 1150. With this configuration, a current corresponding to the charge generated in the photoelectric conversion film 1112 according to the incident light is read out to the current readout circuit 1150.

The current readout circuit 1150 may have one part 1150a disposed in the pixel region PR and another part 1150b disposed outside the pixel region PR. The one part 1150a has a semiconductor region 1151, a gate electrode 1152, and a semiconductor region 1153. When an active level signal is supplied to the gate electrode 1152, the transistor including the semiconductor region 1151 as a source, the gate electrode 1152, and the semiconductor region 1153 as a drain transmits a signal corresponding to the current from the photoelectric conversion unit 1110 to the another part 1150b of the current readout circuit via the semiconductor region 1151 and the semiconductor region 1153.

The photoelectric conversion unit 1120 is an embedded unit and has a semiconductor region 1121. The semiconductor region 21 is disposed at a position deeper than the front surface of the semiconductor substrate 2. The semiconductor region 1121 overlaps the photoelectric conversion film 1112 when viewed in the light incident direction. An optical axis PX1112 of the photoelectric conversion film 1112 intersects the semiconductor region 1121. An optical axis PX1121 of the semiconductor region 1121 intersects the photoelectric conversion film 1112.

As described above, in the eleventh embodiment, each pixel region PR of the solid-state imaging device 1101 has a configuration in which the photoelectric conversion unit 1110 for DVS as a film is disposed above the photoelectric conversion unit 1120 for imaging as a semiconductor region, so as to dispose the photoelectric conversion unit 1110 for DVS and the photoelectric conversion unit 1120 for imaging to overlap each other in the light incident direction. With this configuration, it is possible to easily obtain the light receiving area of each of the photoelectric conversion units 1110 and 1120, and possible to easily obtain the aperture ratio of each of the photoelectric conversion units 1110 and 1120.

11.1 First Modification of Eleventh Embodiment

Figure 43:
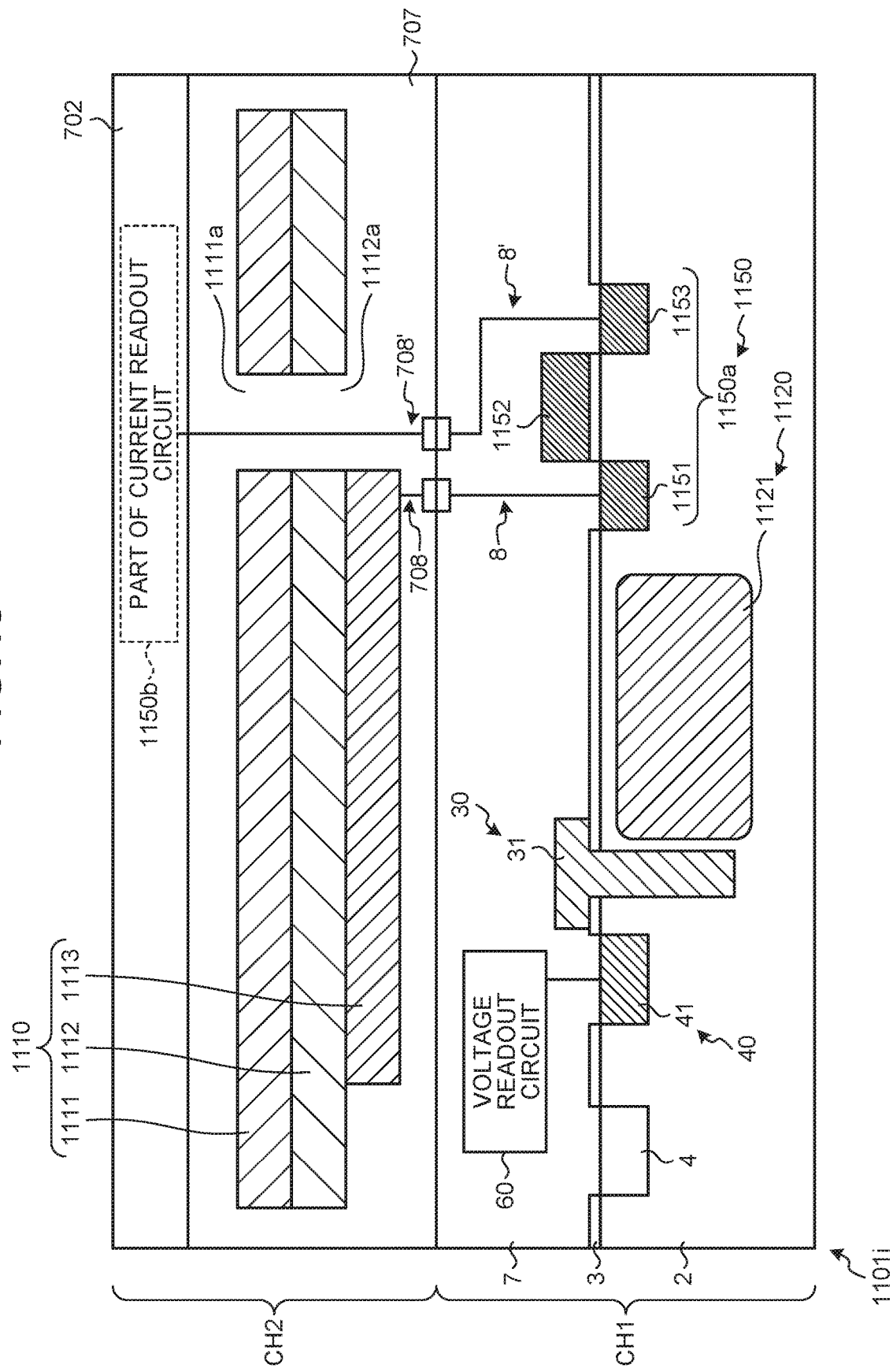
FIG. 43 is a cross-sectional view illustrating a configuration of a solid-state imaging device according to a first modification of the eleventh embodiment of the present disclosure.

It is allowable to have a pixel region PR of a solid-state imaging device 1101i in which the configuration illustrated in FIG. 42 is divided into a plurality of chips as illustrated in FIG. 43. FIG. 43 is a cross-sectional view illustrating a configuration of the solid-state imaging device 1101i according to a first modification of the eleventh embodiment of the present disclosure.

The solid-state imaging device 1101i is formed by bonding the chip CH1 and the chip CH2 to each other. For example, the photoelectric conversion unit 1120, the voltage readout circuit 60, and one part 1150a of the current readout circuit 1150 are disposed on the chip CH1, while the photoelectric conversion unit 1110 and the another part 1150b of the current readout circuit 1150 are disposed on the chip CH2. In the photoelectric conversion unit 1110, the anode electrode 1111 is disposed on the substrate 702 side of the chip CH2 with respect to the photoelectric conversion film 1112, and the cathode electrode 1113 is disposed on the chip CH1 side with respect to the photoelectric conversion film 1112. The cathode electrode film 1113 of the photoelectric conversion unit 1110 is electrically connected to the semiconductor region 1151 via the wiring line 708 penetrating the interlayer insulating film 707 of the chip CH2 and the wiring line 8 penetrating the interlayer insulating film 7 of the chip CH1. The semiconductor region 1153 is electrically connected to the another part 1150b of the current readout circuit 1150 via a wiring line 8' penetrating through the interlayer insulating film 7 of the chip CH1 and a wiring line 708' penetrating through the interlayer insulating film 707 and the photoelectric conversion unit 1110 of the chip CH2. The photoelectric conversion film 1112 and the anode electrode film 1111 in the photoelectric conversion unit 1110 have an opening 1112a and an opening 1111a, respectively, and the wiring line 708' may penetrate through the inside of each opening via an insulating film.

Also with such a configuration, the photoelectric conversion unit 1110 for DVS as a film can be disposed above the photoelectric conversion unit 1120 for imaging as a semiconductor region, and the photoelectric conversion unit 1110 for DVS and the photoelectric conversion unit 1120 for imaging can be disposed to overlap each other in the light incident direction.

11.2 Second Modification of Eleventh Embodiment

Figure 44:
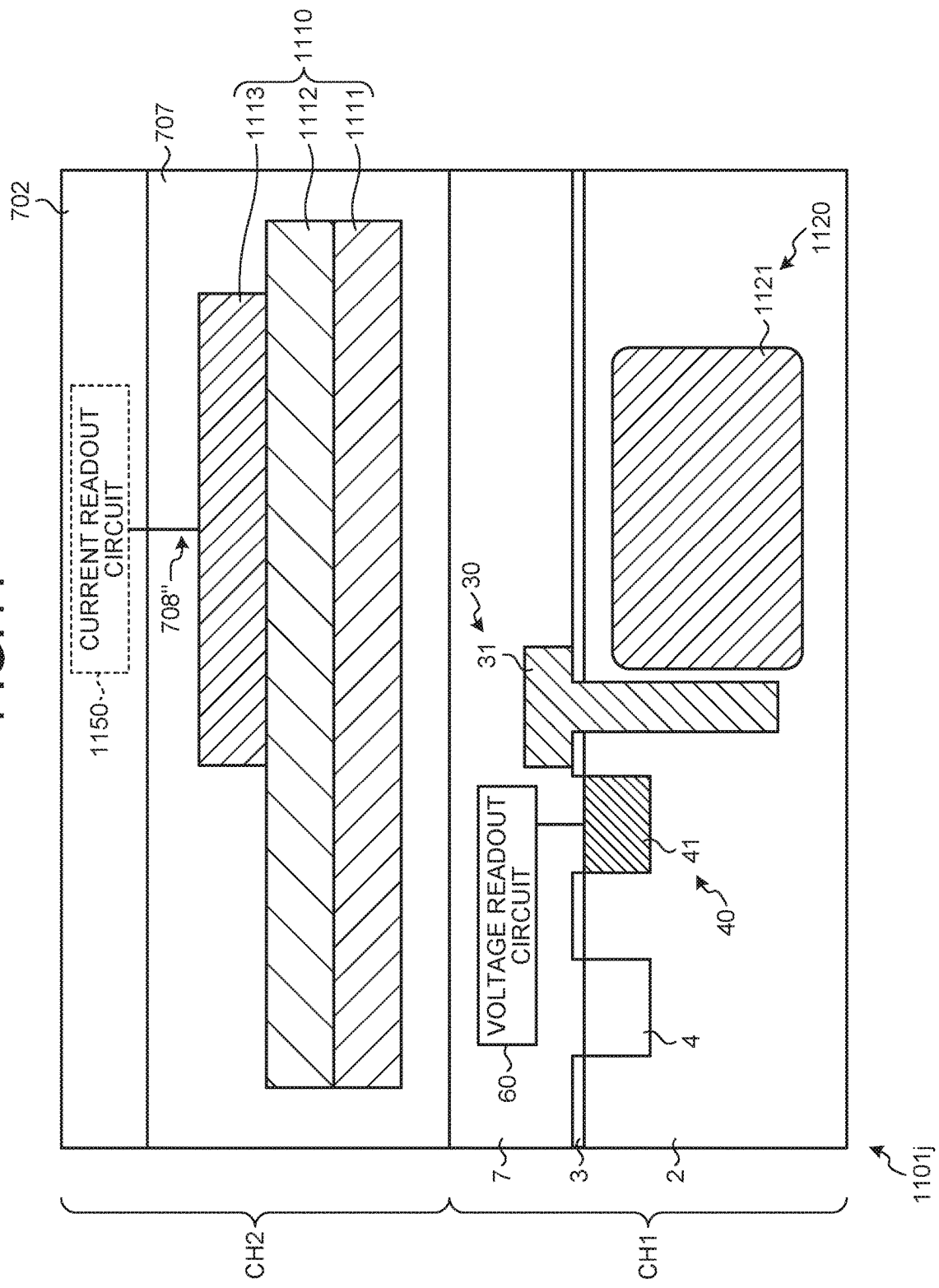
FIG. 44 is a cross-sectional view illustrating a configuration of a solid-state imaging device according to a second modification of the eleventh embodiment of the present disclosure.

Alternatively, it is allowable to have a pixel region PR of a solid-state imaging device 1101i in which the configuration illustrated in FIG. 42 is divided into a plurality of chips as illustrated in FIG. 44. FIG. 44 is a cross-sectional view illustrating a configuration of the solid-state imaging device 1101j according to a second modification of the eleventh embodiment of the present disclosure.

The solid-state imaging device 1101j is formed by bonding the chip CH1 and the chip CH2 to each other. For example, the photoelectric conversion unit 1120 and the voltage readout circuit 60 are disposed on the chip CH1, while the photoelectric conversion unit 1110 and the current readout circuit 1150 are disposed on the chip CH2. In the photoelectric conversion unit 1110, the cathode electrode 1113 is disposed on the substrate 702 side of the chip CH2 with respect to the photoelectric conversion film 1112, and the anode electrode 1111 is disposed on the chip CH1 side with respect to the photoelectric conversion film 1112. The cathode electrode film 1113 of the photoelectric conversion unit 1110 is electrically connected to the current readout circuit 1150 via a wiring line 708" penetrating through the interlayer insulating film 707 of the chip CH2.

Also with such a configuration, the photoelectric conversion unit 1110 for DVS as a film can be disposed above the photoelectric conversion unit 1120 for imaging as a semiconductor region, and the photoelectric conversion unit 1110 for DVS and the photoelectric conversion unit 1120 for imaging can be disposed to overlap each other in the light incident direction.

11.3 Third Modification of Eleventh Embodiment

Figure 45:
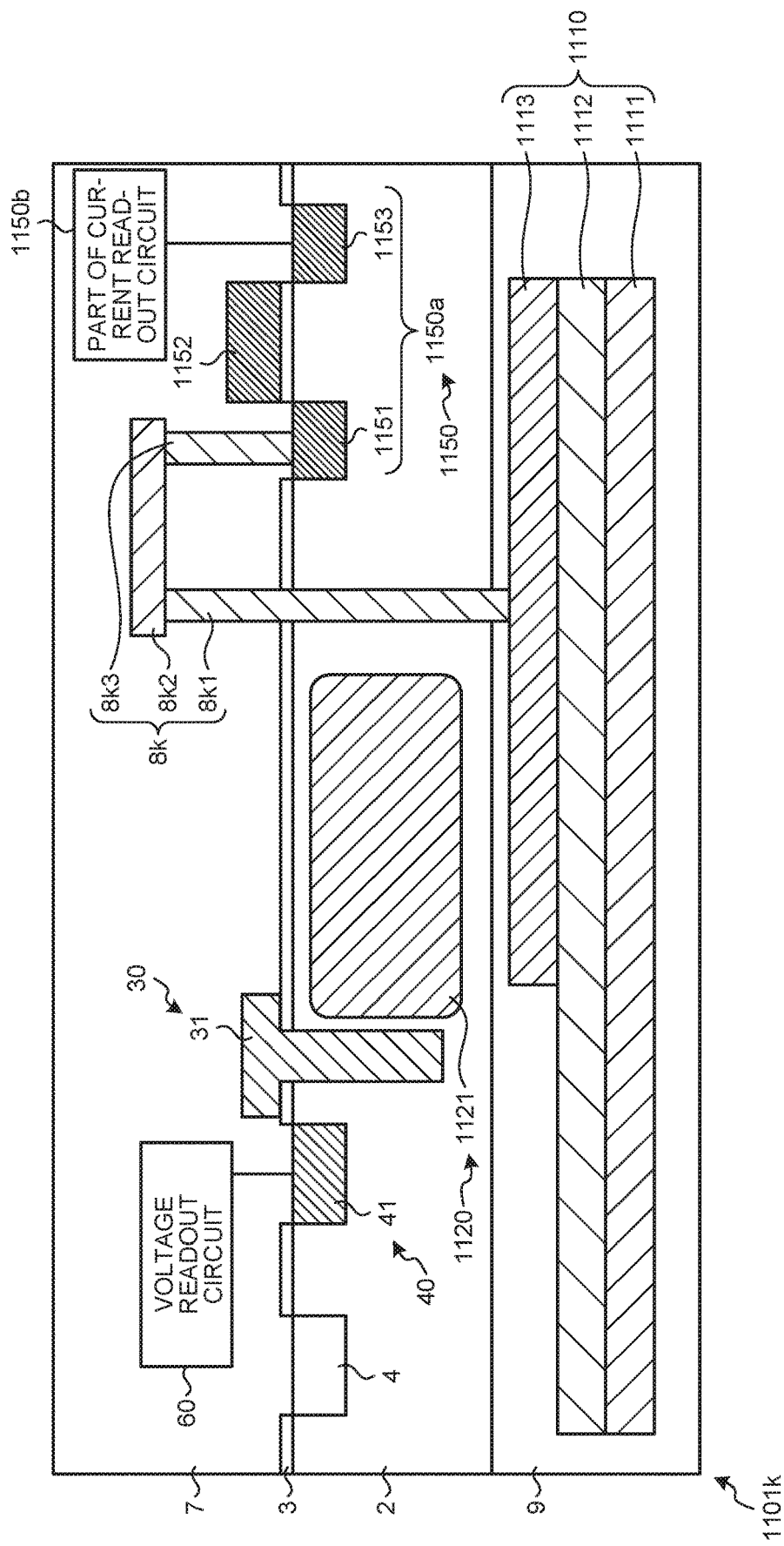
FIG. 45 is a cross-sectional view illustrating a configuration of a solid-state imaging device according to a third modification of the eleventh embodiment of the present disclosure.

Alternatively, in the pixel region PR of the solid-state imaging device 1101k, as illustrated in FIG. 45, a photoelectric conversion unit as a film may be disposed on the back surface side of the semiconductor substrate. FIG. 45 is a cross-sectional view illustrating a configuration of a solid-state imaging device 1101k according to a third modification of the eleventh embodiment of the present disclosure.

In the pixel region PR of the solid-state imaging device 1101k, the photoelectric conversion unit 1110 is disposed below the photoelectric conversion unit 1120 via an interlayer insulating film 9 covering the back surface of the semiconductor substrate 2. In the photoelectric conversion unit 1110, the anode electrode 1111 is disposed on the opposite side of the semiconductor substrate 2 with respect to the photoelectric conversion film 1112, while the cathode electrode 1113 is disposed on the side of the semiconductor substrate 2 with respect to the photoelectric conversion film 1112. The cathode electrode film 1113 of the photoelectric conversion unit 1110 is electrically connected to the current readout circuit 1150 via a wiring line 8k. The wiring line 8k includes a plug 8k1, a conductive film 8k2, and a plug 8k3. The plug 8k1 is electrically connected from the cathode electrode 1113 to the conductive film 8k2 through the interlayer insulating film 9, the semiconductor substrate 2, and an interlayer insulating film 7. Penetrating through the interlayer insulating film 7, the plug 8k3 is electrically connected from the conductive film 8k2 to the semiconductor region 1151 of the current readout circuit 1150.

Also with such a configuration, the photoelectric conversion unit 1110 for DVS as a film can be disposed below the photoelectric conversion unit 1120 for imaging as a semiconductor region, and the photoelectric conversion unit 1110 for DVS and the photoelectric conversion unit 1120 for imaging can be disposed to overlap each other in the light incident direction.

11.4 Fourth Modification of Eleventh Embodiment

Alternatively, in the pixel region PR of the solid-state imaging device 1101n, the configuration illustrated in FIG.

Figure 46:
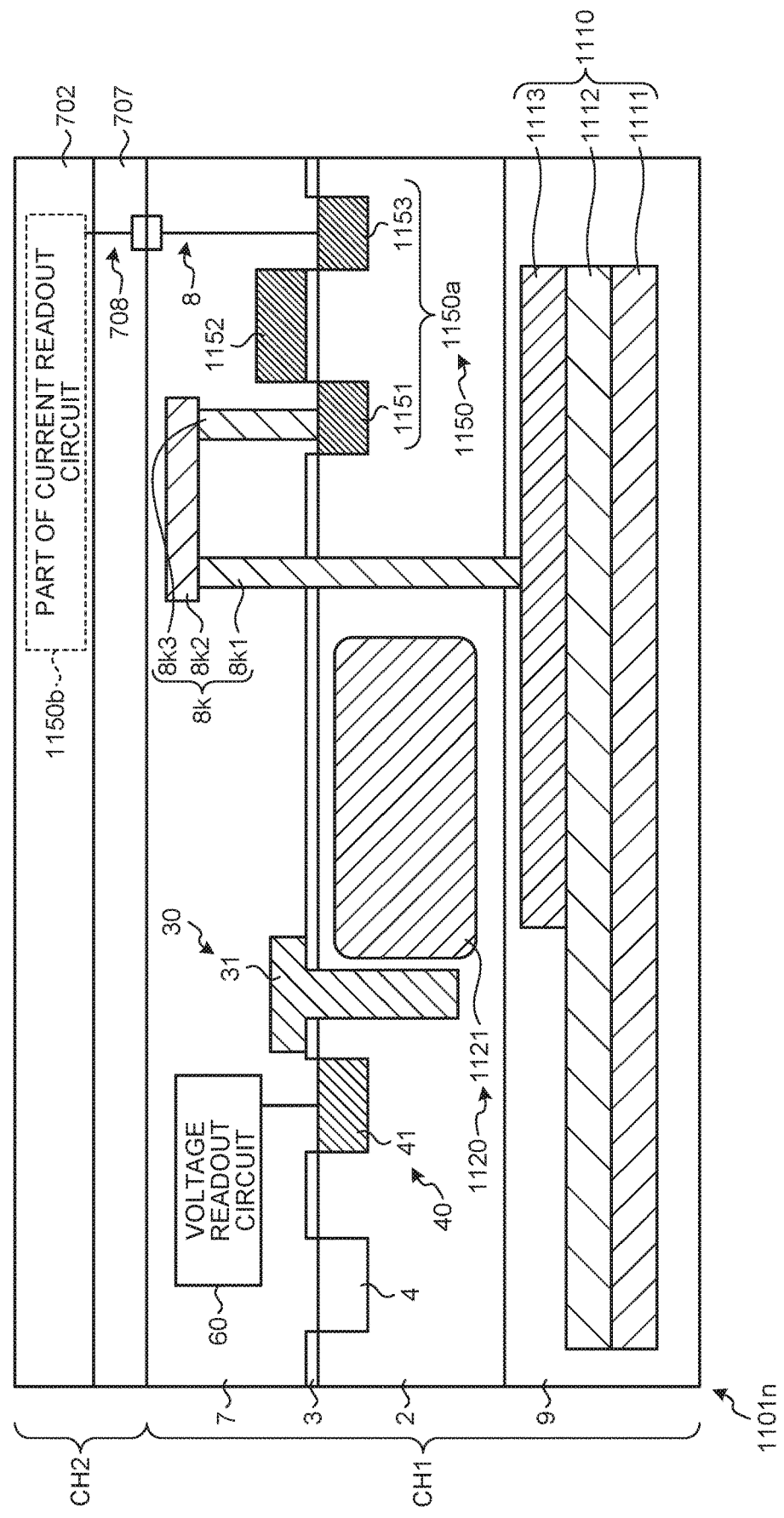
FIG. 46 is a cross-sectional view illustrating a configuration of the solid-state imaging device according to a fourth modification of the eleventh embodiment of the present disclosure.

45 may be divided into a plurality of chips as illustrated in FIG. 46. FIG. 46 is a cross-sectional view illustrating a configuration of a solid-state imaging device 1101n according to a fourth modification of the eleventh embodiment of the present disclosure.

The solid-state imaging device 1101n is formed by bonding the chip CH1 and the chip CH2. For example, the photoelectric conversion unit 1110, the photoelectric conversion unit 1120, the voltage readout circuit 60, and one part 1150a of the current readout circuit 1150 are disposed on the chip CH1, and another part 1150b of the current readout circuit 1150 is disposed on the chip CH2.

Also with such a configuration, the photoelectric conversion unit 1110 for DVS as a film can be disposed below the photoelectric conversion unit 1120 for imaging as a semiconductor region, and the photoelectric conversion unit 1110 for DVS and the photoelectric conversion unit 1120 for imaging can be disposed to overlap each other in the light incident direction.

11.5 Fifth Modification of Eleventh Embodiment

Figure 47:
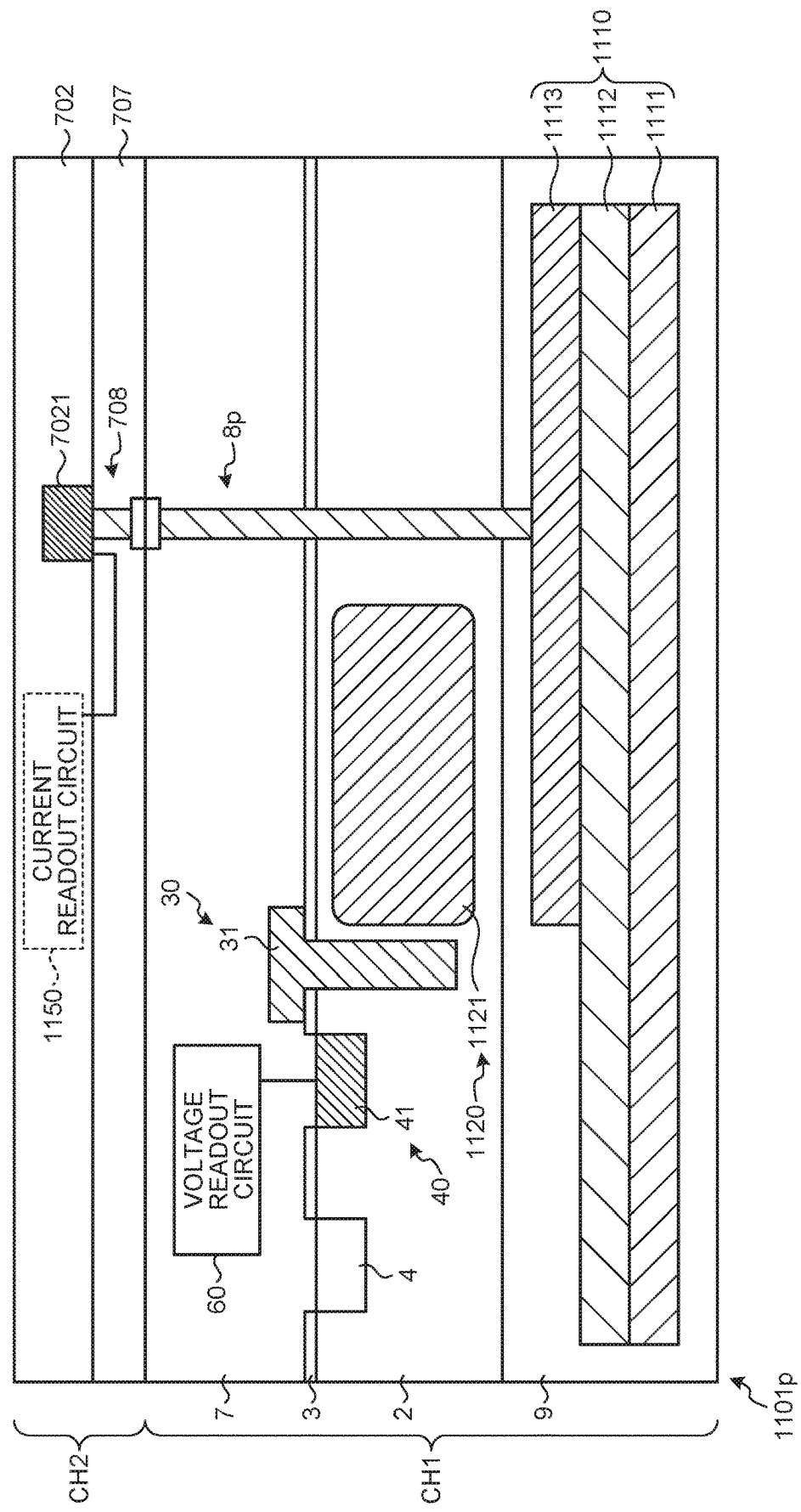
FIG. 47 is a cross-sectional view illustrating a configuration of a solid-state imaging device according to a fifth modification of the eleventh embodiment of the present disclosure.

Alternatively, in the pixel region PR of the solid-state imaging device 1101n, the configuration illustrated in FIG. 45 may be divided into a plurality of chips as illustrated in FIG. 47. FIG. 47 is a cross-sectional view illustrating a configuration of a solid-state imaging device 1101p according to a fifth modification of the eleventh embodiment of the present disclosure.

The solid-state imaging device 1101p is formed by bonding the chip CH1 and the chip CH2 to each other. For example, the photoelectric conversion unit 1110, the photoelectric conversion unit 1120, and the voltage readout circuit 60 are disposed on the chip CH1, while the current readout circuit 1150 is disposed on the chip CH2. The cathode electrode film 1113 in the photoelectric conversion unit 1110 is electrically connected to the current readout circuit 1150 via the wiring line 8p in the chip CH1, the wiring line 708 in the chip CH2, the semiconductor region 7021, and the like. The wiring line 8p penetrates the interlayer insulating film 9, the semiconductor substrate 2, and the interlayer insulating film 7 from the cathode electrode film 1113, so as to be electrically connected to the wiring line 708.

Also with such a configuration, the photoelectric conversion unit 1110 for DVS as a film can be disposed below the photoelectric conversion unit 1120 for imaging as a semiconductor region, and the photoelectric conversion unit 1110 for DVS and the photoelectric conversion unit 1120 for imaging can be disposed to overlap each other in the light incident direction.

12. Twelfth Embodiment

Next, a solid-state imaging device according to a twelfth embodiment will be described. Hereinafter, differences from the first to eleventh embodiments will be mainly described.

In contrast to the seventh embodiment having a configuration in which a plurality of pairs of connection configurations of a plurality of photoelectric conversion units having different uses and a plurality of readout circuits having different types corresponding to the photoelectric conversion units partially extend between chips, the twelfth embodiment describes an exemplary configuration in which a plurality of pairs of connection configurations is independently implemented for each chip.

Figure 48:
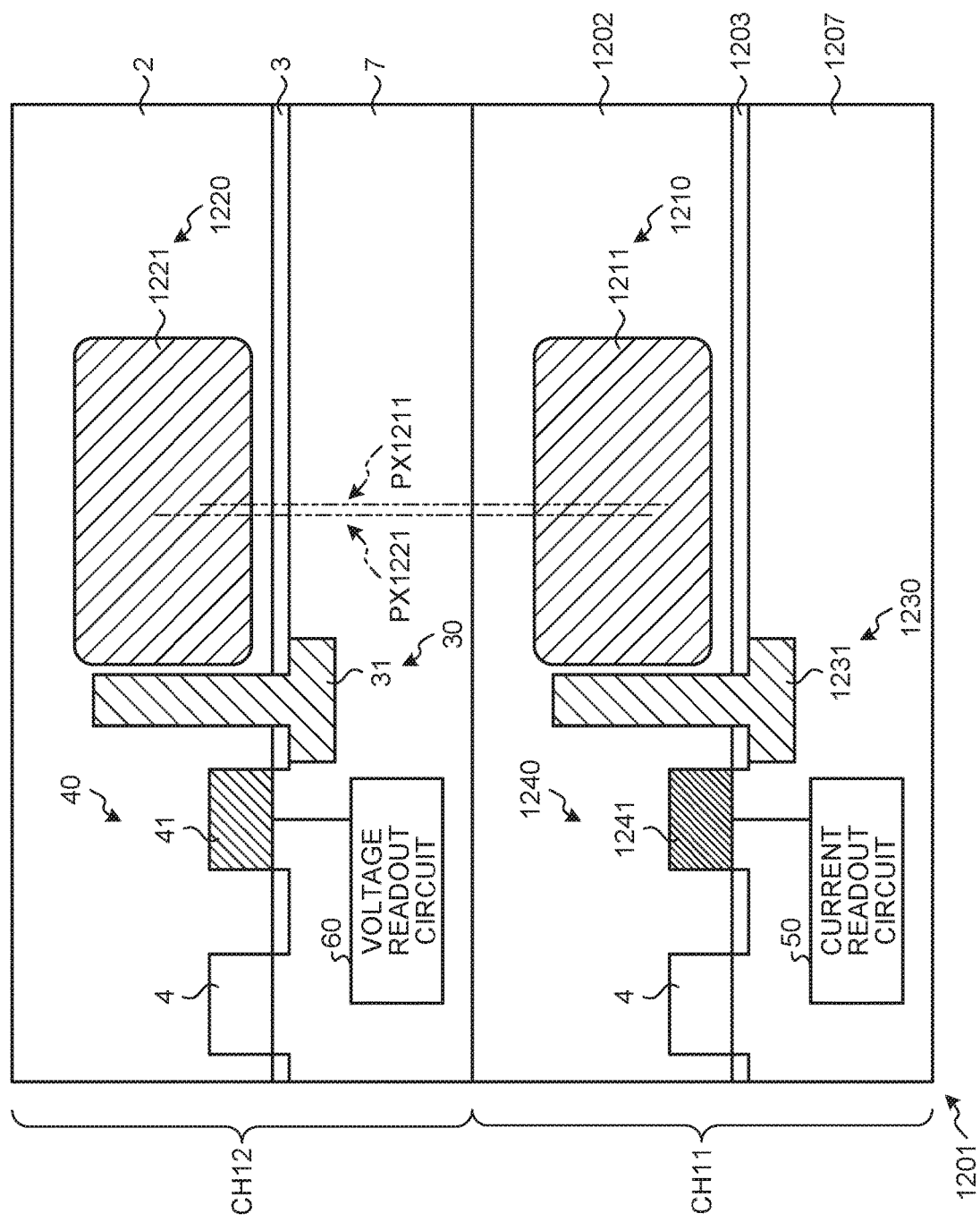
FIG. 48 is a cross-sectional view illustrating a configuration of a solid-state imaging device according to a twelfth embodiment of the present disclosure.

Specifically, as illustrated in FIG. 48, a solid-state imaging device 1201 is formed by bonding a chip CH11 and a chip CH12 to each other such that the front surface of the chip CH12 is in contact with the back surface of the chip CH11. FIG. 48 is a cross-sectional view illustrating a configuration of the solid-state imaging device 1201 according to the twelfth embodiment of the present disclosure. A photoelectric conversion unit 1210, a transfer unit 1230, a charge voltage holding unit 1240, and a current readout circuit 50 are disposed on the chip CH11, while a photoelectric conversion unit 1220, a transfer unit 30, a charge-to-voltage converter 40, and a voltage readout circuit 60 are disposed on the chip CH12.

At this time, the chip CH11 and the chip CH12 may have a similar configuration. For example, the photoelectric conversion unit 1210 of the chip CH11 is an embedded unit, and has a semiconductor region 1211 disposed at a position deeper than the front surface of the semiconductor substrate 1202. The photoelectric conversion unit 1220 of the chip CH12 is an embedded unit, and has a semiconductor region 1221 disposed at a position deeper than the front surface of the semiconductor substrate 2. The transfer unit 1230 of the chip CH11 has a gate electrode 1231 having a vertical shape, and the transfer unit 30 of the chip CH12 has a gate electrode 31 having a vertical shape. The charge holding unit 1240 of the chip CH11 has a semiconductor region 1241 having a front surface constituting a part of the front surface of the semiconductor substrate 1202, while the charge-to-voltage converter 40 of the chip CH12 has a semiconductor region 1241 having a front surface constituting a part of the front surface of the semiconductor substrate 2. This makes it possible to easily reduce the manufacturing cost of each of the chips CH11 and CH12.

In addition, the semiconductor region 1221 of the photoelectric conversion unit 1220 of the chip CH12 overlaps the semiconductor region 1211 of the photoelectric conversion unit 1210 of the chip CH11 when viewed in the light incident direction. The optical axis PX1211 of the semiconductor region 1211 intersects the semiconductor region 1221. The optical axis PX1221 of the semiconductor region 1221 intersects the semiconductor region 1211.

Also with such a configuration, the photoelectric conversion unit 1210 for DVS can be disposed below the photoelectric conversion unit 1220 for imaging as a semiconductor region, and both the photoelectric conversion unit 1210 for DVS and the photoelectric conversion unit 1220 for imaging can be disposed to overlap each other in the light incident direction.

12.1 First Modification of Twelfth Embodiment

Figure 49:
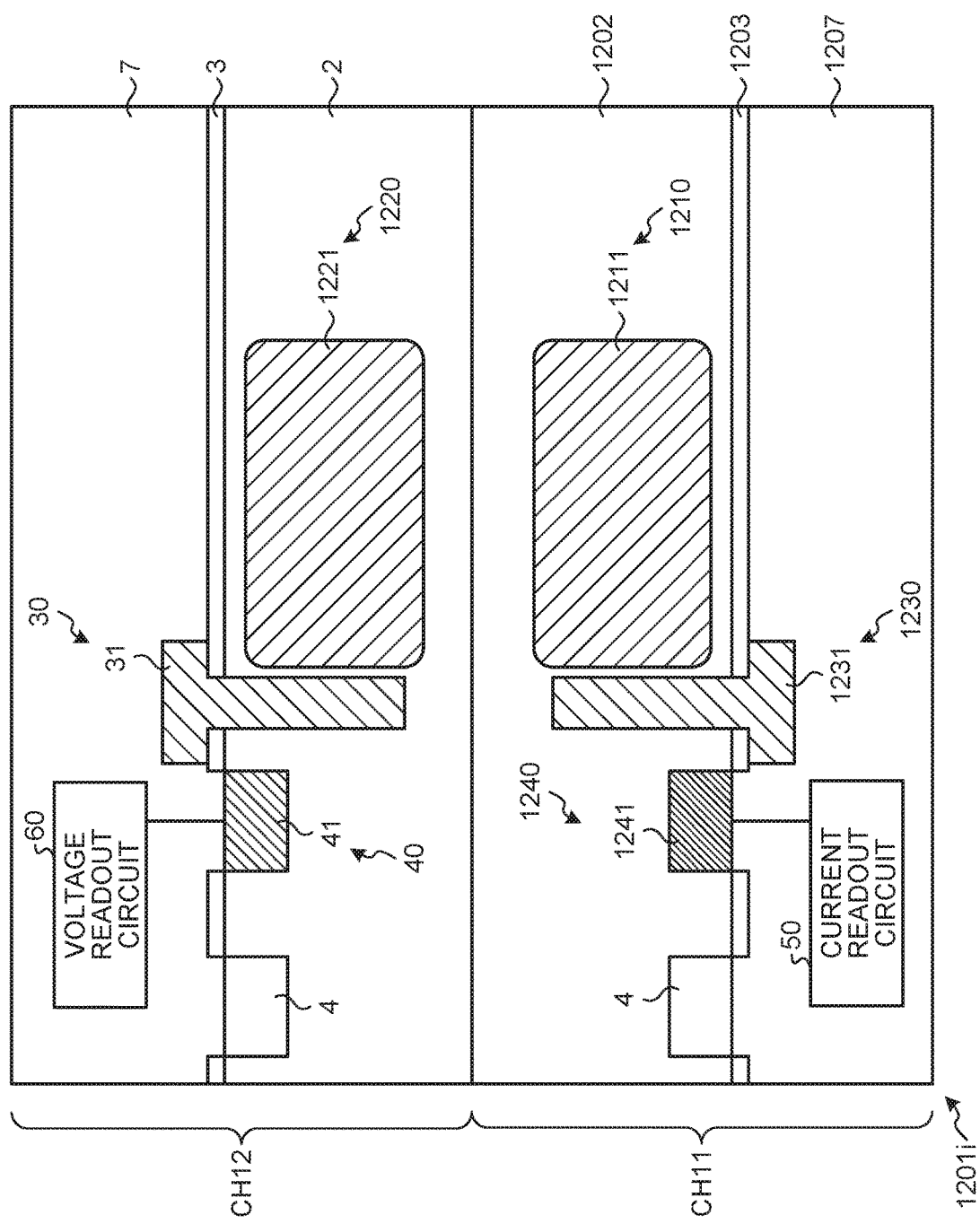
FIG. 49 is a cross-sectional view illustrating a configuration of a solid-state imaging device according to a first modification of the twelfth embodiment of the present disclosure.

As illustrated in FIG. 49, a solid-state imaging device 1201i may be formed by bonding the chip CH11 and the chip CH12 such that the back surface of the chip CH12 is in contact with the back surface of the chip CH11.

Also with such a configuration, the photoelectric conversion unit 1210 for DVS can be disposed below the photoelectric conversion unit 1220 for imaging as a semiconductor region, and both the photoelectric conversion unit 1210 for DVS and the photoelectric conversion unit 1220 for imaging can be disposed to overlap each other in the light incident direction.

The preferred embodiments of the present disclosure have been described in detail above with reference to the accompanying drawings. However, the technical scope of the present disclosure is not limited to such examples. It will be apparent to those skilled in the art of the present disclosure that various modifications and alterations can be conceived within the scope of the technical idea described in the claims and naturally fall within the technical scope of the present disclosure.

Note that the present technique can also have the following configurations.

(1)
A solid-state imaging device comprising
a plurality of pixel regions,
wherein each of the plurality of pixel regions includes:
a first photoelectric conversion unit; and
a second photoelectric conversion unit that overlaps the first photoelectric conversion unit when viewed in a light incident direction,
at least one of the first photoelectric conversion unit or the second photoelectric conversion unit is an embedded unit, and
the first photoelectric conversion unit and the second photoelectric conversion unit are electrically connected to mutually different types of readout circuits.

(2)
The solid-state imaging device according to (1),
wherein the first photoelectric conversion unit is electrically connected to a first readout circuit that reads out a current from the first photoelectric conversion unit, and
the second photoelectric conversion unit is electrically connected to a second readout circuit, which is a high-impedance input and configured to read out a voltage converted from a charge of the second photoelectric conversion unit.

(3)
The solid-state imaging device according to (2),
wherein the second readout circuit is a source follower circuit, a source grounded circuit, or a differential circuit.

(4)
The solid-state imaging device according to (2) or (3),
wherein the first readout circuit is a logarithmic current-to-voltage conversion circuit.

(5)
The solid-state imaging device according to any one of (2) to (4),
wherein the first readout circuit is a dynamic vision sensing (DVS) circuit.

(6)
The solid-state imaging device according to any one of (2) to (5), further comprising
a third photoelectric conversion unit that overlaps the first photoelectric conversion unit when viewed in a light incident direction,
wherein the third photoelectric conversion unit is electrically connected to the first readout circuit or a third readout circuit, which is a high-impedance input and configured to read out a voltage converted from a charge of the third photoelectric conversion unit.

(7)
The solid-state imaging device according to (1),
wherein the first photoelectric conversion unit is electrically connected to an event readout circuit, and
the second photoelectric conversion unit is electrically connected to a gradation converting circuit.

(8)
The solid-state imaging device according to (7),
wherein the event readout circuit is a DVS circuit, and
the gradation converting circuit is an analog digital conversion (ADC) circuit or a circuit at a preceding stage of the ADC circuit.

(9)
The solid-state imaging device according to (1),
wherein the first photoelectric conversion unit is electrically connected to an event readout circuit, and
the second photoelectric conversion unit is electrically connected to a distance measurement circuit.

(10)
The solid-state imaging device according to (9),
wherein the distance measurement circuit is a time of flight (ToF) circuit or a parallax detection circuit, and
the event readout circuit is a DVS circuit.

(11)
A solid-state imaging device comprising
a plurality of pixel regions,
wherein each of the plurality of pixel regions includes:
a first photoelectric conversion unit; and
a plurality of second photoelectric conversion units that each overlap the first photoelectric conversion units when viewed in a light incident direction,
the plurality of second photoelectric conversion units are embedded units included in an identical semiconductor layer, and
the first photoelectric conversion unit and the second photoelectric conversion unit are electrically connected to mutually different types of readout circuits.

(12)
The solid-state imaging device according to (11),
wherein, when N and M are integers of 2 or more, the plurality of pixel regions includes: N first photoelectric conversion units; N×M second photoelectric conversion units overlapping the first photoelectric conversion unit every M second photoelectric conversion units; and N on-chip lenses disposed corresponding to the first photoelectric conversion units in a light incident direction of the first photoelectric conversion units.

(13)
The solid-state imaging device according to (11),
wherein, when N and M are integers of 2 or more, the plurality of pixel regions includes: N first photoelectric conversion units; N×M second photoelectric conversion units overlapping the first photoelectric conversion unit every M second photoelectric conversion units; and N×M on-chip lenses disposed corresponding to the second photoelectric conversion units in a light incident direction of the second photoelectric conversion units.

(14)
The solid-state imaging device according to any one of (11) to (13), wherein a readout circuit electrically connected to the plurality of second photoelectric conversion units is used in common.

(15)
The solid-state imaging device according to any one of (11) to (13),
wherein a readout circuit electrically connected to the plurality of second photoelectric conversion units is not used in common.

(16)
A solid-state imaging device comprising
a plurality of pixel regions,
wherein each of the plurality of pixel regions includes:
a first photoelectric conversion unit; and
a second photoelectric conversion unit that overlaps the first photoelectric conversion unit when viewed in a light incident direction,
at least one of the first photoelectric conversion unit or the second photoelectric conversion unit is an embedded unit, and the first photoelectric conversion unit and the second photoelectric conversion unit are electrically connected to mutually different types of readout circuits using mutually different connection forms in connecting to the readout circuits.

(17)
The solid-state imaging device according to (16),
wherein the first photoelectric conversion unit is electrically connected to a gate of a first transistor in a first readout circuit, and
the second photoelectric conversion unit is electrically connected to a second readout circuit via a source and a drain of a second transistor.

(18)
The solid-state imaging device according to (17), wherein the second transistor has a vertical shape having a gate extending in a depth direction into a substrate.

(19)
The solid-state imaging device according to (16),
wherein the first photoelectric conversion unit is electrically connected to a first readout circuit via a source and a drain of a third transistor having a planar shape having a gate extending in a direction along a front surface of the substrate, and
the second photoelectric conversion unit is electrically connected to a second readout circuit via a source and a drain of a second transistor having a vertical shape having a gate extending in a depth direction into a substrate.

(20)
A solid-state imaging device comprising
a plurality of pixel regions,
wherein each of the plurality of pixel regions includes:
a first photoelectric conversion unit; and
a second photoelectric conversion unit that overlaps the first photoelectric conversion unit when viewed in a light incident direction,
the first photoelectric conversion unit and the second photoelectric conversion unit are electrically connected to mutually different types of readout circuits using mutually different connection forms in connecting to the readout circuits, and
one of the first photoelectric conversion unit and the second photoelectric conversion unit is disposed within a substrate and the other of the units is not disposed within the substrate.

(21)
The solid-state imaging device according to (20),
wherein the first photoelectric conversion unit is disposed on a first chip, and
the second photoelectric conversion unit is disposed on a second chip bonded to the first chip,
the first photoelectric conversion unit is electrically connected to a DVS circuit, and
the second photoelectric conversion unit is electrically connected to a gradation converting circuit.

(22)
The solid-state imaging device according to (20),
wherein the first photoelectric conversion unit and the second photoelectric conversion unit are disposed on an identical chip,
the second photoelectric conversion unit is formed of a material containing silicon as a main component,
the first photoelectric conversion unit is formed of a material containing a substance which is other than silicon and can implement photoelectric conversion, as a main component, the second photoelectric conversion unit is electrically connected to a gradation converting circuit, and
the first photoelectric conversion unit is electrically connected to a DVS circuit.

(23)
The solid-state imaging device according to (20),
wherein the first photoelectric conversion unit and the second photoelectric conversion unit are disposed on an identical chip,
the second photoelectric conversion unit is disposed as a semiconductor region within the substrate,
the first photoelectric conversion unit is disposed as a film above the substrate,
the second photoelectric conversion unit is electrically connected to a gradation converting circuit, and
the first photoelectric conversion unit is electrically connected to a DVS circuit.

Reference Signs List 1, 1i, 1j, 1k, 1n, 201, 201i, 201j, 301, 401, 501, 701, 701i, 801, 801i, 901, 1001, 1101, 1101i, 1101j, 1101k, 1101n, 1101p, 1201, 1201i SOLID-STATE IMAGING DEVICE
6, 6' ON-CHIP LENS
10, 10i, 10j, 10k, 310, 310-1 to 310-4, 410, 510, 510', 510", 810, 810i, 1110, 1210 PHOTOELECTRIC CONVERSION UNIT
20, 20k, 320, 320-1 to 320-4, 820, 920, 1120, 1220 PHOTOELECTRIC CONVERSION UNIT
30, 30k, 330-1 to 330-4, 930, 1030, 1230 TRANSFER UNIT
40, 940, 1040 CHARGE-TO-VOLTAGE CONVERTER
41 SEMICONDUCTOR REGION
50, 250i, 250j, 750, 1150 CURRENT READOUT CIRCUIT
60, 260 VOLTAGE READOUT CIRCUIT
80j TRANSFER UNIT
90j BUFFER UNIT
130n TRANSFER UNIT
140n, 1240 CHARGE HOLDING UNIT

The invention claimed is:
1. A solid-state imaging device, comprising:
a plurality of pixel regions, wherein
each of the plurality of pixel regions includes:
a first photoelectric conversion unit;
a second photoelectric conversion unit that overlaps the first photoelectric conversion unit;
a first readout circuit electrically connected to the first photoelectric conversion unit, wherein the first readout circuit is configured to read out a current from the first photoelectric conversion unit; and
a second readout circuit electrically connected to the second photoelectric conversion unit, wherein
the second readout circuit is configured to read out a first voltage converted from a first charge of the second photoelectric conversion unit, and
the second readout circuit is a circuit of a high-impedance input.
2. The solid-state imaging device according to claim 1, wherein the second readout circuit is one of a source follower circuit, a source grounded circuit, or a differential circuit.
3. The solid-state imaging device according to claim 1, wherein the first readout circuit includes a logarithmic current-to-voltage conversion circuit.
4. The solid-state imaging device according to claim 3, wherein the first readout circuit includes a dynamic vision sensing (DVS) circuit.
5. The solid-state imaging device according to claim 1, further comprising:

a third photoelectric conversion unit that overlaps the first photoelectric conversion unit in a light incident direction; and
a third readout circuit electrically connected to the third photoelectric conversion unit, wherein
the third readout circuit is configured to read out a second voltage converted from a second charge of the third photoelectric conversion unit.

6. The solid-state imaging device according to claim 1, wherein the first readout circuit is an event readout circuit configured to detect, as an event, a change in the current, and
the second readout circuit is a gradation converting circuit configured to convert the first voltage into a signal.

7. The solid-state imaging device according to claim 6, wherein the event readout circuit is a dynamic vision sensing (DVS) circuit, and
the gradation converting circuit is one of an analog digital conversion (ADC) circuit or a specific circuit at a preceding stage of the ADC circuit.

8. The solid-state imaging device according to claim 1, wherein
the first readout circuit is an event readout circuit configured to detect, as an event, a change in the current, and
the second readout circuit is a distance measurement circuit configured to measure a distance between a subject and the solid-state imaging device.

9. The solid-state imaging device according to claim 8, wherein
the distance measurement circuit is one of a time of flight (ToF) circuit or a parallax detection circuit, and
the event readout circuit is a dynamic vision sensing (DVS) circuit.

10. A solid-state imaging device, comprising:
a plurality of pixel regions, wherein each of the plurality of pixel regions includes:
a first photoelectric conversion unit;
a plurality of second photoelectric conversion units, wherein
each of the plurality of the second photoelectric conversion units overlaps the first photoelectric conversion unit;
a first readout circuit electrically connected to the first photoelectric conversion unit, wherein the first readout circuit is configured to read current from the first photoelectric conversion unit; and
a second readout circuit electrically connected to the plurality of second photoelectric conversion units, wherein
the second readout circuit is configured to read out a voltage converted from a charge of the plurality of second photoelectric conversion units, and
the second readout circuit is a circuit of high-impedance input.

11. The solid-state imaging device according to claim 10, wherein the plurality of pixel regions includes:
N first photoelectric conversion units that include the first photoelectric conversion unit;
N×M second photoelectric conversion units that overlap the N first photoelectric conversion units at every $M^{th}$ second photoelectric conversion unit of the N×M second photoelectric conversion units, wherein N and M are integers of value 2 or more; and
N on-chip lenses in a light incident direction of the N first photoelectric conversion units.

12. The solid-state imaging device according to claim 10, wherein the plurality of pixel regions includes:
N first photoelectric conversion units that include the first photoelectric conversion unit;
N×M second photoelectric conversion units that overlap the N first photoelectric conversion units at every $M^{th}$ second photoelectric conversion unit of the N×M second photoelectric conversion units, wherein N and M are integers of value 2 or more; and
N×M on-chip lenses in a light incident direction of the N×M second photoelectric conversion units.

13. The solid-state imaging device according to claim 10, wherein the second readout circuit is common to the plurality of second photoelectric conversion units.

14. A solid-state imaging device, comprising:
a plurality of pixel regions, wherein each of the plurality of pixel regions includes:
a substrate;
a first transistor and a second transistor;
a first photoelectric conversion unit; and
a second photoelectric conversion unit that overlaps the first photoelectric conversion unit;
a first readout circuit electrically connected to the first photoelectric conversion unit, wherein
the first readout circuit is electrically connected to the first photoelectric conversion unit via a first source and a first drain of the first transistor,
the first transistor has a planar shape, and
the first transistor has a first gate that extends along a surface of the substrate; and
a second readout circuit electrically connected to the second photoelectric conversion unit via a second source and a second drain of the second transistor, wherein
the second transistor has a vertical shape, and
the second transistor has a second gate that extends in a depth direction into the substrate.

15. A solid-state imaging device, comprising:
a plurality of pixel regions, wherein each of the plurality of pixel regions includes:
a substrate;
a first transistor and a second transistor;
a first photoelectric conversion unit; and
a second photoelectric conversion unit that overlaps the first photoelectric conversion unit;
a first readout circuit electrically connected to the first photoelectric conversion unit, wherein
the first readout circuit is electrically connected to the first photoelectric conversion unit via a first source and a first drain of the first transistor,
the first transistor has a planar shape, and
the first transistor has a first gate that extends along a surface of the substrate; and
a second readout circuit electrically connected to the second photoelectric conversion unit, wherein
the second readout circuit electrically connected to the second photoelectric conversion unit via a second source and a second drain of the second transistor,
the second transistor has a vertical shape,
the second transistor has a second gate that extends in a depth direction into the substrate, and
one of the first photoelectric conversion unit and the second photoelectric conversion unit is within the substrate.

16. The solid-state imaging device according to claim 15, further comprising a first chip and a second chip bonded to the first chip, wherein
the first photoelectric conversion unit is on the first chip, and the second photoelectric conversion unit is on the second chip, the first photoelectric conversion unit is electrically connected to a dynamic vision sensing (DVS) circuit.

17. The solid-state imaging device according to claim 15, further comprising a chip, wherein the first photoelectric conversion unit and the second photoelectric conversion unit are on the chip, the second photoelectric conversion unit comprises a first material that contains silicon as a main component, the first photoelectric conversion unit comprises a second material that contains a substance different from silicon, and the first photoelectric conversion unit is electrically connected to a dynamic vision sensing (DVS) circuit.

* * * * *